(12) United States Patent
Shimanaka et al.

(10) Patent No.: US 11,660,852 B2
(45) Date of Patent: *May 30, 2023

(54) PLANOGRAPHIC PRINTING PLATE PRECURSOR, PLANOGRAPHIC PRINTING PLATE PRECURSOR LAMINATE, PLATE-MAKING METHOD FOR PLANOGRAPHIC PRINTING PLATE, AND PLANOGRAPHIC PRINTING METHOD

(71) Applicant: FUJIFILM Corporation, Tokyo (JP)

(72) Inventors: Shuji Shimanaka, Shizuoka (JP); Shumpei Watanabe, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 184 days.

This patent is subject to a terminal disclaimer.

(21) Appl. No.: 17/161,072

(22) Filed: Jan. 28, 2021

(65) Prior Publication Data

US 2021/0146675 A1    May 20, 2021

Related U.S. Application Data

(63) Continuation of application No. PCT/JP2019/029321, filed on Jul. 25, 2019.

(30) Foreign Application Priority Data

Jul. 31, 2018 (JP) .............................. JP2018-144557
May 31, 2019 (JP) .............................. JP2019-103213

(51) Int. Cl.
*B41C 1/10* (2006.01)

(52) U.S. Cl.
CPC ........ *B41C 1/1016* (2013.01); *B41C 2201/02* (2013.01); *B41C 2210/24* (2013.01)

(58) Field of Classification Search
None
See application file for complete search history.

(56) References Cited

U.S. PATENT DOCUMENTS

| | | |
|---|---|---|
| 6,294,298 B1 | 9/2001 | Denzinger et al. |
| 2004/0123761 A1 | 7/2004 | Szumla et al. |
| 2005/0061183 A1 | 3/2005 | Maehashi |
| 2006/0166137 A1 | 7/2006 | Mitsumoto et al. |

(Continued)

FOREIGN PATENT DOCUMENTS

| | | |
|---|---|---|
| CN | 1598692 A | 3/2005 |
| CN | 101905583 A | 12/2010 |

(Continued)

OTHER PUBLICATIONS

Extended European Search Report dated Aug. 27, 2021, issued by the European Patent Office in counterpart European Patent Application No. 19845523.0.

(Continued)

*Primary Examiner* — Joshua D Zimmerman
(74) *Attorney, Agent, or Firm* — Sughrue Mion, PLLC

(57) ABSTRACT

A planographic printing plate precursor containing in the following order: an aluminum support; an image recording layer; and a protective layer, in which a thickness of the protective layer is 0.2 μm or greater, and in a case where a Bekk smoothness of a surface of an outermost layer at a side where the image recording layer is provided is 1000 seconds or less.

19 Claims, 5 Drawing Sheets

(56) References Cited

U.S. PATENT DOCUMENTS

| | | | |
|---|---|---|---|
| 2007/0231740 A1* | 10/2007 | Yanaka | B41C 1/1016 430/270.1 |
| 2008/0268372 A1* | 10/2008 | Taguchi | B41C 1/1008 430/270.1 |
| 2010/0307708 A1 | 12/2010 | Ookishi et al. | |
| 2011/0053085 A1 | 3/2011 | Huang et al. | |
| 2011/0134411 A1 | 6/2011 | Mitsumoto et al. | |
| 2014/0147789 A1 | 5/2014 | Nakayama et al. | |
| 2018/0117942 A1 | 5/2018 | Shimanaka | |
| 2019/0023052 A1 | 1/2019 | Oshima et al. | |

FOREIGN PATENT DOCUMENTS

| | | |
|---|---|---|
| CN | 102470664 A | 5/2012 |
| EP | 3 437 894 A1 | 2/2019 |
| JP | 2003-43674 A | 2/2003 |
| JP | 2003-295419 A | 10/2003 |
| JP | 2007-55224 A | 3/2007 |
| JP | 2007-268993 A | 10/2007 |
| JP | 2008-49519 A | 3/2008 |
| JP | 2008-276167 A | 11/2008 |
| WO | 2013-027590 A1 | 2/2013 |
| WO | 2017002641 A1 | 1/2017 |
| WO | 2017/170391 A1 | 10/2017 |

OTHER PUBLICATIONS

Communication dated Mar. 11, 2022 by the Chinese Patent Office for counterpart Chinese Patent Application No. 201980050323.2.
Office Action dated Aug. 18, 2022, issued by the State Intellectual Property Office of People's Republic of China in counterpart Chinese Patent Application No. 201980050323.2.
International Search Report dated Sep. 10, 2019 issued by the International Searching Authority in counterpart International Application No. PCT/JP2019/029321 (PCT/ISA/210).
International Written Opinion dated Sep. 10, 2019 issued by the International Searching Authority in counterpart International Application No. PCT/JP2019/029321 (PCT/ISA/237).
Communication dated Jan. 4, 2022, from the Japanese Patent Office in counterpart Application No. 2020-533480.
Communication dated Jun. 14, 2022 issued by the Japanese Patent Office in application No. 2020-533480.
Office Action dated Nov. 15, 2022 by the Japan Patent Office in counterpart Japanese Patent Application No. 2020-533480.
Decision of Dismissal of Amendment dated Nov. 15, 2022 by the Japan Patent Office in counterpart Japanese Patent Application No. 2020-533480.

* cited by examiner

PLANOGRAPHIC PRINTING PLATE PRECURSOR, PLANOGRAPHIC PRINTING PLATE PRECURSOR LAMINATE, PLATE-MAKING METHOD FOR PLANOGRAPHIC PRINTING PLATE, AND PLANOGRAPHIC PRINTING METHOD

CROSS REFERENCE TO RELATED APPLICATION

This is a continuation of International Application No. PCT/JP2019/029321 filed on Jul. 25, 2019, and claims priorities from Japanese Patent Application No. 2018-144557 filed on Jul. 31, 2018 and Japanese Patent Application No. 2019-103213 filed on May 31, 2019, the entire disclosures of which are incorporated herein by reference.

BACKGROUND OF THE INVENTION

1. Field of the Invention

The present invention relates to a planographic printing plate precursor, a planographic printing plate precursor laminate, a plate-making method for a planographic printing plate, and a planographic printing method.

2. Description of the Related Art

A planographic printing plate precursor is frequently stored and transported as a laminate formed by laminating a plurality of sheets thereof. In this laminate, interleaving paper is typically inserted into the space between planographic printing plate precursors for the purpose of preventing dislocation in stacking of planographic printing plate precursors, preventing adhesion between planographic printing plate precursors, and preventing scratches on a surface of a planographic printing plate precursor on an image recording layer side. However, in a case where interleaving paper is used, problems of cost increase, a disposal treatment, and the like may occur, and thus the interleaving paper needs to be removed before an exposure step. Therefore, this may also result in risk of a load on a plate-making step and occurrence of interleaving paper peeling failure. Further, in a case of removing the interleaving paper, it is necessary to give consideration such that the surface of the planographic printing plate precursor on the recording layer side is not damaged. Accordingly, development of a planographic printing plate precursor that can be laminated without interleaving paper has been required.

JP2007-055224A describes, as a planographic printing plate precursor that can be laminated without interleaving paper, a planographic printing plate precursor in which a protective layer or an image recording layer serving as an outermost layer contains an inorganic layered compound, and a laminate obtained by laminating the planographic printing plate precursor.

SUMMARY OF THE INVENTION

A planographic printing plate precursor (hereinafter, also simply referred to as a "precursor") is typically used by laminating precursors in a state of interposing interleaving paper between precursors for the purpose of preventing dislocation in stacking precursors in a case of producing precursors, preventing adhesion between precursors, preventing multiple precursors from being fed in a plate-making step of taking out precursor from the stack one by one, and preventing scratches in a case of producing and stacking precursors, performing transportation and in a series of steps carried out in a case of user plate-making and before printing. However, an aspect in which interleaving paper is not used (also referred to as "elimination of interleaving paper") is employed in some cases for the purpose of preventing interleaving paper peeling failure in a case of user plate-making, improving the plate-making speed, and reducing the cost.

In a case of elimination of interleaving paper, a planographic printing plate precursor is required to have excellent characteristics such as a property of preventing multiple plates from being fed in a step of taking out a precursor from a stack, a property of preventing falling of a projection provided on a surface of an outermost layer of the precursor, a property of preventing scratches caused by a projection provided on the surface of the outermost layer of the precursor, and a property of preventing development delay caused by a projection provided on the surface of the outermost layer of the precursor. However, in a case where the technique described in JP2007-055224A is employed, since the property of preventing multiple plates from being fed is degraded, it is not possible to satisfy all the characteristics described above at the same time.

An object to be achieved by the present invention is to provide a planographic printing plate precursor in which all characteristics such as a property of preventing multiple plates from being fed in a step of taking out a precursor from a stack, a property of preventing falling of a projection provided on a surface of an outermost layer of the precursor, a property of preventing scratches caused by a projection provided on the surface of the outermost layer of the precursor, and a property of preventing development delay caused by a projection provided on the surface of the outermost layer of the precursor are excellent even in a case of elimination of interleaving paper, a planographic printing plate precursor laminate including the planographic printing plate precursor, a plate-making method for a planographic printing plate, and a planographic printing method.

The means for achieving the above-described object includes the following aspects.

<1> A planographic printing plate precursor comprising in the following order: an aluminum support; an image recording layer and a protective layer, in which a thickness of the protective layer is 0.2 µm or greater, and in a case where a Bekk smoothness of a surface of an outermost layer at a side where the image recording layer is provided is denoted by A seconds, the following Expression (1) is satisfied.

$$A \leq 1000 \quad (1)$$

<2> The planographic printing plate precursor according to <1>, in which the A seconds as the Bekk smoothness of the surface of the outermost layer at the side where the image recording layer is provided satisfy the following Expression (2).

$$A \leq 300 \quad (2)$$

<3> The planographic printing plate precursor according to <1> or <2>, in which an arithmetic average height Sa of the surface of the outermost layer at the side where the image recording layer is provided is in a range of 0.3 µm to 20 µm.

<4> The planographic printing plate precursor according to any one of <1> to <3>, in which the protective layer contains particles having an average particle diameter of 0.5 μm to m, and an in-plane density of the particles is 10000 particles/mm² or less.

<5> The planographic printing plate precursor according to <4>, in which the average particle diameter of the particles is 1.3 times or greater than the thickness of the protective layer.

<6> The planographic printing plate precursor according to any one of <1> to <3>, in which the image recording layer contains particles having an average particle diameter of 0.5 μm to 20 μm, and an in-plane density of the particles is 10000 particles/mm² or less.

<7> The planographic printing plate precursor according to any one of <4> to <6>, in which the particles having the average particle diameter of 0.5 μm to 20 μm are at least one kind of particles selected from the group consisting of organic resin particles and inorganic particles.

<8> The planographic printing plate precursor according to any one of <1> to <3>, in which a plurality of protrusions containing a polymer compound as a main component are provided on the protective layer.

<9> The planographic printing plate precursor according to any one of <1> to <8>, in which the image recording layer contains an infrared absorbing agent, a polymerization initiator, a polymerizable compound, and a polymer compound.

<10> The planographic printing plate precursor according to <9>, in which the polymer compound is a polymer compound containing at least one of styrene and acrylonitrile as a constitutional unit.

<11> The planographic printing plate precursor according to <9> or <10>, in which the image recording layer contains two or more kinds of polymerizable compounds.

<12> The planographic printing plate precursor according to any one of <1> to <11>, in which the protective layer contains a water-soluble polymer.

<13> The planographic printing plate precursor according to <12>, in which the water-soluble polymer is polyvinyl alcohol having a saponification degree of 50% or greater.

<14> The planographic printing plate precursor according to any one of <1> to <13>, in which an arithmetic average height Sa of a surface of an outermost layer at a side opposite to the side where the image recording layer is provided is in a range of 0.1 μm to 20 μm.

<15> The planographic printing plate precursor according to any one of <1> to <14>, in which a total value of the arithmetic average height Sa of the surface of the outermost layer at the side where the image recording layer is provided and an arithmetic average height Sa of a surface of an outermost layer at a side opposite to the side where the image recording layer is provided is greater than 0.3 μm and 20 μm or less.

<16> The planographic printing plate precursor according to any one of <1> to <15>, in which in a case where the Bekk smoothness of the surface of the outermost layer at the side where the image recording layer is provided is denoted by A seconds and a Bekk smoothness of a surface of an outermost layer at a side opposite to the side where the image recording layer is provided is denoted by B seconds, the following Expressions (1), (3), and (4) are satisfied.

$$A \leq 1000 \tag{1}$$

$$B \leq 1000 \tag{3}$$

$$1/A + 1/B \geq 0.002 \tag{4}$$

<17> A planographic printing plate precursor laminate which is obtained by laminating a plurality of the planographic printing plate precursors according to any one of <1> to <16>, in which the outermost layer at the side where the image recording layer is provided and an outermost layer at a side opposite to the side where the image recording layer is provided are laminated to be directly brought into contact with each other.

<18> A plate-making method for a planographic printing plate, comprising: image-exposing the planographic printing plate precursor according to any one of <1> to <16>; and supplying at least one of printing ink and dampening water to remove an unexposed portion of the image recording layer on a printing press and preparing the planographic printing plate.

<19> A plate-making method for a planographic printing plate, comprising: image-exposing the planographic printing plate precursor according to any one of <1> to <16>; and supplying a developer having a pH of 2 to 12 to remove an unexposed portion of the image recording layer and preparing a planographic printing plate.

<20> A plate-making method for a planographic printing plate, comprising: image-exposing the planographic printing plate precursor according to any one of <1> to <16>; and supplying a developer having a pH of 2 to 10 to remove an unexposed portion of the image recording layer, in which the method does not include washing with water after removal of the unexposed portion.

<21> A planographic printing method comprising: image-exposing the planographic printing plate precursor according to any one of <1> to <16>; supplying at least one of printing ink and dampening water to remove an unexposed portion of the image recording layer on a printing press and preparing a planographic printing plate; and performing printing by the prepared planographic printing plate.

<22> A planographic printing method comprising: image-exposing the planographic printing plate precursor according to any one of <1> to <16>; supplying a developer having a pH of 2 to 12 to remove an unexposed portion of the image recording layer and preparing a planographic printing plate; and performing printing by the prepared planographic printing plate.

<23> A planographic printing method comprising: making a planographic printing plate by image-exposing the planographic printing plate precursor according to any one of <1> to <16> and supplying a developer having a pH of 2 to 10 to remove an unexposed portion of the image recording layer, wherein washing with water is not included after removal of the unexposed portion; and performing printing by the prepared planographic printing plate.

<24> A planographic printing plate precursor comprising: an aluminum support; and a protective layer, in which a thickness of the protective layer is 0.2 μm or greater, and in a case where a Bekk smoothness of a surface of an outermost layer at a side where the protective layer is provided is denoted by A seconds, the following Expression (1) is satisfied.

$$A \leq 1000 \tag{1}$$

<25> The planographic printing plate precursor according to <24>, in which an arithmetic average height Sa of the surface of the outermost layer at the side where the protective layer is provided is in a range of 0.3 μm to 20 μm.

<26> The planographic printing plate precursor according to <24> or <25>, further comprising: a non-photosensitive layer between the aluminum support and the protective layer.

<27> A planographic printing plate precursor laminate which is obtained by laminating a plurality of the planographic printing plate precursors according to any one of <24> to <26>, in which the outermost layer at the side where the protective layer is provided and an outermost layer at a side opposite to the side where the protective layer is provided are laminated to be directly brought into contact with each other.

<28> A planographic printing method comprising: supplying at least one of printing ink and dampening water to the planographic printing plate precursor according to any one of <24> to <26> to remove the protective layer on a printing press and preparing a planographic printing plate; and performing printing by the prepared planographic printing plate.

According to the present invention, it is possible to provide a planographic printing plate precursor in which all characteristics such as a property of preventing multiple plates from being fed in a step of taking out a precursor from a stack, a property of preventing falling of a projection provided on a surface of an outermost layer of the precursor, a property of preventing scratches caused by a projection provided on the surface of the outermost layer of the precursor, and a property of preventing development delay caused by a projection provided on the surface of the outermost layer of the precursor are excellent even in a case of elimination of interleaving paper, a planographic printing plate precursor laminate including the planographic printing plate precursor, a plate-making method for a planographic printing plate, and a planographic printing method.

DESCRIPTION OF THE PREFERRED EMBODIMENTS

Figure 1:
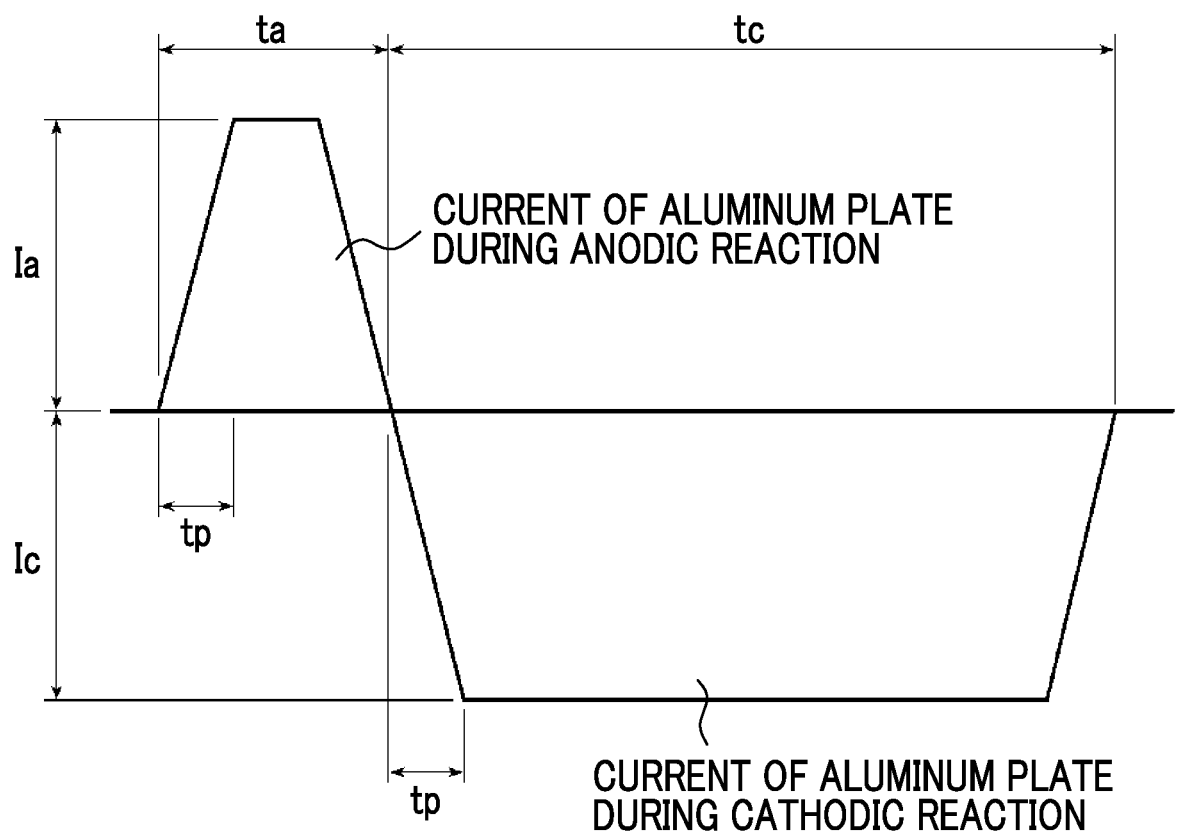
FIG. 1 is a graph showing an example of an alternating waveform current waveform diagram used for an electrochemical roughening treatment.

The description of constituent elements below is made based on representative embodiments of the present invention in some cases, but the present invention is not limited to such embodiments.

In the present specification, a numerical range shown using "to" indicates a range including numerical values described before and after "to" as a lower limit and an upper limit.

In a case where substitution or unsubstitution is not noted in regard to the notation of a "group" (atomic group) in the present specification, the "group" includes not only a group that does not have a substituent but also a group that has a substituent. For example, the concept of an "alkyl group" includes not only an alkyl group that does not have a substituent (unsubstituted alkyl group) but also an alkyl group having a substituent (substituted alkyl group).

In the present specification, the concept of "(meth)acryl" includes both acryl and methacryl, and the concept of "(meth)acryloyl" includes both acryloyl and methacryloyl.

The term "step" in the present specification indicates not only an independent step but also a step which cannot be clearly distinguished from other steps as long as the intended purpose of the step is achieved.

In the present invention, a combination of two or more preferred embodiments is a more preferred embodiment.

Further, the mass average molecular weight (Mw) and the number average molecular weight (Mn) in the present invention are molecular weights in terms of polystyrene used as a standard substance, which are detected by using tetrahydrofuran (THF) as a solvent, a differential refractometer, and a gel permeation chromatography (GPC) analyzer using TSKgel GMHxL, TSKgel G4000HxL, and TSKgel G2000HxL (all trade names, manufactured by Tosoh Corporation) as columns, unless otherwise specified.

In the present specification, the term "planographic printing plate precursor" includes not only a planographic printing plate precursor but also a key plate precursor. Further, the term "planographic printing plate" includes not only a planographic printing plate prepared by performing operations such as exposure and development on a planographic printing plate precursor as necessary but also a key plate. In a case of a key plate precursor, the operations of exposure, development, and the like are not necessarily required. Further, a key plate is a planographic printing plate for attachment to a plate cylinder that is not used, for example, in a case where printing is performed on a part of a paper surface with one or two colors in color newspaper printing. Further, the key plate may also be referred to as a water plate, a dummy plate, a blank plate, an empty plate, or the like.

Hereinafter, the present invention will be described in detail.

[Planographic Printing Plate Precursor]

A planographic printing plate precursor according to the embodiment of the present invention is a planographic printing plate precursor including an aluminum support (hereinafter, also simply referred to as a "support"), and an image recording layer and a protective layer in this order, in which the thickness of the protective layer is 0.2 µm or greater, and Expression (1) is satisfied in a case where a Bekk smoothness of a surface of an outermost layer at a side where the image recording layer is provided is denoted by A seconds.

$$A \leq 1000 \tag{1}$$

As a result of intensive examination conducted by the present inventors, it was found that a planographic printing plate precursor in which all characteristics such as a property of preventing multiple plates from being fed in a step of taking out a precursor from a stack, a property of preventing falling of a projection provided on a surface of an outermost layer of the precursor, a property of preventing scratches caused by a projection provided on the surface of the outermost layer of the precursor, and a property of preventing development delay caused by a projection provided on the surface of the outermost layer of the precursor are excellent can be provided in a case where the planographic printing plate precursor according to the embodiment of the present invention employs the above-described configuration.

The mechanism in which the above-described excellent effects are obtained is not clear, but can be assumed as follows. It is considered that the planographic printing plate precursor according to the embodiment of the present invention has an effect of preventing multiple plates from being fed because of formation of a gap that allows air to flow into a space between precursors in contact with each other in a case where a stack is formed of a projection provided on the surface of the outermost layer such that the A seconds as the Bekk smoothness of the surface of the outermost layer at the side where the image recording layer is provided satisfy Expression (1). Further, it is considered that the falling of a projection, scratches, and development delay are prevented because the planographic printing plate precursor has an effect of increasing the holding power by sufficiently covering the particles of the projection with the protective layer, an effect of enhancing the function of protecting the image recording layer, and an effect of relieving the stress against the image recording layer from the projection, by setting the thickness of the protective layer to 0.2 μm or greater.

The planographic printing plate precursor according to the embodiment of the present invention includes a support, an image recording layer and a protective layer in this order. The planographic printing plate precursor may include an undercoat layer between the support and the image recording layer. Further, a back coat layer may be provided at the side of the support opposite to the side where the image recording layer is provided.

The planographic printing plate precursor according to the embodiment of the present invention may be a planographic printing plate precursor used for on-press development or a planographic printing plate precursor used for development carried out with a developer.

In the planographic printing plate precursor according to the embodiment of the present invention, the thickness of the protective layer is 0.2 μm or greater, and Expression (1) is satisfied in a case where the Bekk smoothness of the surface of the outermost layer at the side where the image recording layer is provided is denoted by A seconds.

$$A \leq 1000 \quad (1)$$

The surface of the outermost layer is the surface of the protective layer in a case where the protective layer is the outermost layer.

Further, for example, in a case where protrusions described below are formed, the protective layer is the outermost layer and a plurality of protrusions containing a polymer compound as a main component may be provided on the protective layer.

In the planographic printing plate precursor according to the embodiment of the present invention, the thickness of the protective layer is 0.2 μm or greater. The thickness of the protective layer is preferably in a range of 0.2 to 10 μm, more preferably in a range of 0.3 to 5 μm, and particularly preferably in a range of 0.5 to 3 μm.

In the planographic printing plate precursor according to the embodiment of the present invention, the A seconds as the Bekk smoothness of the surface of the outermost layer at the side where the image recording layer is provided satisfy Expression (1).

$$A \leq 1000 \quad (1)$$

It is preferable that the A seconds as the Bekk smoothness of the surface of the outermost layer at the side where the image recording layer is provided satisfy Expression (2).

$$A \leq 300 \quad (2)$$

It is more preferable that the A seconds as the Bekk smoothness of the surface of the outermost layer at the side where the image recording layer is provided satisfy Expression (2a).

$$A \leq 100 \quad (2a)$$

The Bekk smoothness (Bekk seconds) in the present invention is measured in conformity with JIS P8119 (1998). According to the specific measuring method, the measurement was performed with one tenth the amount of standard air, that is, an air amount of 1 mL using a Bekk smoothness tester (manufactured by KUMAGAI RIKI KOGYO Co., Ltd.).

In the planographic printing plate precursor according to the embodiment of the present invention, the arithmetic average height Sa of the surface of the outermost layer at the side where the image recording layer is provided is preferably in a range of 0.3 μm to 20 μm.

In a case where the arithmetic average height Sa of the surface of the outermost layer at the side where the image recording layer is provided is 0.3 μm or greater, the effect of preventing multiple plates from being fed is increased because of formation of a gap that allows air to flow into the space between precursors in contact with each other in a case where a stack is formed. In a case where the arithmetic average height Sa of the surface of the outermost layer at the side where the image recording layer is provided is 20 μm or less, a problem of development delay occurring due to damage to the image recording layer caused by the projection being pressed deep into the image recording layer in a case of formation of a stack or the like does not occur. Further, in a case where the arithmetic average height Sa thereof is in a range of 0.3 μm to 20 μm, the property of preventing scratches is excellent.

The arithmetic average height Sa of the surface of the outermost layer at the side where the image recording layer is provided is preferably in a range of 0.3 to 20 μm, more preferably in a range of 0.5 to 10 μm, and particularly preferably in a range of 0.5 to 7 μm.

In the present invention, the arithmetic average height Sa is measured in conformity with the method described in ISO 25178. Specifically, the arithmetic average height Sa is obtained by using MICROMAP MM3200-M100 (manufactured by Mitsubishi Chemical Systems, Inc.), selecting three or more sites from the same sample, performing the measurement, and averaging the obtained values. In regard to the measurement region, a region having a size of 1 cm×1 cm which has been randomly selected from a surface of the sample is measured.

In the planographic printing plate precursor according to the embodiment of the present invention, the arithmetic average height Sa of the surface of the outermost layer at the side opposite to the side where the image recording layer is provided is preferably in a range of 0.1 μm to 20 μm.

In a case where the arithmetic average height Sa of the surface of the outermost layer at the side opposite to the side where the image recording layer is provided is in a range of 0.1 μm to 20 μm, a problem of development delay occurring due to damage to the image recording layer caused by the projection, on the surface of the outermost layer at the side opposite to the side where the image recording layer is provided, being pressed deep into the image recording layer in a case of formation of a stack or the like does not occur.

As the surface of the outermost layer at the side opposite to the side where the image recording layer is provided, the surface of the support at the side opposite to the side where the image recording layer is provided or a surface of a back coat layer is exemplified.

The arithmetic average height Sa of the surface of the outermost layer at the side opposite to the side where the image recording layer is provided is preferably in a range of 0.1 to 20 µm, more preferably in a range of 0.3 to 20 µm, still more preferably in a range of 0.5 to m, and particularly preferably in a range of 0.5 to 7 µm.

In the planographic printing plate precursor according to the embodiment of the present invention, the total value of the arithmetic average height Sa of the surface of the outermost layer at the side where the image recording layer is provided and the arithmetic average height Sa of the surface of the outermost layer at the side opposite to the side where the image recording layer is provided is preferably greater than 0.3 µm and 20 µm or less.

In a case where the total value of the arithmetic average height Sa of the surface of the outermost layer at the side where the image recording layer is provided and the arithmetic average height Sa of the surface of the outermost layer at the side opposite to the side where the image recording layer is provided is greater than 0.3 µm and 20 µm or less, the effect of preventing multiple plates from being fed and the effect of preventing development delay are enhanced.

The total value of the arithmetic average height Sa of the surface of the outermost layer at the side where the image recording layer is provided and the arithmetic average height Sa of the surface of the outermost layer at the side opposite to the side where the image recording layer is provided is more preferably in a range of 0.4 to 20 µm, still more preferably in a range of 1 to 20 µm, and particularly preferably in a range of 1 to 14 µm.

In the planographic printing plate precursor according to the embodiment of the present invention, it is preferable that Expressions (1), (3), and (4) are satisfied in a case where the Bekk smoothness of the surface of the outermost layer at the side where the image recording layer is provided is denoted by A seconds and the Bekk smoothness of the surface of the outermost layer at the side opposite to the side where the image recording layer is provided is denoted by B seconds.

$$A \leq 1000 \quad (1)$$

$$B \leq 1000 \quad (3)$$

$$1/A + 1/B \geq 0.002 \quad (4)$$

In a case where the A seconds as the Bekk smoothness and the B seconds as the Bekk smoothness satisfy Expressions (1), (3), and (4), the effect of preventing multiple plates from being fed is further enhanced.

The B seconds as the Bekk smoothness of the surface of the outermost layer at the side opposite to the side where the image recording layer is provided are preferably 300 seconds or less and more preferably 100 seconds or less.

The value of 1/A+1/B which is the total value of the reciprocal of the A seconds as the Bekk smoothness of the surface of the outermost layer at the side where the image recording layer is provided and the reciprocal of the B seconds as the Bekk smoothness of the surface of the outermost layer at the side opposite to the side where the image recording layer is provided is preferably 0.004 or greater and more preferably 0.01 or greater.

It is preferable that A and B are small, and the lower limits thereof are not particularly limited, but are preferably greater than 0.

In the planographic printing plate precursor according to the embodiment of the present invention, the embodiment for achieving the requirement that the A seconds as the Bekk smoothness of the surface of the outermost layer at the side where the image recording layer is provided satisfy Expression (1) is not particularly limited, and an embodiment in which the outermost layer at the side where the image recording layer is provided has unevenness such as an embodiment A1, an embodiment A2, or an embodiment A3 described below is preferably exemplified.

Embodiment A1

An embodiment in which the protective layer contains particles having an average particle diameter of 0.5 µm to 20 µm and the in-plane density of the particles is 10000 particles/mm² or less Embodiment A2

An embodiment in which the image recording layer contains particles having an average particle diameter of 0.5 µm to 20 µm and the in-plane density of the particles is 10000 particles/mm² or less Embodiment A3

An embodiment in which a plurality of protrusions containing a polymer compound as a main component are provided on the protective layer The particles having an average particle diameter of 0.5 µm to 20 µm are not particularly limited, and at least one kind of particles selected from the group consisting of organic resin particles and inorganic particles are preferable.

Preferred examples of the organic resin particles include polyolefins such as poly(meth)acrylic acid esters, polystyrene and derivatives thereof, polyamides, polyimides, low-density polyethylene, high-density polyethylene, and polypropylene; particles formed of synthetic resins such as polyurethanes, polyureas, and polyesters; and particles formed of natural polymers such as chitin, chitosan, cellulose, crosslinked starch, and crosslinked cellulose.

Among these, synthesis resin particles have advantages that the particle size can be easily controlled and desired surface characteristics can be easily controlled by surface modification.

As a method of producing organic resin particles, atomization can also be made using a crushing method in a case of a relatively hard resin such as polymethyl methacrylate (PMMA), but a method of synthesizing particles using an emulsion suspension polymerization method is preferably employed from the viewpoints of ease of controlling the particle diameter and the precision.

The method of producing organic resin particles is described in detail in "Ultrafine Particle and Materials" edited by Materials Science Society of Japan, published by SHOKABO Co., Ltd., 1993 and "Manufacturing & Application of Microspheres & Powders" supervised by Haruma Kawaguchi, published by CMC Publishing, 2005.

Examples of commercially available products of the organic resin particles include crosslinked acrylic resins MX-40T, MX-80H3wT, MX-150, MX-180TA, MX-300, MX-500, MX-1000, MX-1500H, MR-2HG, MR-7HG, MR-10HG, MR-3GSN, MR-5GSN, MR-7G, MR-10G, MR-5C, and MR-7GC, and styryl resin-based SX-350H and SX-500H (manufactured by Soken Chemical & Engineering Co., Ltd.), Acrylic resins MBX-5, MBX-8, MBX-12, MBX-15, MBX-20, MB20X-5, MB30X-5, MB30X-8, MB30X-20, SBX-6, SBX-8, SBX-12, and SBX-17 (manufactured by Sekisui Plastics Co., Ltd.), polyolefin resins and CHEMIPEARL W100, W200, W300, W308, W310, W400, W401, W405, W410, W500, WF640, W700, W800, W900, W950, and WP100 (manufactured by Mitsui Chemicals, Inc.).

Examples of the inorganic particles include silica, alumina, zirconia, titania, carbon black, graphite, $BaSO_4$, ZnS, $MgCO_3$, $CaCO_3$, ZnO, CaO, $WS_2$, $MoS_2$, MgO, $SnO_2$, a-$Fe_2O_3$, a-FeOOH, SiC, $CeO_2$, BN, SiN, MoC, BC, WC, titanium carbide, corundum, artificial diamond, petroleum stone, garnet, silica stone, tripolite, diatomaceous earth, and dolomite.

As the above-described particles, a particle having a hydrophilic surface is preferable. Examples of the particle having a hydrophilic surface include an organic resin particle having a hydrophilic surface and an inorganic particle having a hydrophilic surface.

As the organic resin particle having a hydrophilic surface, an organic resin particle coated with at least one inorganic compound selected from the group consisting of silica, alumina, titania, and zirconia is preferable and an organic resin particle coated with silica is particularly preferable.

It is preferable that an organic resin constituting an organic resin particle having a hydrophilic surface is at least one resin selected from the group consisting of a polyacrylic resin, a polyurethane-based resin, a polystyrene-based resin, a polyester-based resin, an epoxy-based resin, a phenolic resin, and a melamine resin.

Hereinafter, the organic resin particle having a hydrophilic surface will be described in detail using an organic resin particle coated with silica (hereinafter, also referred to as a "silica-coated organic resin particle") as an example, and the organic resin particle having a hydrophilic surface in the present invention is not limited thereto.

The silica-coated organic resin particle is a particle obtained by coating the surface of the particle formed of an organic resin with silica. It is preferable that the organic resin particle constituting the core is not softened or sticky due to the moisture in the air or the temperature thereof.

Examples of the organic resin constituting the organic resin particle in the silica-coated organic resin particles include a polyacrylic resin, a polyurethane-based resin, a polystyrene-based resin, a polyester-based resin, an epoxy-based resin, a phenol resin, and a melamine resin.

As a material forming the silica layer covering the surface of the silica-coated organic resin particle, a compound containing an alkoxysilyl group such as a condensate of an alkoxysiloxane-based compound, particularly, a siloxane-based material, and specifically, silica particles such as silica sol, colloidal silica, and silica nanoparticles are preferably exemplified.

The configuration of the silica-coated organic resin particle may be a configuration in which a silica particle adheres to the surface of an organic resin particle as a solid component or a configuration in which a siloxane-based compound layer is formed on the surface of an organic resin particle by performing a condensation reaction on an alkoxysiloxane-based compound.

Silica does not necessarily cover the entire surface of the organic resin particle, and it is preferable that the surface thereof is coated with at least 0.5% by mass or greater of silica with respect to the total mass of the organic resin particles. In other words, in a case where silica is present on at least a part of the surface of the organic resin particle, improvement in affinity for a coexisting water-soluble polymer such as polyvinyl alcohol (PVA) on the surface of the organic particle is achieved, falling off of the particle is suppressed even in a case where external stress is applied thereto, and excellent scratch resistance and ease of peeling in a case of lamination without using interleaving paper can be maintained. Accordingly, the expression "coated with silica" in the present invention includes a state in which silica is present on at least a part of the surface of the organic resin particle as described above.

The state of the surface being coated with silica can be confirmed by morphological observation using a scanning electron microscope (SEM) or the like. Further, the coating amount of silica can be confirmed by detecting Si atoms through elemental analysis such as fluorescent X-ray analysis and calculating the amount of silica present therein.

A method of producing silica-coated organic resin particles is not particularly limited, and examples thereof include a method of forming a silica surface coating layer simultaneously with formation of organic resin particles by allowing silica particles or a silica precursor compound to coexist with a monomer component which is the raw material of the organic resin particles; and a method of forming organic resin particles, physically adhering silica particles to each surface of the organic resin particles, and fixing the silica particles thereto.

Hereinafter, an example of the method of producing silica-coated organic resin particles will be described. First, silica and a raw material resin (more specifically, a raw material resin such as a monomer capable of suspension polymerization, a pre-polymer capable of suspension crosslinking, or a resin liquid, constituting the above-described organic resin) are added to water containing a suspension stabilizer appropriately selected from a water-soluble polymer such as polyvinyl alcohol, methyl cellulose, or polyacrylic acid and an inorganic suspending agent such as calcium phosphate or calcium carbonate, and stirred and mixed with the water to prepare a suspension in which silica and a raw material resin are dispersed. Here, a suspension having a target particle diameter can be formed by adjusting the kind, the concentration, and the stirring rotation speed of the suspension stabilizer. Next, the suspension is heated to start the reaction, and resin particles are generated by performing suspension polymerization or suspension crosslinking on the resin raw material. Here, the coexisting silica is fixed to the resin particle cured by the polymerization or the crosslinking reaction, particularly, the vicinity of the surface of the resin particle due to the physical properties thereof. Thereafter, the suspension is subjected to solid-liquid separation, the suspension stabilizer adhering to the particles is removed by washing, and the particles are dried. In this manner, silica-coated organic resin particles to which silica is fixed and which have a desired particle diameter and a substantially spherical shape can be obtained.

As described above, silica-coated organic resin particles having a desired particle diameter can be obtained by controlling the conditions during the suspension polymerization or the suspension crosslinking or silica-coated organic resin particles are generated without strictly controlling the conditions and then silica-coated organic particles having a desired size can be obtained by a mesh filtration method or the like.

In regard to the amount of the raw material to be added to the mixture during the production of the silica-coated organic particles according to the above-described method, in a case where the total amount of the raw material resin and the silica is 100 parts by mass, an aspect in which 0.1 parts by mass to 20 parts by mass of the suspension stabilizer is firstly added to 200 parts by mass to 800 parts by mass of water serving as a dispersion medium, and sufficiently dissolved or dispersed therein, 100 parts by mass of a mixture of the raw material resin and the silica is put into the solution, the solution is stirred while the stirring speed is adjusted such that the dispersed particles have a predetermined particle size, and the solution temperature is increased to 30° C. to 90° C. after the adjustment of the particle size to cause a reaction for 1 hour to 8 hours is preferably exemplified.

The above-described method is merely an example of the method of producing silica-coated organic resin particles and silica-coated organic resin particles obtained by the methods specifically described in JP2002-327036A, JP2002-173410A, JP2004-307837A, JP2006-038246A, and the like can also be suitably used in the present invention.

Further, the silica-coated organic resin particles are also available as commercially available products, and specific examples of silica-melamine composite particles include OPTBEADS 2000M, OPTBEADS 3500M, OPTBEADS 6500M, OPTBEADS 10500M, OPTBEADS 35005, and OPTBEADS 6500S (all manufactured by Nissan Chemical Industries, Ltd.). Specific examples of silica-acrylic composite particles include ART PEARL G-200 transparent, ART PEARL G-400 transparent, ART PEARL G-800 transparent, ART PEARL GR-400 transparent, ART PEARL GR-600 transparent, ART PEARL GR-800 transparent, and ART PEARL J-7P (all manufactured by Negami Chemical Industrial Co., Ltd.). Specific examples of silica-urethane composite particles include ART PEARL C-400 transparent, C-800 transparent, P-800T, U-600T, U-800T, CF-600T, CF800T (all manufactured by Negami Chemical Industrial Co., Ltd.) and DYNAMIC BEADS CN5070D and DANPLACOAT THU (both manufactured by Dainichiseika Color & Chemicals Mfg. Co., Ltd.).

Hereinbefore, the organic resin particles used in the present invention have been described using the silica-coated organic resin particles as an example, but the same applies to organic resin particles coated with alumina, titania, or zirconia by using alumina, titania, or zirconia in place of silica.

As the shape of particles, a perfectly spherical shape is preferable, and a flat plate shape or a so-called spindle shape in which an elliptical shape is shown in a projection view may be employed.

In the protective layer of the embodiment A1, the average particle diameter of the particles is preferably in a range of 0.5 to 10 μm and more preferably in a range of 0.5 to 5 μm.

In the protective layer of the embodiment A1, the average particle diameter of the particles is preferably 1.3 times or greater the thickness of the protective layer. In a case where the average particle diameter of the particles is 1.3 times or greater the thickness of the protective layer, the property of preventing multiple plates from being fed is further improved by sufficiently forming projections. Meanwhile, in a case where the size of the projection is unnecessarily large, since the property of preventing development delay and the property of preventing falling of a projection tend to be degraded, the average particle diameter of the particles is suitably 33 times or less the thickness of the protective layer.

The average particle diameter of the particles in the present invention indicates the volume average particle diameter, and the volume average particle diameter is measured using a laser diffraction and scattering type particle size distribution meter. Specifically, the measurement is performed using, for example, a particle size distribution measuring device "MICROTRAC MT-3300II" (manufactured by Nikkiso Co., Ltd.).

Further, in the present invention, the average particle diameter of other particles is set to be measured according to the above-described measuring method unless otherwise specified.

In the protective layer of the embodiment A1, the in-plane density of the particles is preferably 100 to 5000 particles/$mm^2$ and more preferably in a range of 100 to 3000 particles/$mm^2$.

The in-plane density in the present invention can be confirmed by observing the surface of the planographic printing plate precursor with a scanning electron microscope (SEM). Specifically, the average value thereof can be calculated by observing five sites on the surface of the planographic printing plate precursor with a scanning electron microscope (SEM), counting the number of particles, converting the number of particles into the number of particles per observation visual field area with the unit of $mm^2$, and acquiring the average value thereof.

In the image recording layer of the embodiment A2, the average particle diameter of the particles is preferably in a range of 0.7 to 20 μm, more preferably in a range of 0.7 to 10 μm, and particularly preferably in a range of 0.7 to 5 μm.

In the image recording layer of the embodiment A2, the in-plane density of the particles is preferably in a range of 100 to 5000 particles/$mm^2$ and more preferably in a range of 100 to 3000 particles/$mm^2$.

The kind, the production method, the shape, and the like of the particles used for the image recording layer of the embodiment A2 are the same as those of the particles used for the protective layer of the embodiment A1.

It is preferable that the polymer compound constituting the protrusion used in the embodiment A3 is at least one polymer compound selected from the group consisting of a novolak resin such as a phenol formaldehyde resin, an m-cresol formaldehyde resin, a p-cresol formaldehyde resin, an m-/p-mixed cresol formaldehyde resin, or a phenol/cresol (any of m-, p-, and m-/p-mixed)-mixed formaldehyde resin, a resol resin, a pyrogallol acetone resin, an epoxy resin, a saturated copolymer polyester resin, a phenoxy resin, a polyvinyl acetal resin, a vinylidene chloride copolymer resin, polybutene, polybutadiene, polyamide, an unsaturated copolymer polyester resin, polyurethane, polyurea, polyimide, polysiloxane, polycarbonate, chlorinated polyethylene, an aldehyde condensation resin of alkyl phenol, polyvinyl chloride, polyvinylidene chloride, polystyrene, a polyacrylate, a carboxyvinyl polymer, an acrylic resin copolymer resin, hydroxy cellulose, hydroxymethyl cellulose, polyvinyl alcohol, polyvinylpyrrolidone, cellulose acetate, methyl cellulose, and carboxymethyl cellulose.

Among these, from the viewpoint of the developability, a water-soluble polymer compound is more preferable. Specific examples thereof include a polyacrylate, a carboxyvinyl polymer, an acrylic resin copolymer resin, hydroxy cellulose, hydroxymethyl cellulose, polyvinyl alcohol, modified polyvinyl alcohol, polyvinylpyrrolidone, cellulose acetate, methyl cellulose, and carboxymethyl cellulose.

As the modified polyvinyl alcohol, acid-modified polyvinyl alcohol containing a carboxy group or a sulfo group is preferably used. Specifically, the modified polyvinyl alcohol described in JP2005-250216A or JP2006-259137A is suitable.

The shape and height of the protrusion are not particularly limited as long as the A seconds as the Bekk smoothness of the surface of the outermost layer at the side where the image recording layer is provided satisfy Expression (1).

Examples of the preferable forms of the protrusions in a case of being formed on the surface of the outermost layer include a stripe coated film, a dot coated film, and a dashed line coated film. However, the present invention is not limited to these forms.

A method of forming stripe-like protrusions (stripe coated film) is not particularly limited, and the protrusions can be easily formed by applying a composition that contains at least one selected from the group consisting of particles and polymer compounds according to at least one method selected from the group consisting of a bar coating method, an ink jet printing method, a gravure printing method, a screen printing method, a spray coating method, and a slot die coating method.

A method of forming dot-like protrusions (dot coated film) is not particularly limited, and the protrusions can be easily formed by applying a composition that contains at least one selected from the group consisting of particles and polymer compounds according to at least one method selected from the group consisting of a spray coating method, an ink jet printing method, and a screen printing method.

A method of forming dashed line protrusions (dashed line coated film) is not particularly limited, and the protrusions can be easily formed by applying a composition that contains at least one selected from the group consisting of particles and polymer compounds according to at least one method selected from the group consisting of an ink jet printing method and a screen printing method.

In a case where the planographic printing plate precursor according to the embodiment of the present invention has an outermost layer (for example, a back coat layer) at the side of the support opposite to the side where the image recording layer is provided, and the outermost layer contains the particles or the protrusions are formed on the outermost layer, the B seconds of the Bekk smoothness of the surface of the outermost layer and the arithmetic average height Sa of the surface of the outermost layer can be adjusted to be in the above-described desired ranges. In this manner, the characteristics of the planographic printing plate precursor according to the embodiment of the present invention are more excellent.

<Support>

The planographic printing plate precursor according to the embodiment of the present invention includes an aluminum support.

As the support used in the planographic printing plate precursor according to the embodiment of the present invention, a known support is used. Among the examples, an aluminum plate which has been subjected to an anodization treatment is preferable and an aluminum plate which has been subjected to a roughening treatment and an anodization treatment is more preferable.

The roughening treatment and the anodization treatment can be performed according to a known method.

The aluminum plate can be subjected to a treatment appropriately selected from an expansion treatment or a sealing treatment of micropores of an anodized film described in JP2001-253181A or JP2001-322365A or a surface hydrophilization treatment using alkali metal silicate described in U.S. Pat. Nos. 2,714,066A, 3,181,461A, 3,280,734A, and 3,902,734A or polyvinyl phosphonic acid described in U.S. Pat. Nos. 3,276,868A, 4,153,461A, and 4,689,272A as necessary.

The center line average roughness Ra of the support is preferably in a range of 0.10 mm to 1.2 mm.

Further, in the support, the average diameter of micropores in the surface of the anodized film is preferably in a range of 10 to 100 nm.

It is preferable that the aluminum support includes an aluminum plate and an anodized aluminum film disposed on the aluminum plate.

The aluminum plate (aluminum support) is a dimensionally stable metal containing aluminum as a main component and is formed of aluminum or an aluminum alloy. Examples of the aluminum plate include a pure aluminum plate, an alloy plate containing aluminum as a main component and a trace amount of foreign elements, and a plastic film or paper on which aluminum (alloy) is laminated or vapor-deposited. Further, a composite sheet in which an aluminum sheet is bonded onto a polyethylene terephthalate film as described in JP1973-018327B (JP-S48-018327B) may be used.

Examples of the foreign elements contained in the aluminum alloy include silicon, iron, manganese, copper, magnesium, chromium, zinc, bismuth, nickel, and titanium, and the content of the foreign elements in the alloy 10% by mass or less with respect to the total mass of the alloy. As the aluminum plate, a pure aluminum plate is preferable, but completely pure aluminum is difficult to produce in terms of smelting technology, and thus the aluminum plate may contain a trace amount of foreign elements.

The composition of the aluminum plate is not limited, and known materials of the related art (for example, JIS A 1050, JIS A 1100, JIS A 3103, and JIS A 3005) can be used as appropriate.

The width of the aluminum plate is preferably in a range of 400 mm to 2000 mm, and the thickness thereof is preferably in a range of 0.1 mm to 0.6 mm. The width or thickness thereof can be appropriately changed depending on the size of the printing press, the size of the printing plate, the printed material to be obtained, and the like.

(Anodized Film)

The anodized film indicates an anodized aluminum film having micropores which is prepared on the surface of the aluminum plate by the anodization treatment. The micropores extend along the thickness direction (aluminum plate side, depth direction) from the surface of the anodized film opposite to the aluminum plate.

From the viewpoints of tone reproducibility, printing durability, and blanket stain resistance, the average diameter (average opening diameter) of the micropores in the surface of the anodized film is preferably in a range of 7 nm to 150 nm, more preferably in a range of 10 nm to 100 nm, still more preferably in a range of 10 nm to 60 nm, particularly preferably in a range of 15 nm to 60 nm, and most preferably in a range of 18 nm to 40 nm.

It is preferable that the micropores in the anodized film are formed of large-diameter pores extending to a position at a depth of 10 nm to 1000 nm from the surface of the anodized film and small-diameter pores communicating with the bottom portions of large-diameter pores and extending from a position at a depth of 20 nm to 2000 nm from the communication position.

Hereinafter, the large-diameter pores and the small-diameter pores will be described in detail.

—Large-Diameter Pore—

From the viewpoints of tone reproducibility, printing durability, and blanket stain resistance, the average diameter (average opening diameter) of the large-diameter pores in the surface of the anodized film is preferably in a range of 7 nm to 150 nm, more preferably in a range of 15 nm to 150 nm, still more preferably in a range of 15 nm to 60 nm, and particularly preferably in a range of 18 nm to 40 nm.

The average diameter of the large-diameter pores is calculated as an arithmetic average value obtained by observing 4 sheets (N=4) of the surfaces of the anodized film using a field emission scanning electron microscope (FE-SEM) at a magnification of 150000, measuring the diameters of the micropores (large-diameter pores) present in a range of 400×600 nm² in the obtained four sheets of images, and averaging the values.

Further, in a case where the shape of the large-diameter pores is not circular, an equivalent circle diameter is used. The "equivalent circle diameter" is a diameter of a circle obtained by assuming the shape of an opening portion of a micropore as a circle having the same projected area as the projected area of the opening portion.

It is preferable that the bottom portions of the large-diameter pores are positioned at a depth of 70 nm to 1000 nm (hereinafter, also referred to as a depth A) from the surface of the anodized film. That is, it is preferable that the large-diameter pores are pores extending from the surface of the anodized film to a position at a depth of 70 nm to 1000 nm in the depth direction (thickness direction). Among examples, from the viewpoint that the effects of the method of producing the planographic printing plate precursor according to the embodiment of the present invention, the depth A is more preferably in a range of 90 nm to 850 nm, still more preferably in a range of 90 nm to 800 nm, and particularly preferably in a range of 90 nm to 600 nm.

Further, the depth thereof is calculated as an arithmetic average value obtained by capturing (at a magnification of 150000) an image of a cross section of the anodized film, measuring the depth of 25 or more large-diameter pores, and averaging the obtained values.

The shape of the large-diameter pores is not particularly limited, and examples thereof include a substantially straight tubular shape (substantially cylindrical shape) and a conical shape whose diameter decreases toward the depth direction (thickness direction). Among these, a substantially straight tubular shape is preferable. Further, the shape of the bottom portions of the large-diameter pores is not particularly limited, but may be a curved shape (projection) or a planar shape.

The inner diameter of the large-diameter pores is not particularly limited, but it is preferable that the inner diameter thereof is approximately the same as or smaller than the diameter of the opening portion. Further, the inner diameter of the large-diameter pores may be different from the diameter of the opening portion by 1 nm to 10 nm.

—Small-Diameter Pore—

The small-diameter pores are pores communicating with the bottom portions of the large-diameter pores and extending from the communication position in the depth direction (thickness direction). One small-diameter pore typically communicates with one large-diameter pore, but two or more small-diameter pores may communicate with the bottom portion of one large-diameter pore.

The average diameter of the small-diameter pores at the communication position is preferably 13 nm or less, more preferably 11 nm or less, and particularly preferably 10 nm or less. The lower limit is not particularly limited, but is preferably 5 nm or more.

The average diameter of the small-diameter pores is calculated as an arithmetic average value obtained by observing 4 sheets (N=4) of the surfaces of the anodized film 20 using a field emission scanning electron microscope (FE-SEM) at a magnification of 150000, measuring the diameters of micropores (small-diameter pores) present in a range of 400 nm×600 nm² in the obtained four sheets of images, and averaging the values. Further, in a case where the depth of the large-diameter pores is large, the average diameter of the small-diameter pores may be acquired by cutting the upper portion (a region where large-diameter pores are present) of the anodized film (for example, cutting the portion by argon gas) as necessary and observing the surface of the anodized film 20 using the above-described FE-SEM.

Further, in a case where the shape of the small-diameter pores is not circular, an equivalent circle diameter is used. The "equivalent circle diameter" is a diameter of a circle obtained by assuming the shape of an opening portion of a micropore as a circle having the same projected area as the projected area of the opening portion.

It is preferable that the bottom portions of the small-diameter pores are positioned at a position extending from the communication position (corresponding to the depth A described above) with the large-diameter pores to a position at a depth of 20 nm to 2000 nm in the depth direction. That is, the small-diameter pores are pores extending from the communication position with the large-diameter pores to a position in the depth direction (thickness direction), and the depth of the small-diameter pores is preferably in a range of 20 nm to 2000 nm, more preferably in a range of 100 nm to 1500 nm, and particularly preferably in a range of 200 nm to 1000 nm.

Further, the depth thereof is calculated as an arithmetic average value obtained by capturing (at a magnification of 50000) an image of a cross section of the anodized film, measuring the depth of 25 or more small-diameter pores, and averaging the obtained values.

The shape of the small-diameter pores is not particularly limited, and examples thereof include a substantially straight tubular shape (substantially cylindrical shape) and a conical shape whose diameter decreases toward the depth direction. Among these, a substantially straight tubular shape is preferable. Further, the shape of the bottom portions of the small-diameter pores is not particularly limited, but may be a curved shape (projection) or a planar shape.

The inner diameter of the small-diameter pores is not particularly limited, but it is preferable that the inner diameter thereof may be approximately the same as the diameter in the communication position or may be smaller or larger than the diameter in the communication position. Typically, the inner diameter of the small-diameter pores may be different from the diameter of the opening portion by 1 nm to 10 nm.

The ratio of the average diameter of the large-diameter pores in the surface of the anodized film to the average diameter of the small-diameter pores at the communication position (average diameter of large-diameter pores in surface of anodized film)/(average diameter of small-diameter pores at communication position) is preferably in a range of 1.1 to 13 and more preferably in a range of 2.5 to 6.5.

Further, the ratio of the depth of the large-diameter pores to the depth of the small-diameter pores (depth of large-diameter pores)/(depth of small-diameter pores) is preferably in a range of 0.005 to 50 and more preferably in a range of 0.025 to 40.

A method of producing the support used in the present invention is not particularly limited, and a known method can be used.

Hereinafter, a method of producing the support will be exemplified, but it goes without saying that the method is not limited thereto.

As a method of producing an aluminum support, for example, a production method of sequentially performing the following steps is preferable as a method of producing an aluminum support that includes an anodized film having micropores extending from the surface thereof on the image recording layer side in the depth direction.

(Roughening treatment step) A step of performing a roughening treatment on an aluminum plate (Anodization treatment step) A step of anodizing the aluminum plate which has been subjected to the roughening treatment (Pore widening treatment step) A step of widening the diameter of micropores in the anodized film by bringing the aluminum plate having the anodized film obtained in the anodization treatment step into contact with an acid aqueous solution or an alkali aqueous solution Hereinafter, the procedures of each step will be described in detail.

—Roughening Treatment Step—

The roughening treatment step is a step of performing a roughening treatment including an electrochemical roughening treatment on a surface of an aluminum plate. It is preferable that the present step is performed before the anodization treatment step described below, but may not be performed in a case where the surface of the aluminum plate already has a preferable surface shape.

The roughening treatment may be carried out by performing only an electrochemical roughening treatment, but may be performed by combining an electrochemical roughening treatment and a mechanical roughening treatment and/or a chemical roughening treatment.

In a case where the mechanical roughening treatment is combined with the electrochemical roughening treatment, it is preferable that the electrochemical roughening treatment is performed after the mechanical roughening treatment.

It is preferable that the electrochemical roughening treatment is performed in an aqueous solution mainly containing nitric acid or hydrochloric acid using the direct current or the alternating current.

The method of performing the mechanical roughening treatment is not particularly limited, and the methods described in JP1975-040047B (JP-S50-040047B) are exemplified.

The chemical roughening treatment is also not particularly limited, and known methods are exemplified.

It is preferable that a chemical etching treatment described below is performed after the mechanical roughening treatment.

The chemical etching treatment to be performed after the mechanical roughening treatment is performed in order to smooth an edge portion of the uneven shape of the surface of the aluminum plate, prevent the ink from being caught during printing, improve the stain resistance of the printing plate, and remove unnecessary matter such as abrasive material particles remaining on the surface.

Examples of the chemical etching treatment include etching carried out using an acid and etching carried out using an alkali, and a chemical etching treatment (hereinafter, also referred to as an "alkali etching treatment") carried out using an alkali aqueous solution is exemplified as a particularly excellent method in terms of etching efficiency.

An alkali agent used for the alkali aqueous solution is not particularly limited, and examples thereof include caustic soda, caustic potash, sodium metasilicate, soda carbonate, soda aluminate, and soda gluconate.

The alkali aqueous solution may contain aluminum ions.

The concentration of the alkali agent in the alkali aqueous solution is preferably 0.01% by mass or greater, more preferably 3% by mass or greater, and preferably 30% by mass or less.

In a case where the alkali etching treatment is performed, it is preferable that the chemical etching treatment (hereinafter, also referred to as a "desmutting treatment") is performed using an acidic aqueous solution at a low temperature in order to remove a product generated due to the alkali etching treatment.

The acid used for the acidic aqueous solution is not particularly limited, and examples thereof include sulfuric acid, nitric acid, and hydrochloric acid. Further, the temperature of the acidic aqueous solution is preferably in a range of 20° C. to 80° C.

It is preferable that the roughening treatment step is performed according to a method of performing the treatments shown in the embodiment A or the embodiment B in order described below.

Embodiment A (2) A chemical etching treatment carried out using an alkali aqueous solution (first alkali etching treatment)

(3) A chemical etching treatment carried out using an acidic aqueous solution (first desmutting treatment)

(4) An electrochemical roughening treatment carried out using an aqueous solution that mainly contains nitric acid (first electrochemical roughening treatment)

(5) A chemical etching treatment carried out using an alkali aqueous solution (second alkali etching treatment)

(6) A chemical etching treatment carried out using an acidic aqueous solution (second desmutting treatment)

(7) An electrochemical roughening treatment carried out in an aqueous solution that mainly contains hydrochloric acid (second electrochemical roughening treatment)

(8) A chemical etching treatment carried out using an alkali aqueous solution (third alkali etching treatment)

(9) A chemical etching treatment carried out using an acidic aqueous solution (third desmutting treatment)

Embodiment B

(10) A chemical etching treatment carried out using an alkali aqueous solution (fourth alkali etching treatment)

(11) A chemical etching treatment carried out using an acidic aqueous solution (fourth desmutting treatment)

(12) An electrochemical roughening treatment carried out using an aqueous solution that mainly contains hydrochloric acid (third electrochemical roughening treatment)

(13) A chemical etching treatment carried out using an alkali aqueous solution (fifth alkali etching treatment)

(14) A chemical etching treatment carried out using an acidic aqueous solution (fifth desmutting treatment)

The mechanical roughening treatment (1) may be performed before the treatment (2) of the embodiment A described above or before the treatment (10) of the embodiment B described above, as necessary.

The amount of the aluminum plate to be dissolved in the first alkali etching treatment and the fourth alkali etching treatment is preferably in a range of 0.5 $g/m^2$ to 30 $g/m^2$ and more preferably in a range of 1.0 $g/m^2$ to 20 $g/m^2$.

As the aqueous solution that mainly contains nitric acid used for the first electrochemical roughening treatment according to the embodiment A, an aqueous solution used for an electrochemical roughening treatment carried out using the direct current or the alternating current is exemplified. For example, an aqueous solution obtained by adding aluminum nitrate, sodium nitrate, or ammonium nitrate to 1 g/L to 100 g/L of a nitric acid aqueous solution is exemplified.

As the aqueous solution that mainly contains hydrochloric acid used for the second electrochemical roughening treatment according to the embodiment A and the third electrochemical roughening treatment according to the embodiment B, an aqueous solution used for an electrochemical roughening treatment carried out using the direct current or the alternating current is exemplified. For example, an aqueous solution obtained by adding 0 g/L to 30 g/L of sulfuric acid to a 1 g/L to 100 g/L hydrochloric acid aqueous solution is exemplified. Further, nitrate ions such as aluminum nitrate, sodium nitrate, and ammonium nitrate; and hydrochloride ions such as aluminum chloride, sodium chloride, and ammonium chloride may be further added to this solution.

As the AC power source waveform of the electrochemical roughening treatment, a sine wave, a square wave, a trapezoidal wave, or a triangular wave can be used. The frequency is preferably in a range of 0.1 Hz to 250 Hz.

FIG. 1 is a graph showing an example of an alternating waveform current waveform diagram used for the electrochemical roughening treatment.

In FIG. 1, ta represents an anodic reaction time, tc represents a cathodic reaction time, tp represents a time taken for the current to reach the peak from 0, Ia represents the peak current on an anode cycle side, and Ic represents the peak current on a cathode cycle side. In the trapezoidal wave, the time tp taken for the current to reach the peak from 0 is preferably in a range of 1 msec to 10 msec. As the preferable conditions for one cycle of the alternating current used for the electrochemical roughening, a ratio tc/ta of the cathodic reaction time tc to the anodic reaction time ta of the aluminum plate is in a range of 1 to 20, a ratio Qc/Qa of an electric quantity Qc in a case of the aluminum plate serving as a cathode to an electric quantity Qa in a case of the aluminum plate serving as an anode is in a range of 0.3 to 20, and the anodic reaction time ta is in a range of 5 msec to 1000 msec. The current density is preferably in a range of 10 A/dm to 200 A/dm$^2$ in both an anode cycle side Ia and a cathode cycle side Ic of the current in terms of the peak value of the trapezoidal wave. The value of Ic/Ia is preferably in a range of 0.3 to 20. The total electric quantity of the aluminum plate used for the anodic reaction in a case where the electrochemical roughening is completed is preferably in a range of 25 C/dm$^2$ to 1000 C/dm$^2$.

Figure 2:
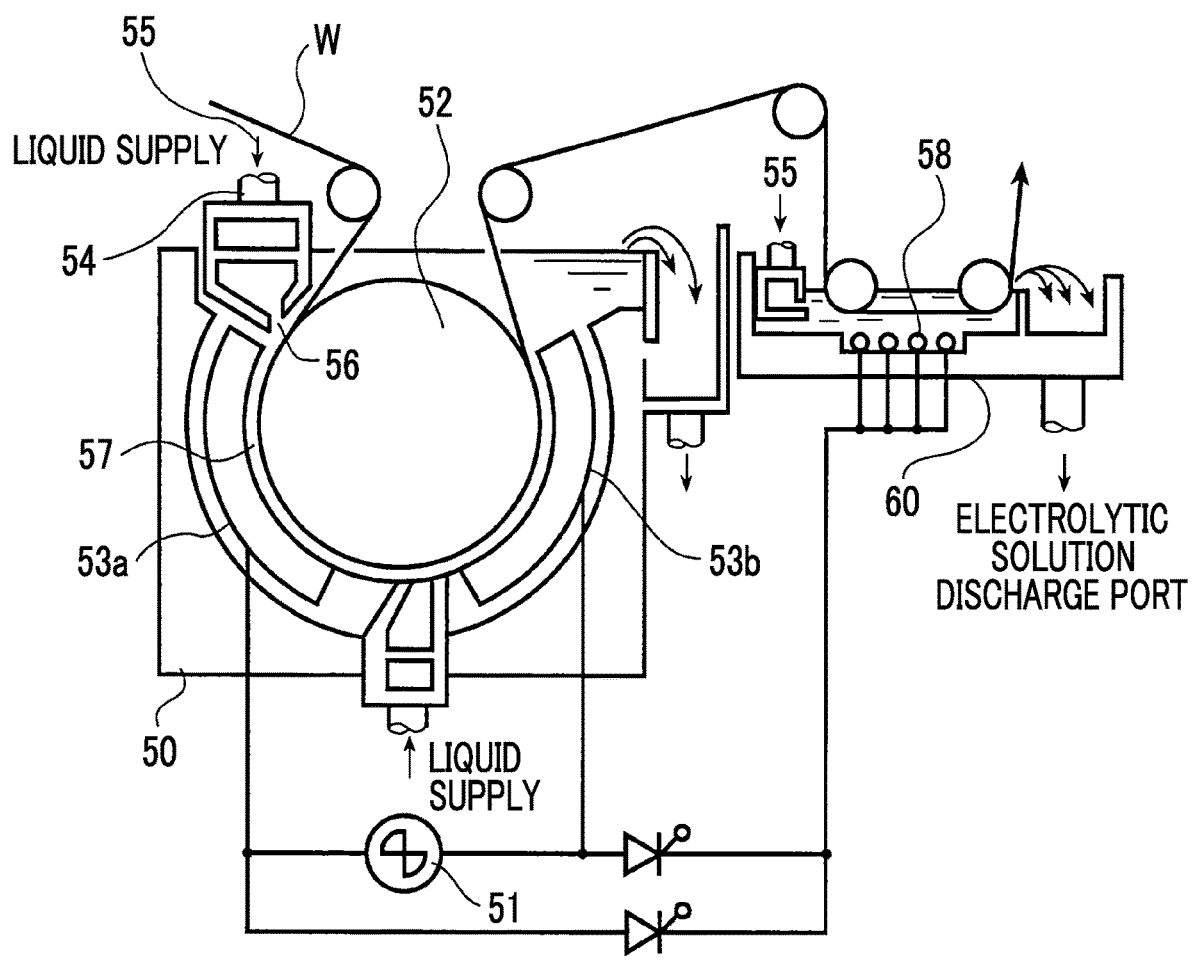
FIG. 2 is a side view illustrating an example of a radial type cell in the electrochemical roughening treatment carried out using an alternating current.

A device illustrated in FIG. 2 can be used for the electrochemical roughening carried out using the alternating current.

FIG. 2 is a side view illustrating an example of a radial type cell in the electrochemical roughening treatment carried out using the alternating current.

In FIG. 2, the reference numeral 50 represents a main electrolytic cell, the reference numeral 51 represents an AC power source, the reference numeral 52 represents a radial drum roller, the reference numerals 53a and 53b represent a main pole, the reference numeral 54 represents an electrolytic solution supply port, the reference numeral 55 represents an electrolytic solution, the reference numeral 56 represents a slit, the reference numeral 57 represents an electrolytic solution passage, the reference numeral 58 represents an auxiliary anode, the reference numeral 60 represents an auxiliary anode cell, and the symbol W represents an aluminum plate. In a case where two or more electrolytic cells are used, the electrolysis conditions may be the same as or different from each other.

The aluminum plate W is wound around the radial drum roller 52 disposed by being immersed in the main electrolytic cell 50 and is electrolyzed by the main poles 53a and 53b connected to the AC power source 51 in the transport process. The electrolytic solution 55 is supplied to the electrolytic solution passage 57 disposed between the radial drum roller 52 and the main pole 53a and between the radial drum roller 52 and the main pole 53b through the slit 56 from the electrolytic solution supply port 54. The aluminum plate W which has been treated in the main electrolytic cell 50 is electrolyzed in the auxiliary anode cell 60. The auxiliary anode 58 is disposed in the auxiliary anode cell 60 so as to face the aluminum plate W and the electrolytic solution 55 is supplied so as to flow through the space between the auxiliary anode 58 and the aluminum plate W.

From the viewpoint of easily producing a predetermined printing plate precursor, the amount of the aluminum plate to be dissolved in the second alkali etching treatment is preferably 1.0 g/m$^2$ or greater and more preferably in a range of 2.0 g/m$^2$ to 10 g/m$^2$.

From the viewpoint of easily producing a predetermined printing plate precursor, the amount of the aluminum plate to be dissolved in the third alkali etching treatment and the fourth alkali etching treatment is preferably 0.01 g/m$^2$ to 0.8 g/m$^2$ and more preferably in a range of 0.05 g/m$^2$ to 0.3 g/m$^2$.

In the chemical etching treatments (first to fifth desmutting treatments) carried out using an acidic aqueous solution, an acidic aqueous solution containing phosphoric acid, nitric acid, sulfuric acid, chromic acid, hydrochloric acid, or mixed acids containing two or more of these acids is suitably used.

The concentration of the acid in the acidic aqueous solution is preferably in a range of 0.5% by mass to 60% by mass.

—Anodization Treatment Step—

The procedures of the anodization treatment step are not particularly limited as long as the above-described micropores are obtained, and known methods are exemplified.

In the anodization treatment step, an aqueous solution containing sulfuric acid, phosphoric acid, oxalic acid, and the like can be used as an electrolytic cell. For example, the concentration of the sulfuric acid may be in a range of 100 g/L to 300 g/L.

The conditions for the anodization treatment are appropriately set depending on the electrolytic solution to be used. As an example of the conditions, the liquid temperature is in a range of 5° C. to 70° C. (preferably in a range of 10° C. to 60° C.), the current density is in a range of 0.5 A/dm$^2$ to 60 A/dm$^2$ (preferably in a range of 5 A/dm$^2$ to 60 A/dm$^2$), the voltage is in a range of 1 V to 100 V (preferably in a range of 5 V to 50 V), the electrolysis time is in a range of 1 second to 100 seconds (preferably in a range of 5 seconds to 60 seconds), and the coating amount is in a range of 0.1 g/m$^2$ to 5 g/m$^2$ (preferably in a range of 0.2 g/m$^2$ to 3 g/m$^2$).

—Pore Widening Treatment—

The pore widening treatment is a treatment (pore diameter widening treatment) of widening the diameter (pore diameter) of micropores present in the anodized film formed by the above-described anodization treatment step.

The pore widening treatment can be performed by bringing the aluminum plate obtained in the anodization treatment step into contact with an acid aqueous solution or an alkali aqueous solution. The method of bringing the aluminum plate into contact with the solution is not particularly limited, and examples thereof include an immersion method and a spray method.

The support can be provided with a back coat layer containing an organic polymer compound described in JP1993-045885A (JP-H05-045885A) and an alkoxy compound of silicon described in JP1994-035174A (JP-H06-035174A) on the rear surface thereof as necessary.

<Image Recording Layer>

The planographic printing plate precursor according to the embodiment of the present invention includes an image recording layer at the upper side of the support.

It is preferable that the image recording layer contains an infrared absorbing agent, a polymerization initiator, a polymerizable compound, and a polymer compound. The polymer compound may function as a binder polymer of the image recording layer or may be present in the image recording layer as a polymer compound having a particle shape.

A polymer compound containing styrene and/or acrylonitrile as a constitutional unit is preferable as the polymer compound.

Examples of the above-described styrene include styrene, p-methylstyrene, p-methoxystyrene, β-methylstyrene, p-methyl-β-methylstyrene, α-methylstyrene, and p-methoxy-β-methylstyrene. Among these, styrene is preferable.

Examples of the above-described acrylonitrile include (meth)acrylonitrile. Among examples, acrylonitrile is preferable.

According to one preferred embodiment of the planographic printing plate precursor of the present invention, the image recording layer is an image recording layer (hereinafter, also referred to as an "image recording layer A") containing an infrared absorbing agent, a polymerization initiator, a polymerizable compound, and a binder polymer.

According to another preferred embodiment of the planographic printing plate precursor of the present invention, the image recording layer is an image recording layer (hereinafter, also referred to as an "image recording layer B") containing an infrared absorbing agent, a polymerization initiator, a polymerizable compound, and a polymer compound having a particle shape.

According to a still another preferred embodiment of the planographic printing plate precursor of the present invention, the image recording layer is an image recording layer (hereinafter, also referred to as an "image recording layer C") containing an infrared absorbing agent and thermoplastic polymer particles.

—Image Recording Layer A—

The image recording layer A contains an infrared absorbing agent, a polymerization initiator, a polymerizable compound, and a binder polymer. Hereinafter, the constituent components of the image recording layer A will be described.

(Infrared Absorbing Agent)

An infrared absorbing agent has a function of converting absorbed infrared rays into heat and a function of electron transfer and/or energy transfer to a polymerization initiator described below through excitation by infrared rays. As the infrared absorbing agent used in the present invention, a coloring agent or a pigment having maximum absorption at a wavelength of 760 nm to 1200 nm is preferable and the coloring agent is more preferable.

As the coloring agent, coloring agents described in paragraphs 0082 to 0088 of JP2014-104631A can be used.

The average particle diameter of the pigment is preferably in a range of 0.01 mm to 1 mm and more preferably in a range of 0.01 mm to 0.5 mm. A known dispersion technique used to produce inks or toners can be used for dispersion of the pigment. The details are described in "Latest Pigment Application Technology" (CMC Publishing Co., Ltd., 1986) and the like.

The infrared absorbing agent may be used alone or in combination of two or more kinds thereof.

The content of the infrared absorbing agent is preferably in a range of 0.05% by mass to 30% by mass, more preferably in a range of 0.1% by mass to 20% by mass, and particularly preferably in a range of 0.2% by mass to 10% by mass with respect to total mass of the image recording layer.

(Polymerization Initiator)

The polymerization initiator indicates a compound that initiates and promotes polymerization of a polymerizable compound. As the polymerization initiator, a known thermal polymerization initiator, a compound having a bond with small bond dissociation energy, or a photopolymerization initiator can be used. Specifically, radical polymerization initiators described in paragraphs 0092 to 0106 of JP2014-104631A can be used.

Preferred examples of the compound in the polymerization initiators include an onium salt. Among these, an iodonium salt and a sulfonium salt are particularly preferable. Specific preferred examples of the compounds in each of the salts are the compounds described in paragraphs 0104 to 0106 of JP2014-104631A.

The content of the polymerization initiator is preferably in a range of 0.1% by mass to 50% by mass, more preferably in a range of 0.5% by mass to 30% by mass, and particularly preferably in a range of 0.8% by mass to 20% by mass with respect to the total mass of the image recording layer. In a case where the content thereof is in the above-described range, improved sensitivity and improved stain resistance of a non-image area during printing are obtained.

(Polymerizable Compound)

The polymerizable compound is an addition polymerizable compound having at least one ethylenically unsaturated bond and is selected from compounds having preferably at least one and more preferably two or more terminal ethylenically unsaturated bonds. These have chemical forms such as a monomer, a pre-polymer, that is, a dimer, a trimer, an oligomer, and a mixture of these.

Examples of the monomer include unsaturated carboxylic acids (for example, acrylic acid, methacrylic acid, itaconic acid, crotonic acid, isocrotonic acid, or maleic acid), esters thereof, and amides thereof. Among these, esters of unsaturated carboxylic acids and polyhydric alcohol compounds, and amides of unsaturated carboxylic acids and polyhydric amine compounds are preferably used. Further, an addition reaction product of unsaturated carboxylic acid ester having a nucleophilic substituent such as a hydroxy group, an amino group, or a mercapto group or amides with monofunctional or polyfunctional isocyanates or epoxies, and a dehydration condensation reaction product with a monofunctional or polyfunctional carboxylic acid are also suitably used. Further, an addition reaction product of unsaturated carboxylic acid ester having an electrophilic substituent such as an isocyanate group or an epoxy group or amides with monofunctional or polyfunctional alcohols, amines, and thiols, and a substitution reaction product of unsaturated carboxylic acid ester having a releasable substituent such as a halogen group or a tosyloxy group or amides with monofunctional or polyfunctional alcohols, amines, and thiols are also suitable.

As another example, a compound group in which unsaturated phosphonic acid, styrene, vinyl ether, or the like is substituted for the unsaturated carboxylic acid can also be used. These are described in JP2006-508380A, JP2002-287344A, JP2008-256850A, JP2001-342222A, JP1997-179296A (JP-H09-179296A), JP1997-179297A (JP-H09-179297A), JP1997-179298A (JP-H09-179298A), JP2004-

294935A, JP2006-243493, JP2002-275129A, JP2003-64130A, JP2003-280187A, and JP1998-333321A (JP-H10-333321A).

Specific examples of the monomer of the ester of a polyhydric alcohol compound and an unsaturated carboxylic acid include acrylic acid ester such as ethylene glycol diacrylate, 1,3-butanediol diacrylate, tetramethylene glycol diacrylate, propylene glycol diacrylate, trimethylolpropane triacrylate, hexanediol diacrylate, tetraethylene glycol diacrylate, pentaerythritol tetraacrylate, sorbitol triacrylate, isocyanuric acid ethylene oxide (EO) modified triacrylate, and a polyester acrylate oligomer. Examples of the methacrylic acid ester include tetramethylene glycol dimethacrylate, neopentyl glycol dimethacrylate, trimethylolpropane trimethacrylate, ethylene glycol dimethacrylate, pentaerythritol trimethacrylate, bis[p-(3-methacryloxy-2-hydroxypropoxy)phenyl]dimethylmethane, and bis[p-(methacryloxyethoxy)phenyl]dimethylmethane. Further, specific examples of the monomer of the amide of a polyvalent amine compound and an unsaturated carboxylic acid include methylenebisacrylamide, methylenebismethacrylamide, 1,6-hexamethylenebisacrylamide, 1,6-hexamethylenebismethacrylamide, diethylenetriamine trisacrylamide, xylylene bisacrylamide, and xylylene bismethacrylamide.

A urethane-based addition-polymerizable compound produced by the addition reaction of an isocyanate and a hydroxy group is also suitable, and specific examples thereof include a vinyl urethane compound containing two or more polymerizable vinyl groups in one molecule, which is obtained by adding a vinyl monomer containing a hydroxy group represented by Formula (b) to a polyisocyanate compound containing two or more isocyanate groups in one molecule described in JP1973-041708B (JP-S48-041708B).

$$CH_2\!\!=\!\!C(R_{b4})COOCH_2CH(R_{b5})OH \qquad (b)$$

However, $R_{b4}$ and $R_{b5}$ represent a hydrogen atom or a methyl group.

Suitable examples of the urethane compound include urethane acrylates described in JP1976-037193A (JP-S51-037193A), JP1990-032293B (JP-H02-032293B), JP1990-016765B (JP-H02-016765B), JP2003-344997A, and JP2006-065210A, urethane compounds having an ethylene oxide skeleton described in JP1983-049860B (JP-S58-049860B), JP1981-017654B (JP-S56-017654B), JP1987-039417B (JP-S62-039417B), JP1987-039418B (JP-S62-039418B), JP2000-250211A, and JP2007-094138A, and urethane compounds containing a hydrophilic group described in U.S. Pat. No. 7,153,632A, JP1996-505958A (JP-H08-505958A), JP2007-293221A, and JP2007-293223A.

Among the examples described above, from the viewpoint that the balance between the hydrophilicity related to the developability and the polymerization ability related to the printing durability is excellent, an isocyanuric acid ethylene oxide-modified acrylate compound and a compound having a urethane bond or a urea bond in a molecule are particularly preferable.

The polymerizable compound may be used alone or in combination of two or more kinds thereof.

The details of the structures of these polymerizable compounds, whether to be used alone or in combination, and the usage method such as the addition amount can be arbitrarily set according to the final performance design of the planographic printing plate precursor.

The content of the polymerizable compound is preferably in a range of 5% by mass to 75% by mass, more preferably in a range of 10% by mass to 70% by mass, and particularly preferably in a range of 15% by mass to 60% by mass with respect to the total mass of the image recording layer.

(Binder Polymer)

A binder polymer can be mainly used to improve the film hardness of the image recording layer. As the binder polymer, known polymers of the related art can be used and polymers having coated-film properties are preferable. Among examples thereof, an acrylic resin, a polyvinyl acetal resin, and a polyurethane resin are preferable.

Suitable examples of the binder polymers include polymers having a crosslinking functional group in the main or a side chain and preferably in a side chain for improving coated-film hardness of an image area as described in JP2008-195018A. Crosslinking occurs between polymer molecules by a crosslinking group so that curing is promoted.

Preferred examples of the crosslinking functional group include an ethylenically unsaturated group such as a (meth)acryl group, a vinyl group, an allyl group, or a styryl group and an epoxy group, and the crosslinking functional groups can be introduced into a polymer by a polymer reaction or copolymerization. For example, a reaction between an acrylic polymer having a carboxy group in a side chain or polyurethane and glycidyl methacrylate or a reaction between a polymer having an epoxy group and an ethylenically unsaturated group-containing carboxylic acid such as methacrylic acid can be used.

The content of the crosslinking group in the binder polymer is preferably in a range of 0.1 mmol to 10.0 mmol, more preferably in a range of 0.25 mmol to 7.0 mmol, and particularly preferably in a range of 0.5 mmol to 5.5 mmol per 1 g of the binder polymer.

Moreover, it is preferable that the binder polymer includes a hydrophilic group. The hydrophilic group contributes to imparting on-press developability to the image recording layer. Particularly, in the coexistence of a crosslinking group and a hydrophilic group, both the printing durability and the on-press developability can be achieved.

Examples of the hydrophilic group include a hydroxy group, a carboxy group, an alkylene oxide structure, an amino group, an ammonium group, an amide group, a sulfo group, and a phosphoric acid group. Among these, an alkylene oxide structure having 1 to 9 alkylene oxide units having 2 or 3 carbon atoms is preferable. A monomer having a hydrophilic group may be copolymerized in order to provide a hydrophilic group for a binder polymer.

In addition, in order to control the impressing property, a lipophilic group such as an alkyl group, an aryl group, an aralkyl group, or an alkenyl group can be introduced into the binder polymer. For example, a lipophilic group-containing monomer such as methacrylic acid alkyl ester may be copolymerized.

The mass average molecular weight (Mw) of the binder polymer is preferably 2000 or greater, more preferably 5000 or greater, and still more preferably in a range of 10000 to 300000.

The content of the binder polymer is preferably in a range of 3% by mass to 90% by mass, more preferably in a range of 5% by mass to 80% by mass, and still more preferably in a range of 10% by mass to 70% by mass with respect to the total mass of the image recording layer.

As a preferred example of the binder polymer, a polymer compound having a polyoxyalkylene chain in a side chain is exemplified. In a case where the image recording layer contains a polymer compound having a polyoxyalkylene chain in a side chain (hereinafter, also referred to as a POA chain-containing polymer compound), the permeability of dampening water is promoted and the on-press developability is improved.

Examples of the resin constituting the main chain of the POA chain-containing polymer compound include an acrylic resin, a polyvinyl acetal resin, a polyurethane resin, a polyurea resin, a polyimide resin, a polyamide resin, an epoxy resin, a methacrylic resin, a polystyrene resin, a novolak type phenolic resin, a polyester resin, synthetic rubber, and natural rubber. Among these, an acrylic resin is particularly preferable.

Further, in the present invention, a "main chain" indicates relatively the longest bonding chain in a molecule of a polymer compound constituting a resin and a "side chain" indicates a molecular chain branched from the main chain.

The POA chain-containing polymer compound does not substantially contain a perfluoroalkyl group. The expression "does not substantially contain a perfluoroalkyl group" means that the mass ratio of a fluorine atom present as a perfluoroalkyl group in a polymer compound is less than 0.5% by mass, and it is preferable that the polymer compound does not contain a fluorine atom. The mass ratio of the fluorine atom is measured by an elemental analysis method.

In addition, the "perfluoroalkyl group" is a group in which all hydrogen atoms of the alkyl group are substituted with fluorine atoms.

As alkylene oxide (oxyalkylene) in a polyoxyalkylene chain, alkylene oxide having 2 to 6 carbon atoms is preferable, ethylene oxide (oxyethylene) or propylene oxide (oxypropylene) is more preferable, and ethylene oxide is still more preferable.

The repetition number of the alkylene oxide in a polyoxyalkylene chain, that is, a polyalkylene oxide moiety is preferably in a range of 2 to 50 and more preferably in a range of 4 to 25.

In a case where the repetition number of the alkylene oxide is 2 or greater, the permeability of dampening water is sufficiently improved. Further, from the viewpoint that printing durability is not degraded due to abrasion, it is preferable that the repetition number thereof is 50 or less.

As the polyalkylene oxide moiety, structures described in paragraphs 0060 to 0062 of JP2014-104631A are preferable.

The POA chain-containing polymer compound may have crosslinking properties in order to improve coated-film hardness of an image area. Examples of the POA chain-containing polymer compounds having crosslinking properties are described in paragraphs 0063 to 0072 of JP2014-104631A.

The proportion of repeating units having a poly(alkylene oxide) moiety in the total repeating units constituting the POA chain-containing polymer compound is not particularly limited, but is preferably in a range of 0.5% by mole to 80% by mole and more preferably in a range of 0.5% by mole to 50% by mole. Specific examples of the POA chain-containing polymer compounds are described in paragraphs 0075 and 0076 of JP2014-104631A.

As the POA chain-containing polymer compound, hydrophilic macromolecular compounds such as polyacrylic acid and polyvinyl alcohol described in JP2008-195018A can be used in combination as necessary. Further, a lipophilic polymer compound and a hydrophilic polymer compound can be used in combination.

In addition to the presence of the POA chain-containing polymer compound in the image recording layer as a binder that plays a role of connecting image recording layer components with each other, the specific polymer compound may be present in the form of a particle. In a case where the specific polymer compound is present in the form of a particle, the average particle diameter is preferably in a range of 10 nm to 1,000 nm, more preferably in a range of 20 nm to 300 nm, and particularly preferably in a range of 30 nm to 120 nm.

The content of the POA chain-containing polymer compound is preferably in a range of 3% by mass to 90% by mass and more preferably in a range of 5% by mass to 80% by mass with respect to the total mass of the image recording layer. In a case where the content thereof is in the above-described range, both the permeability of dampening water and the image formability can be reliably achieved.

Other preferred examples of the binder polymer include a polymer compound (hereinafter, also referred to as a "star type polymer compound") which has a polymer chain bonded to a nucleus through a sulfide bond by using a hexa- to decafunctional polyfunctional thiol as the nucleus and in which the polymer chain contains a polymerizable group. As the star type polymer compound, for example, compounds described in JP2012-148555A can be preferably used.

Examples of the star type polymer compound include compounds having a polymerizable group such as an ethylenically unsaturated bond in the main chain or in a side chain and preferably in a side chain for improving coated-film hardness of an image area as described in JP2008-195018A. Crosslinking occurs between polymer molecules by a polymerizable group so that curing is promoted.

Preferred examples of the polymerizable group include an ethylenically unsaturated group such as a (meth)acryl group, a vinyl group, an allyl group, or a styryl group and an epoxy group. Among these, from the viewpoint of polymerization reactivity, a (meth)acryl group, a vinyl group, or a styryl group is more preferable and a (meth)acryl group is particularly preferable. These groups can be introduced into a polymer by a polymer reaction or copolymerization. For example, a reaction between a polymer having a carboxy group in a side chain thereof and glycidyl methacrylate or a reaction between a polymer having an epoxy group and ethylenically unsaturated group-containing carboxylic acid such as methacrylic acid can be used. These groups may be used in combination.

The content of the crosslinking group in the star type polymer compound is preferably in a range of 0.1 mmol to 10.0 mmol, more preferably in a range of 0.25 mmol to 7.0 mmol, and particularly preferably in a range of 0.5 mmol to 5.5 mmol per 1 g of the star type polymer compound.

Moreover, it is preferable that the star type polymer compound further includes a hydrophilic group. The hydrophilic group contributes to imparting on-press developability to the image recording layer. Particularly, in the coexistence of a polymerizable group and a hydrophilic group, both the printing durability and the developability can be achieved.

Examples of the hydrophilic group include —$SO_3M^1$, —OH, —$CONR^1R^2$ ($M^1$ represents a hydrogen atom, a metal ion, an ammonium ion, or a phosphonium ion, $R^1$ and $R^2$ each independently represent a hydrogen atom, an alkyl group, an alkenyl group, or an aryl group, and $R^1$ and $R^2$ may be bonded to each other to form a ring), —$N+R^3R^4R^5X^-$ ($R^3$ to $R^5$ each independently represent an alkyl group having 1 to 8 carbon atoms, and $X^-$ represents a counter anion), —$(CH_2CH_2O)_nR$, and —$(C_3H_6O)_mR$.

In the above-described formulae, n and m each independently represent an integer of 1 to 100 and R's each independently represent a hydrogen atom or an alkyl group having 1 to 18 carbon atoms.

Here, in a case where the star type polymer compound is a star type polymer compound having a polyoxyalkylene chain (for example, —(CH$_2$CH$_2$O)$_n$R, and —(C$_3$H$_6$O)$_m$R) in a side chain, such a star type polymer compound is a polymer compound having the above-described polyoxyalkylene chain in a side chain.

Among these hydrophilic groups, —CONR$^1$R$^2$, —(CH$_2$CH$_2$O)$_n$R, or —(C$_3$H$_6$O)$_m$R is preferable, —CONR$^1$R$^2$ or —(CH$_2$CH$_2$O)$_n$R is more preferable, and —(CH$_2$CH$_2$O)$_n$R is particularly preferable. In —(CH$_2$CH$_2$O)$_n$R, n represents an integer of preferably 1 to 10 and particularly preferably 1 to 4. Further, R represents more preferably a hydrogen atom or an alkyl group having 1 to 4 carbon atoms and particularly preferably a hydrogen atom or a methyl group. These hydrophilic groups may be used in combination of two or more kinds thereof.

Further, it is preferable that the star type polymer compound does not substantially include a carboxylic acid group, a phosphoric acid group, or a phosphonic acid group. Specifically, the amount of these acid groups is preferably less than 0.1 mmol/g, more preferably less than 0.05 mmol/g, and particularly preferably 0.03 mmol/g or less. In a case where the amount of these acid groups is less than 0.1 mmol/g, developability is further improved.

In order to control the impressing property, a lipophilic group such as an alkyl group, an aryl group, an aralkyl group, or an alkenyl group can be introduced to the star type polymer compound. Specifically, a lipophilic group-containing monomer such as methacrylic acid alkyl ester may be copolymerized.

Specific examples of the star type polymer compound include compounds described in paragraphs 0153 to 0157 of JP2014-104631A.

The star type polymer compound can be synthesized, using a known method, by performing radical polymerization on the above-described monomers constituting a polymer chain in the presence of the above-described polyfunctional thiol compound.

The mass average molecular weight (Mw) of the star type polymer compound is preferably in a range of 5000 to 500000, more preferably in a range of 10000 to 250000, and particularly preferably in a range of 20000 to 150000. In a case where the weight-average molecular weight thereof is in the above-described range, the on-press developability and the printing durability are further improved.

The star type polymer compound may be used alone or in combination of two or more kinds thereof. Further, the star type polymer compound may be used in combination with a typical linear binder polymer.

The content of the star type polymer compound is preferably in a range of 5% by mass to 95% by mass, more preferably in a range of 10% by mass to 90% by mass, and particularly preferably in a range of 15% by mass to 85% by mass with respect to the total mass of the image recording layer.

Particularly from the viewpoints of promoting the permeability of dampening water and improving the on-press developability, star type polymer compounds described in JP2012-148555A are preferable.

(Other Components)

The image recording layer A can contain other components described below.

(1) Low-Molecular-Weight Hydrophilic Compound

In order to improve the on-press developability without degrading the printing durability, the image recording layer may contain a low-molecular-weight hydrophilic compound.

Examples of the water-soluble organic compound as the low-molecular-weight hydrophilic compound include glycols such as ethylene glycol, diethylene glycol, triethylene glycol, propylene glycol, dipropylene glycol, and tripropylene glycol and ether or ester derivatives thereof; polyols such as glycerin, pentaerythritol, and tris(2-hydroxyethyl) isocyanurate; organic amines such as triethanolamine, diethanolamine, and monoethanolamine and salts thereof; organic sulfonic acids such as alkylsulfonic acid, toluenesulfonic acid, and benzenesulfonic acid and salts thereof; organic sulfamic acids such as alkyl sulfamic acid and salts thereof; organic sulfuric acids such as alkyl sulfuric acid and alkyl ether sulfuric acid and salts thereof, organic phosphonic acids such as phenyl phosphonic acid and salts thereof, organic carboxylic acids such as tartaric acid, oxalic acid, citric acid, malic acid, lactic acid, gluconic acid, and amino acids and salts thereof; and betaines.

Among these, it is preferable that the image recording layer contains at least one compound selected from the group consisting of polyols, organic sulfates, organic sulfonates, and betaines.

Specific examples of the compounds of the organic sulfonates include compounds described in paragraphs 0026 to 0031 of JP2007-276454A and paragraphs 0020 to 0047 of JP2009-154525A. The salt may be a potassium salt or a lithium salt.

Examples of the organic sulfate include compounds described in paragraphs 0034 to 0038 of JP2007-276454A.

As the betaines, compounds having 1 to 5 carbon atoms of hydrocarbon substituents to nitrogen atoms are preferable. Specific examples thereof include trimethyl ammonium acetate, dimethyl propyl ammonium acetate, 3-hydroxy-4-trimethyl ammonio butyrate, 4-(1-pyridinio) butyrate, 1-hydroxyethyl-1-imidazolioacetate, trimethyl ammonium methane sulfonate, dimethyl propyl ammonium methane sulfonate, 3-trimethylammonio-1-propane sulfonate, and 3-(1-pyridinio)-1-propane sulfonate.

Since the low-molecular-weight hydrophilic compound has a small structure of a hydrophobic portion, the hydrophobicity or coated-film hardness of an image area is not degraded by dampening water permeating into an exposed portion (image area) of the image recording layer and thus the ink receptivity or the printing durability of the image recording layer can be maintained satisfactorily.

The amount of the low-molecular-weight hydrophilic compounds to be added to the image recording layer is preferably in a range of 0.5% by mass to 20% by mass, more preferably in a range of 1% by mass to 15% by mass, and still more preferably in a range of 2% by mass to 10% by mass with respect to the total mass of the image recording layer. In a case where the amount thereof is in the above-described range, excellent on-press developability and printing durability can be obtained.

These low-molecular-weight hydrophilic compounds may be used alone or in combination of two or more kinds thereof.

(2) Oil Sensitizer

In order to improve the impressing property, an oil sensitizer such as a phosphonium compound, a nitrogen-containing low-molecular-weight compound, or an ammonium group-containing polymer can be used for the image recording layer. Particularly, in a case where a protective layer contains an inorganic layered compound, the above-described compounds function as a surface coating agent of the inorganic layered compound and prevent a degradation in impressing property due to the inorganic layered compound during the printing.

The phosphonium compound, the nitrogen-containing low-molecular-weight compound, and the ammonium group-containing polymer are described in paragraphs 0184 to 0190 of JP2014-104631A in detail.

The content of the oil sensitizer is preferably in a range of 0.01% by mass to 30.0% by mass, more preferably in a range of 0.1% by mass to 15.0% by mass, and still more preferably in a range of 1% by mass to 10% by mass with respect to the total mass of the image recording layer.

(3) Other Components

The image recording layer may further contain other components such as a surfactant, a coloring agent, a printing-out agent, a polymerization inhibitor, a higher fatty acid derivative, a plasticizer, inorganic particles, an inorganic layered compound, a co-sensitizer, and a chain transfer agent. Specifically, the compounds and the addition amounts described in paragraphs 0114 to 0159 of JP2008-284817A, paragraphs 0023 to 0027 of JP2006-091479A, and paragraph 0060 of US2008/0311520A can be preferably used.

(Formation of Image Recording Layer A)

The image recording layer A is formed by dispersing or dissolving each of the above-described required components in a known solvent to prepare a coating solution, coating a support with the coating solution directly or through an undercoat layer using a known method such as a bar coater coating method, and drying the resultant, as described in paragraphs 0142 and 0143 of JP2008-195018A. The coating amount of the image recording layer (solid content) on the support to be obtained after the coating and the drying varies depending on the applications thereof, but is preferably in a range of 0.3 g/m$^2$ to 3.0 g/m$^2$. In a case where the coating amount thereof is in the above-described range, excellent sensitivity and excellent film-coating characteristics of the image recording layer are obtained.

—Image Recording Layer B—

The image recording layer B contains an infrared absorbing agent, a polymerization initiator, a polymerizable compound, and a polymer compound having a particle shape. Hereinafter, the constituent components of the image recording layer B will be described.

Similarly, the infrared absorbing agent, the polymerization initiator, and the polymerizable compound described in the image recording layer A can be used as an infrared absorbing agent, a polymerization initiator, and a polymerizable compound in the image recording layer B.

(Polymer Compound Having Particle Shape)

It is preferable that the polymer compound having a particle shape is selected from the group consisting of thermoplastic polymer particles, thermally reactive polymer particles, polymer particles having a polymerizable group, microcapsules encapsulating a hydrophobic compound, and microgels (crosslinked polymer particles). Among these, polymer particles having a polymerizable group and a microgel are preferable. According to a particularly preferred embodiment, the polymer compound having a particle shape contains at least one ethylenically unsaturated polymerizable group. Due to the presence of the polymer compound having a particle shape, the effects of improving the printing durability of an exposed portion and the on-press developability of an unexposed portion can be obtained.

Further, it is preferable that the polymer compound having a particle shape is in the form of thermoplastic polymer particles.

Preferred examples of the thermoplastic polymer particles include hydrophobic thermoplastic polymer particles described in Research Disclosure No. 33303 on January, 1992, JP1997-123387A (JP-H09-123387A), JP1997-131850A (JP-H09-131850A), JP1997-171249A (JP-H09-171249A), JP1997-171250A (JP-H09-171250A), and EP931647B.

Specific examples of a polymer constituting thermoplastic polymer particles include homopolymers or copolymers of monomers such as acrylate or methacrylate having structures of ethylene, styrene, vinyl chloride, methyl acrylate, ethyl acrylate, methyl methacrylate, ethyl methacrylate, vinylidene chloride, acrylonitrile, vinyl carbazole, and polyalkylene, and mixtures of these. Among these, polystyrene, styrene, a copolymer containing acrylonitrile, and polymethyl methacrylate are more preferable. The average particle diameter of the thermoplastic polymer particles is preferably in a range of 0.01 mm to 3.0 mm.

Examples of the thermally reactive polymer particles include polymer particles having a thermally reactive group. The thermally reactive polymer particles are crosslinked by a thermal reaction and have hydrophobic regions formed by a change in functional groups during the crosslinking.

As the thermally reactive group in polymer particles having a thermally reactive group, a functional group that performs any reaction may be used as long as a chemical bond is formed, but a polymerizable group is preferable. Preferred examples of the polymerizable group include an ethylenically unsaturated group that performs a radical polymerization reaction (such as an acryloyl group, a methacryloyl group, a vinyl group, or an allyl group); a cationic polymerizable group (such as a vinyl group, a vinyloxy group, an epoxy group, or an oxetanyl group); an isocyanate group that performs an addition reaction or a block body thereof, an epoxy group, a vinyloxy group, and a functional group having active hydrogen atoms as the reaction partners of these (such as an amino group, a hydroxy group, or a carboxy group); a carboxy group that performs a condensation reaction and a hydroxy group or an amino group as a reaction partner thereof, and an acid anhydride that performs a ring opening addition reaction and an amino group or a hydroxy group as a reaction partner thereof.

The microcapsule is a microcapsule in which at least a part of constituent components of the image recording layer is encapsulated as described in JP2001-277740A and JP2001-277742A. Further, the constituent components of the image recording layer may be contained in a portion other than the microcapsule. Moreover, a preferred embodiment of the image recording layer containing the microcapsule is an embodiment in which hydrophobic constituent components are encapsulated by a microcapsule and hydrophilic constituent components are contained by a portion other than the microcapsule.

The microgel (crosslinked polymer particles) may contain a part of the constituent components of the image recording layer in at least one of the surface or the inside thereof. From the viewpoints of image forming sensitivity and printing durability, a reactive microgel having a radical polymerizable group on the surface thereof is particularly preferable.

The constituent components of the image recording layer can be made into microcapsules or microgel particles using a known method.

From the viewpoints of the printing durability, the stain resistance, and the storage stability, it is preferable that the polymer compound having a particle shape is obtained by reacting a polyvalent isocyanate compound which is an adduct of a polyhydric phenol compound containing two or more hydroxy groups in a molecule and isophorone diisocyanate with a compound containing active hydrogen.

As the polyhydric phenol compound, a compound having a plurality of benzene rings containing a phenolic hydroxy group is preferable.

As the compound that contains a compound containing the above-described active hydrogen, a polyol compound or a polyamine compound is preferable, a polyol compound is more preferable, and at least one compound selected from the group consisting of propylene glycol, glycerin, and trimethylolpropane is still more preferable.

As the resin particles obtained by reacting the compound containing active hydrogen with the polyvalent isocyanate compound which is an adduct of a polyhydric phenol compound containing two or more hydroxy groups in a molecule and isophorone diisocyanate, polymer particles described in paragraphs 0032 to 0095 of JP2012-206495A are preferably exemplified.

Further, from the viewpoints of the printing durability and the solvent resistance, it is preferable that the polymer compound having a particle shape has a hydrophobic main chain and both a constitutional unit (i) containing a pendant-cyano group directly bonded to the hydrophobic main chain and a constitutional unit (ii) containing a pendant group having a hydrophilic polyalkylene oxide segment.

As the hydrophobic main chain, an acrylic resin chain is preferably exemplified.

Preferred examples of the pendant-cyano group include —[CH$_2$CH(C≡N)—] and —[CH$_2$C(CH$_3$)(C≡N)—].

Further, the constitutional unit having a pendant-cyano group can be easily derived from an ethylene-based unsaturated monomer such as acrylonitrile or methacrylonitrile or a combination of these.

Further, as the alkylene oxide in the hydrophilic polyalkylene oxide segment, ethylene oxide or propylene oxide is preferable and ethylene oxide is more preferable.

The repetition number of alkylene oxide structures in the hydrophilic polyalkylene oxide segment is preferably in a range of 10 to 100, more preferably in a range of 25 to 75, and still more preferably in a range of 40 to 50.

As the resin particles which have a hydrophobic main chain and both the constitutional unit (i) containing a pendant-cyano group directly bonded to the hydrophobic main chain and the constitutional unit (ii) containing a pendant group having a hydrophilic polyalkylene oxide segment, those described in paragraphs 0039 to 0068 of JP2008-503365A are preferably exemplified.

The average particle diameter of the polymer compound having a particle shape is preferably in a range of 0.01 μm to 3.0 μm, more preferably in a range of 0.03 μm to 2.0 μm, and still more preferably in a range of 0.10 μm to 1.0 μm. In a case where the average particle diameter thereof is in the above-described range, excellent resolution and temporal stability are obtained.

The content of the polymer compound having a particle shape is preferably in a range of 5% by mass to 90% by mass with respect to the total mass of the image recording layer.

(Other Components)

The image recording layer B can contain other components described in the above-described image recording layer A as necessary.

(Formation of Image Recording Layer B)

The image recording layer B can be formed in the same manner as the image recording layer A described above.

—Image Recording Layer C—

The image recording layer C contains an infrared absorbing agent and thermoplastic polymer particles. Hereinafter, the constituent components of the image recording layer C will be described.

(Infrared Absorbing Agent)

As the infrared absorbing agent contained in the image recording layer C, a dye or a pigment having maximum absorption at a wavelength of 760 nm to 1200 nm is preferable. A dye is more preferable.

As the dye, commercially available dyes and known dyes described in the literatures (for example, "Dye Handbook" edited by The Society of Synthetic Organic Chemistry, Japan, published in 1970, "Near Infrared Absorbing Dyes" of "Chemical Industry", p. 45 to 51, published on May, 1986, and "Development and Market Trend of Functional Dyes in 1990's" Section 2.3 of Chapter 2 (CMC Publishing Co., Ltd., 1990)) and the patents can be used. Specific preferred examples thereof include infrared absorbing dyes such as an azo dye, a metal complex salt azo dye, a pyrazolone azo dye, an anthraquinone dye, a phthalocyanine dye, a carbonium dye, a quinone imine dye, a polymethine dye, and a cyanine dye.

Among these, infrared absorbing dyes having a water-soluble group are particularly preferable from the viewpoint of addition to the image recording layer C.

Specific examples of the infrared absorbing dyes are described below, but the present invention is not limited thereto.

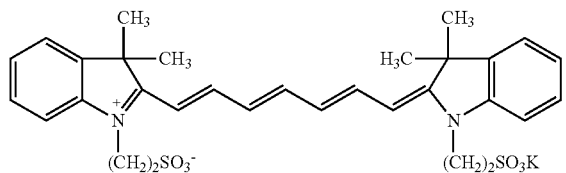

(IR-1)

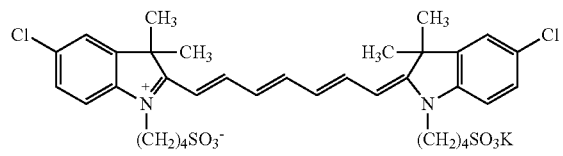

(IR-2)

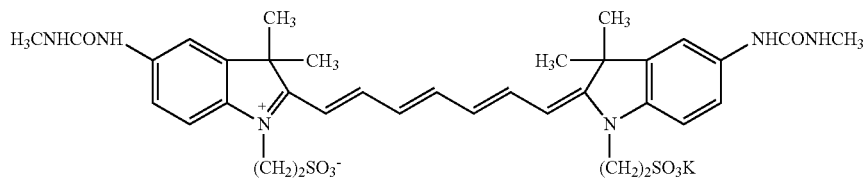

(IR-3)

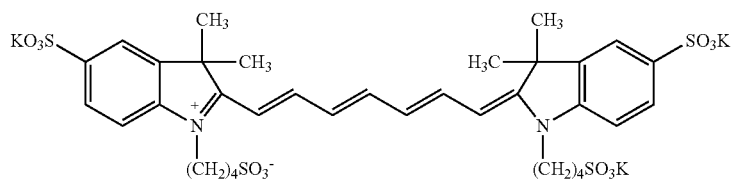
(IR-4)

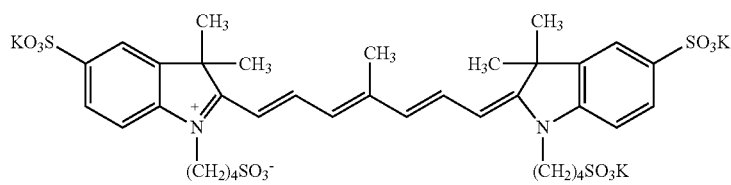
(IR-5)

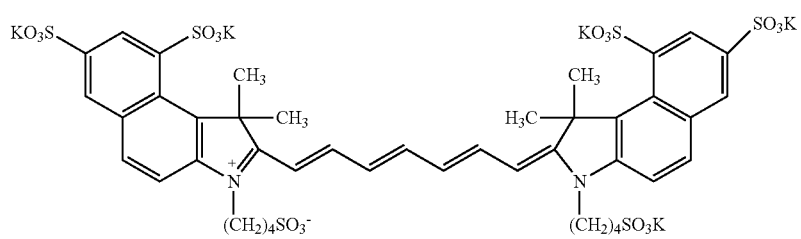
(IR-6)

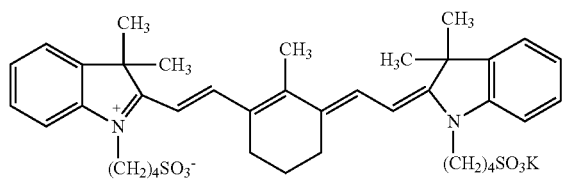
(IR-7)

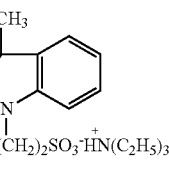
(IR-8)

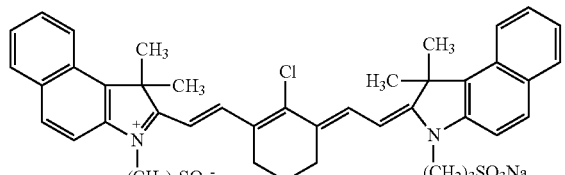
(IR-9)

(IR-10)

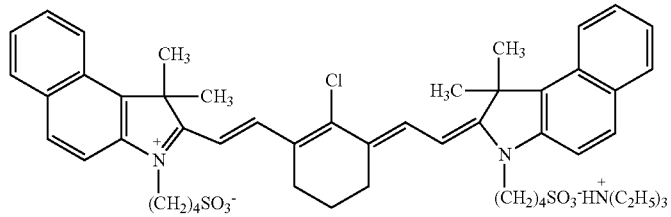
(IR-11)

As the pigments, commercially available pigments and pigments described in Color Index (C. I.) Handbook, "Latest Pigment Handbook" (edited by Japan Pigment Technology Association, 1977), "Latest Pigment Application Technology" (CMC Publishing Co., Ltd., 1986), and "Printing Ink Technology" (CMC Publishing Co., Ltd., 1984) can be used.

The particle diameter of the pigment is preferably in a range of 0.01 mm to 1 mm and more preferably in a range of 0.01 mm to 0.5 mm. A known dispersion technique used to produce inks or toners can be used as a method of dispersing the pigment. The details are described in "Latest Pigment Application Technology" (CMC Publishing Co., Ltd., 1986).

The content of the infrared absorbing agent is preferably in a range of 0.1% by mass to 30% by mass, more preferably in a range of 0.25% by mass to 25% by mass, and particularly preferably in a range of 0.5% by mass to 20% by mass with respect to the total mass of the image recording layer. In a case where the content thereof is in the above-described range, excellent sensitivity is obtained without damaging the film hardness of the image recording layer.

(Thermoplastic Polymer Particles)

The glass transition temperature (Tg) of the thermoplastic polymer particles is preferably in a range of 60° C. to 250° C. The Tg of the thermoplastic polymer particles is more preferably in a range of 70° C. to 140° C. and still more preferably in a range of 80° C. to 120° C.

Preferred examples of the thermoplastic polymer particles having a Tg of 60° C. or higher include thermoplastic polymer particles described in Research Disclosure No. 33303 on January, 1992, JP1997-123387A (JP-H09-123387A), JP1997-131850A (JP-H09-131850A), JP1997-171249A (JP-H09-171249A), JP1997-171250A (JP-H09-171250A), and EP931647B.

Specific examples thereof include homopolymers or copolymers formed of monomers such as ethylene, styrene, vinyl chloride, methyl acrylate, ethyl acrylate, methyl methacrylate, ethyl methacrylate, vinylidene chloride, acrylonitrile, and vinyl carbazole, and mixtures of these. Among these, polystyrene, styrene, a copolymer containing styrene and acrylonitrile, and polymethyl methacrylate are preferable.

The average particle diameter of the thermoplastic polymer particles is preferably in a range of 0.005 mm to 2.0 mm from the viewpoints of the resolution and the temporal stability. This value is used as the average particle diameter in a case where two or more thermoplastic polymer particles are mixed with each other. The average particle diameter thereof is more preferably in a range of 0.01 mm to 1.5 mm and particularly preferably in a range of 0.05 mm to 1.0 mm. The polydispersity in a case where two or more thermoplastic polymer particles are mixed with each other is preferably 0.2 or greater. The average particle diameter and the polydispersity are calculated according to a laser light scattering method.

The thermoplastic polymer particles may be used in combination of two or more kinds thereof. Specifically, at least two kinds of thermoplastic polymer particles with different particle sizes or at least two kinds of thermoplastic polymer particles with different glass transition temperatures (Tg) may be exemplified. In a case where two or more thermoplastic polymer particles are used in combination, coated-film curing properties of an image area are further improved and printing durability in a case where a planographic printing plate is obtained is further improved.

For example, in a case where thermoplastic polymer particles having the same particle size are used, voids are present between the thermoplastic polymer particles to some extent, the curing properties of the coated-film are not desirable in some cases even in a case where the thermoplastic polymer particles are melted and solidified by image exposure. Meanwhile, in a case where thermoplastic polymer particles having different particle sizes are used, the void volume between the thermoplastic polymer particles can be decreased and thus the coated-film curing properties of the image area after image exposure can be improved.

Further, in a case where thermoplastic polymer particles having the same Tg are used, the thermoplastic polymer particles are not sufficiently melted and solidified and, accordingly, the coated-film curing properties are not desirable in some cases when an increase in temperature of the image recording layer resulting from image exposure is insufficient. Meanwhile, in a case where thermoplastic polymer particles having different glass transition temperatures (Tg) are used, the coated-film curing properties of the image area can be improved when an increase in temperature of the image recording layer resulting from image exposure is insufficient.

In a case where two or more thermoplastic polymer particles having different glass transition temperatures (Tg) are used in combination, the Tg of at least one thermoplastic polymer particle is preferably 60° C. or higher. At this time, a difference in Tg is preferably 10° C. or higher and more preferably 20° C. or higher. In addition, the content of the thermoplastic polymer particles having a Tg of 60° C. or higher is preferably 70% by mass or greater with respect to the total amount of all thermoplastic polymer particles.

The thermoplastic polymer particles may include a crosslinking group. In a case where thermoplastic polymer particles having a crosslinking group are used, the crosslinking group thermally reacts due to heat generated by an image-exposed portion so that crosslinking occurs between polymers, coated-film hardness of an image area is improved, and the printing durability is more excellent. As the crosslinking group, a functional group, in which any reaction may occur, is not limited as long as a chemical bond is formed, and examples thereof include an ethylenically unsaturated group that performs a polymerization reaction (such as an acryloyl group, a methacryloyl group, a vinyl group, or an allyl group); an isocyanate group that performs an addition reaction or a block body thereof, and a group having active hydrogen atoms as the reaction partners of these (such as an amino group, a hydroxy group, or a carboxyl group); an epoxy group that performs an addition reaction and an amino group, a carboxyl group or a hydroxy group as reaction partners thereof, a carboxyl group that performs a condensation reaction and a hydroxy group or an amino group; and an acid anhydride that performs a ring opening addition reaction and an amino group or a hydroxy group.

Specific examples of the thermoplastic polymer particles having a crosslinking group include thermoplastic polymer particles having crosslinking groups such as an acryloyl group, a methacryloyl group, a vinyl group, an allyl group, an epoxy group, an amino group, a hydroxy group, a carboxyl group, an isocyanate group, an acid anhydride, and a group protecting these. These crosslinking groups may be introduced to polymers in a case of polymerization of particle polymers or may be introduced using a polymer reaction after polymerization of particle polymers.

In a case where a crosslinking group is introduced to a polymer in a case of polymerization of polymer particles, it is preferable that a monomer having a crosslinking group may be subjected to an emulsion polymerization or suspension polymerization. Specific examples of the monomer having a crosslinking group include allyl methacrylate, allyl acrylate, vinyl methacrylate, vinyl acrylate, glycidyl methacrylate, glycidyl acrylate, 2-isocyanate ethyl methacrylate or block isocyanate resulting from alcohol thereof, 2-isocyanate ethyl acrylate or block isocyanate resulting from alcohol thereof, 2-aminoethyl methacrylate, 2-aminoethyl acrylate, 2-hydroxyethyl methacrylate, 2-hydroxyethyl acrylate, acrylic acid, methacrylic acid, maleic anhydride, bifunctional acrylate, and bifunctional methacrylate.

Examples of the polymer reaction used in a case where a crosslinking group is introduced after polymerization of polymer particles include polymer reactions described in WO96/034316A.

In the thermoplastic polymer particles, polymer particles may react with each other through a crosslinking group, and the thermoplastic polymer particles may react with a polymer compound or a low-molecular-weight compound added to the image recording layer.

The content of the thermoplastic polymer particles is preferably in a range of 50% by mass to 95% by mass, more preferably in a range of 60% by mass to 90% by mass, and particularly preferably in a range of 70% by mass to 85% by mass with respect to the total mass of the image recording layer.

(Other Components)

The image recording layer C may contain other components as necessary.

As other components, a surfactant having a polyoxyalkylene group or a hydroxy group is preferably exemplified.

As a surfactant having a polyoxyalkylene group (hereinafter, also referred to as a "POA group") or a hydroxy group, a surfactant having a POA group or a hydroxy group can be suitably used, but an anionic surfactant or a non-ionic surfactant is preferable. Among anionic surfactants or non-ionic surfactants having a POA group or a hydroxy group, anionic surfactants or non-ionic surfactants having a POA group are preferable.

As the POA group, a polyoxyethylene group, a polyoxypropylene group, or a polyoxybutylene group is preferable and a polyoxyethylene group is particularly preferable.

The average degree of polymerization of an oxyalkylene group is preferably in a range of 2 to 50 and more preferably in a range of 2 to 20.

The number of hydroxy groups is preferably 1 to 10 and more preferably in a range of 2 to 8. Here, the number of terminal hydroxy groups in the oxyalkylene group is not included in the number of hydroxy groups.

The anionic surfactant having a POA group is not particularly limited, and examples thereof include polyoxyalkylene alkyl ether carboxylates, polyoxyalkylene alkyl sulfosuccinates, polyoxyalkylene alkyl ether sulfuric acid ester salts, alkyl phenoxy polyoxyalkylene propyl sulfonates, polyoxyalkylene alkyl sulfophenyl ethers, polyoxyalkylene aryl ether sulfuric acid ester salts, polyoxyalkylene polycyclic phenyl ether sulfuric acid ester salts, polyoxyalkylene styryl phenyl ether sulfuric acid ester salts, polyoxyalkylene alkyl ether phosphoric acid ester salts, polyoxyalkylene alkyl phenyl ether phosphoric acid ester salts, and polyoxyalkylene perfluoroalkyl ether phosphoric acid ester salts.

The anionic surfactant having a hydroxy group is not particularly limited, and examples thereof include hydroxy carboxylates, hydroxy alkyl ether carboxylates, hydroxy alkane sulfonates, fatty acid monoglyceride sulfuric acid ester salts, and fatty acid monoglyceride acid ester salts.

The content of the surfactant having a POA group or a hydroxy group is preferably in a range of 0.05% by mass to 15% by mass and more preferably in a range of 0.1% by mass to 10% by mass with respect to the total mass of the image recording layer.

Hereinafter, specific examples of the surfactant having a POA group or a hydroxy group will be described, but the present invention is not limited thereto. A surfactant A-12 described below is a trade name of Zonyl FSP and available from Dupont. Further, a surfactant N-11 described below is a trade name of Zonyl FSO 100 and available from Dupont. Further, m and n in A-12 each independently represent an integer of 1 or greater.

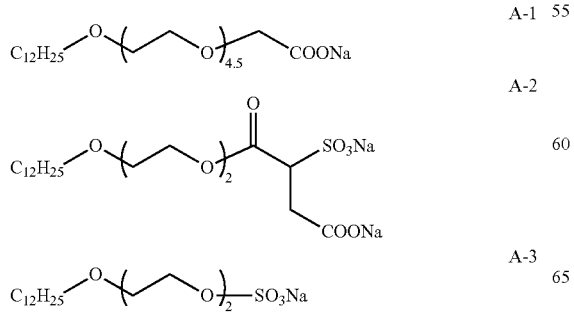
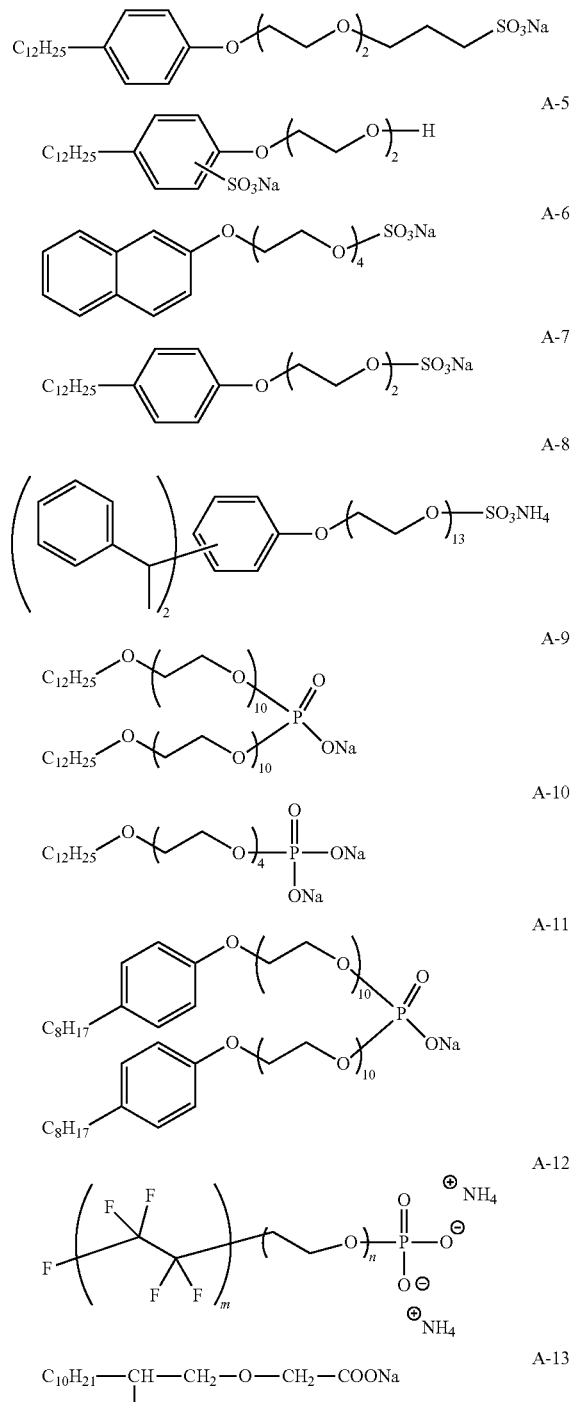
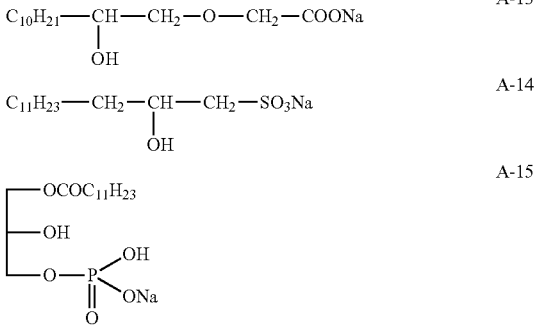

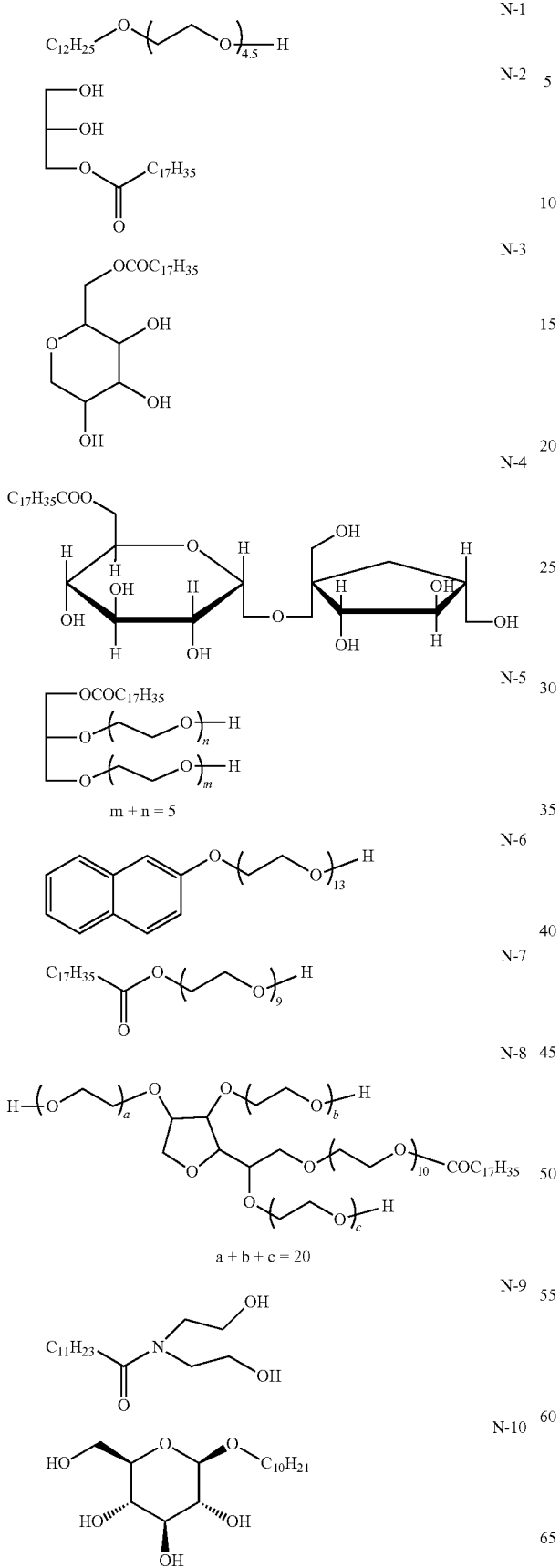

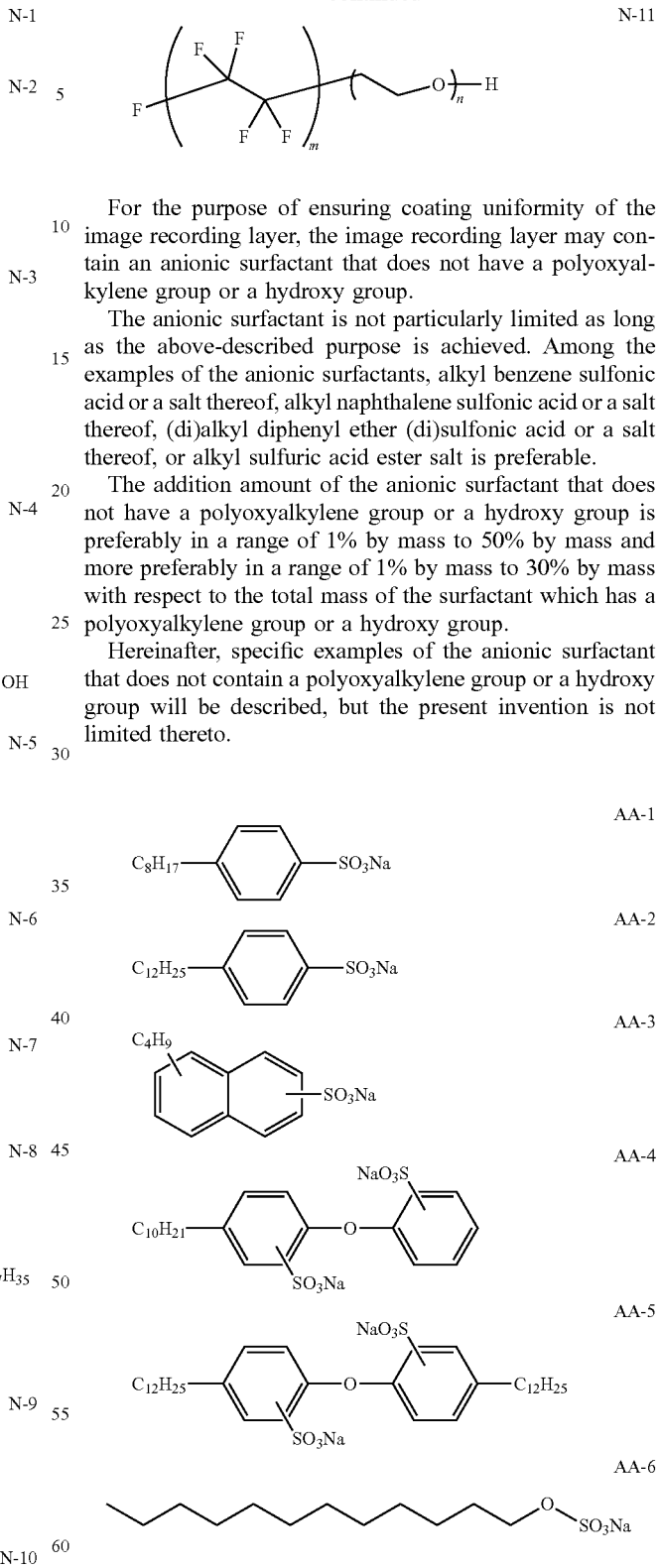

For the purpose of ensuring coating uniformity of the image recording layer, the image recording layer may contain an anionic surfactant that does not have a polyoxyalkylene group or a hydroxy group.

The anionic surfactant is not particularly limited as long as the above-described purpose is achieved. Among the examples of the anionic surfactants, alkyl benzene sulfonic acid or a salt thereof, alkyl naphthalene sulfonic acid or a salt thereof, (di)alkyl diphenyl ether (di)sulfonic acid or a salt thereof, or alkyl sulfuric acid ester salt is preferable.

The addition amount of the anionic surfactant that does not have a polyoxyalkylene group or a hydroxy group is preferably in a range of 1% by mass to 50% by mass and more preferably in a range of 1% by mass to 30% by mass with respect to the total mass of the surfactant which has a polyoxyalkylene group or a hydroxy group.

Hereinafter, specific examples of the anionic surfactant that does not contain a polyoxyalkylene group or a hydroxy group will be described, but the present invention is not limited thereto.

Further, for the purpose of ensuring coating uniformity of the image recording layer, a non-ionic surfactant that does not have a polyoxyalkylene group or a hydroxy group or a fluorine surfactant may be used. For example, fluorine surfactants described in JP1987-170950A (JP-S62-170950A) are preferably used.

The image recording layer may contain a hydrophilic resin. Preferred examples of the hydrophilic resin include resins having hydrophilic groups such as a hydroxy group, a hydroxyethyl group, a hydroxypropyl group, an amino group, an aminoethyl group, an aminopropyl group, a carboxy group, a carboxylate group, a sulfo group, a sulfonate group, and a phosphoric acid group.

Specific examples of the hydrophilic resin include gum Arabic, casein, gelatin, a starch derivative, carboxy methyl cellulose and sodium salt thereof, cellulose acetate, sodium alginate, vinyl acetate-maleic acid copolymers, styrene-maleic acid copolymers, polyacrylic acids and salts of these, polymethacrylic acids and salts of these, a homopolymer and a copolymer of hydroxy ethyl methacrylate, a homopolymer and a copolymer of hydroxy ethyl acrylate, a homopolymer and a copolymer of hydroxy propyl methacrylate, a homopolymer and a copolymer of hydroxy propyl acrylate, a homopolymer and a copolymer of hydroxy butyl methacrylate, a homopolymer and a copolymer of hydroxy butyl acrylate, polyethylene glycols, hydroxy propylene polymers, polyvinyl alcohols, hydrolyzed polyvinyl acetate having a degree of hydrolysis of preferably at least 60% and more preferably at least 80%, polyvinyl formal, polyvinyl butyral, polyvinylpyrrolidone, a homopolymer and a copolymer of acrylamide, a homopolymer and a copolymer of methacrylamide, and a homopolymer and a copolymer of N-methylol acrylamide.

The mass average molecular weight of the hydrophilic resin is preferably 2000 or greater from the viewpoint of obtaining sufficient coated-film hardness or printing durability.

The content of the hydrophilic resin is preferably in a range of 0.5% by mass to 50% by mass and more preferably in a range of 1% by mass to 30% by mass with respect to the total mass of the image recording layer.

The image recording layer may contain inorganic particles other than those for forming unevenness described above. Preferred examples of the inorganic particles include silica, alumina, magnesium oxide, titanium oxide, magnesium carbonate, calcium alginate, and a mixture of these. The inorganic particles can be used for the purpose of improving coated-film hardness.

The average particle diameter of the inorganic particles is preferably in a range of 5 nm to 10 mm and more preferably in a range of 10 nm to 1 mm. In a case where the average particle diameter thereof is in the above described range, the thermoplastic polymer particles are stably dispersed, the film hardness of the image recording layer is sufficiently held, and a non-image area with excellent hydrophilicity in which printing stain is unlikely to occur can be formed.

The inorganic particles are available as commercially available products such as a colloidal silica dispersion and the like.

The content of the inorganic particles is preferably in a range of 1.0% by mass to 70% by mass and more preferably in a range of 5.0% by mass to 50% by mass with respect to the total mass of the image recording layer.

The image recording layer may contain a plasticizer in order to provide flexibility for a coated film. Examples of the plasticizer include polyethylene glycol, tributyl citrate, diethyl phthalate, dibutyl phthalate, dihexyl phthalate, dioctyl phthalate, tricresyl phosphate, tributyl phosphate, trioctyl phosphate, and tetrahydrofurfuryl oleate.

The content of the plasticizer is preferably in a range of 0.1% by mass to 50% by mass and more preferably in a range of 1% by mass to 30% by mass with respect to the total mass of the image recording layer.

In a case where polymer particles having a thermally reactive functional group (crosslinking group) are used for the image recording layer, a compound that starts or promotes a reaction of the thermally reactive functional group (crosslinking group) can be added to the image recording layer as necessary. As the compound that starts or promotes the reaction of the thermally reactive functional group, a compound that generates a radical or a cation by being heated may be exemplified. Examples of the compound include a lophine dimer, a trihalomethyl compound, a peroxide, an azo compound, onium salts including diazonium salts and diphenyl iodonium salts, acyl phosphine, and imide sulfonate. The amount of the compound to be added to the image recording layer is preferably in a range of 1% by mass to 20% by mass and more preferably in a range of 1% by mass to 10% by mass with respect to the total mass of the image recording layer. In a case where the amount thereof is in the above-described range, the on-press developability is not degraded and excellent effects for starting or promoting a reaction are obtained.

(Formation of Image Recording Layer C)

The image recording layer C is formed by dissolving or dispersing each of the above-described required components in a suitable solvent to prepare a coating solution, coating a support with the coating solution directly or through an undercoat layer. As the solvent, water or a mixed solvent of water and an organic solvent is used, and a mixed solvent of water and an organic solvent is preferable from the viewpoint of the excellent surface state after coating. Since the amount of the organic solvent varies depending on the type of organic solvent, the amount thereof cannot be specified unconditionally, but the amount of the organic solvent in the mixed solvent is preferably in a range of 5% by volume to 50% by volume. Here, it is necessary that the amount of the organic solvent to be used is set such that the thermoplastic polymer particles are not aggregated. The concentration of solid contents of the coating solution for an image recording layer is preferably in a range of 1% by mass to 50% by mass.

As the organic solvent used as a solvent of the coating solution, a water-soluble organic solvent is preferable. Specific examples thereof include an alcohol solvent such as methanol, ethanol, propanol, isopropanol, or 1-methoxy-2-propanol, a ketone solvent such as acetone or methyl ethyl ketone, a glycol ether solvent such as ethylene glycol dimethyl ether, g-butyrolactone, N,N-dimethylformamide, N,N-dimethylacetamide, tetrahydrofuran, and dimethylsulfoxide. Particularly, an organic solvent having a boiling point of 120° C. or lower and a solubility (amount of a solvent to be dissolved in 100 g of water) of 10 g or greater in water is preferable and an organic solvent having a solubility of 20 g or greater is more preferable.

As a coating method of the coating solution for an image recording layer, various methods can be used. Examples of the methods include a bar coater coating method, a rotary coating method, a spray coating method, a curtain coating method, a dip coating method, an air knife coating method, a blade coating method, and a roll coating method. The coating amount (solid content) of the image recording layer on the support obtained after the coating and the drying varies depending on the purpose thereof, but is preferably in a range of 0.5 $g/m^2$ to 5.0 $g/m^2$ and more preferably in a range of 0.5 $g/m^2$ to 2.0 $g/m^2$.

Hereinafter, other constituent elements of the planographic printing plate precursor will be described.

<Undercoat Layer>

The planographic printing plate precursor according to the embodiment of the present invention may be provided with an undercoat layer between the image recording layer and the support as necessary. Since bonding of the support to the image recording layer is strengthened in the exposed portion and the image recording layer is allowed to be easily peeled off from the support in the unexposed portion, the undercoat layer contributes to improvement of the on-press developability without degrading the printing durability. Further, in a case of infrared laser exposure, the undercoat layer functions as a heat insulating layer so that a degradation in sensitivity due to heat, generated by exposure, being diffused in the support is prevented.

Examples of eth compound used for the undercoat layer include a silane coupling agent having an ethylenic double bond reaction group, which can be added and polymerized, described in JP1998-282679A (JP-H10-282679A); and a phosphorous compound having an ethylenic double bond reaction group described in JP1990-304441A (JP-H02-304441A). Preferred examples thereof include polymer compounds having an adsorptive group which can be adsorbed to the surface of the support, a hydrophilic group, and a crosslinking group, as described in JP2005-125749A and JP2006-188038A. As such a polymer compound, a copolymer of a monomer having an adsorptive group, a monomer having a hydrophilic group, and a monomer having a crosslinking group is preferable. Specific examples thereof include a copolymer of a monomer having an adsorptive group such as a phenolic hydroxy group, a carboxy group, $-PO_3H_2$, $-OPO_3H_2$, $-CONHSO_2-$, $-SO_2NHSO_2-$, or $-COCH_2COCH_3$, a monomer having a hydrophilic group such as a sulfo group, and a monomer having a polymerizable crosslinking group such as a methacryl group or an allyl group. The polymer compound may include a crosslinking group introduced by forming salts between a polar substituent of the polymer compound and a compound that includes a substituent having the opposite charge and an ethylenically unsaturated bond. Further, monomers other than the monomers described above, preferably hydrophilic monomers may be further copolymerized.

The content of the ethylenically unsaturated bond in the polymer compound for an undercoat layer is preferably in a range of 0.1 to 10.0 mmol and more preferably in a range of 2.0 to 5.5 mmol per 1 g of the polymer compound.

The mass average molecular weight of the polymer compound for an undercoat layer is preferably 5000 or greater and more preferably in a range of 10000 to 300000.

For the purpose of preventing stain over time, the undercoat layer may contain a chelating agent, a secondary or tertiary amine, a polymerization inhibitor, a compound that includes an amino group or a functional group having polymerization inhibiting ability and a group interacting with the surface of an aluminum support, and the like (for example, 1,4-diazabicyclo[2.2.2]octane (DABCO), 2,3,5,6-tetrahydroxy-p-quinone, chloranil, sulfophthalic acid, hydroxyethyl ethylene diamine triacetic acid, dihydroxyethyl ethylene diamine diacetic acid, or hydroxyethyliminodiacetic acid) in addition to the compounds for an undercoat layer described above.

The undercoat layer is applied according to a known method. The coating amount of the undercoat layer after being dried is preferably in a range of 0.1 mg/m$^2$ to 100 mg/m$^2$ and more preferably in a range of 1 mg/m$^2$ to 30 mg/m$^2$.

<Protective Layer>

The planographic printing plate precursor according to the embodiment of the present invention includes a protective layer at the upper side of the image recording layer. The protective layer has a function of suppressing a reaction of inhibiting image formation through oxygen blocking, a function of preventing generation of damage to the image recording layer, and a function of preventing ablation in a case of exposure to a high illuminance laser.

As the protective layer having such functions, a protective layer described in paragraphs 0202 to 0204 of JP2014-104631A can be used.

It is preferable that the protective layer contains a water-soluble polymer. Examples of the water-soluble polymer used in the protective layer include polyvinyl alcohol, modified polyvinyl alcohol, polyvinylpyrrolidone, a water-soluble cellulose derivative, polyethylene glycol, and poly(meth)acrylonitrile.

As the modified polyvinyl alcohol, acid-modified polyvinyl alcohol containing a carboxy group or a sulfo group is preferably used. Specific examples thereof include modified polyvinyl alcohol described in JP2005-250216A and JP2006-259137A.

Among the examples of the water-soluble polymer, polyvinyl alcohol is preferable, and polyvinyl alcohol having a saponification degree of 50% or greater is more preferable. The saponification degree of polyvinyl alcohol is preferably 60% or greater, more preferably 70% or greater, and still more preferably 85% or greater. The upper limit of the saponification degree is not particularly limited and may be 100% or less.

The saponification degree can be measured according to the method described in JIS K 6726:1994.

The protective layer is applied according to a known method.

The planographic printing plate precursor can be produced by applying a coating solution of each configuration layer according to a typical method, drying the coating solution, and forming each configuration layer. The coating solution can be applied according to a die coating method, a dip coating method, an air knife coating method, a curtain coating method, a roller coating method, a wire bar coating method, a gravure coating method, or a slide coating method.

Hereinafter, a key plate precursor which is another aspect of the planographic printing plate precursor according to the embodiment of the present invention will be described.

The key plate precursor is a precursor for preparing a key plate by performing the same plate-making step (here, image exposure is not required) as that for the planographic printing plate precursor, and the key plate precursor basically does not have photosensitivity. As is known in the printing industry, a key plate is used by being attached to a plate cylinder in a case where it is necessary to perform printing on a part of the paper surface in two colors or one color in color newspaper printing (multicolor printing).

[Key Plate Precursor]

The key plate precursor according to the present invention is a planographic printing plate precursor which includes an aluminum support, and a protective layer on the aluminum support, in which the thickness of the protective layer is 0.2 μm or greater, and Expression (1) is satisfied in a case where the Bekk smoothness of the surface of the outermost layer at the side where the protective layer is provided is denoted by A seconds.

$$A \leq 1000 \tag{1}$$

In regard to the protective layer in the key plate precursor according to the present invention, the description on the protective layer in the planographic printing plate precursor including the image recording layer can be applied.

The key plate precursor according to the present invention may include a non-photosensitive layer between the support and the protective layer. Here, the term "non-photosensitive" indicates that the key plate precursor does not substantially have photosensitivity with respect to light of a light source used in an image exposure step for a typical planographic printing plate precursor that is provided for the printing step together with the key plate precursor according to the present invention. The expression "does not substantially have photosensitivity" indicates that a polymerization reaction does not occur in a range where the key plate precursor is typically used.

Examples of the non-photosensitive layer include a non-photosensitive hydrophilic layer and a non-photosensitive resin layer.

The non-photosensitive hydrophilic layer contains a hydrophilic component. The hydrophilic component indicates a component which is capable of improving the hydrophilicity of the surface in a case of being present on the aluminum support as compared with a case where the component is not present on the aluminum support. Further, the hydrophilicity of the surface can be evaluated based on the contact angle according to a known aerial water drop method. Examples of the hydrophilic component include a compound containing an adsorptive group that can be adsorbed on the surface of the aluminum support. Preferred examples of the adsorptive group that can be adsorbed on the surface of the aluminum support include a phenolic hydroxy group, a carboxy group, —PO$_3$H$_2$, —OPO$_3$H$_2$, —CONHSO$_2$—, —SO$_2$NHSO$_2$—, and —COCH$_2$COCH$_3$. The compound containing an adsorptive group that can be adsorbed on the surface of the aluminum support may further contain a hydrophilic group. A sulfo group is preferable as the hydrophilic group. The compound containing an adsorptive group that can be adsorbed on the surface of the aluminum support may be a low-molecular-weight compound or a polymer compound. In a case where the compound is a polymer compound, a copolymer obtained from a monomer containing an adsorptive group that can be adsorbed on the surface of an aluminum support and a monomer containing a hydrophilic group is preferable.

Specific suitable examples of the compound containing an adsorptive group that can be adsorbed on the surface of the aluminum support include a silane coupling agent described in JP1998-282679A (JP-H10-282679) and a phosphorus compound described in JP1990-304441A (JP-H02-304441A). Further, an adsorptive group that can be adsorbed on a surface of an aluminum support and a low-molecular-weight compound or polymer compound containing a hydrophilic group, described in JP2005-238816A, JP2005-125749A, JP2006-239867A, and JP2006-215263A are also preferably used.

More preferred examples thereof include a polymer compound containing an adsorptive group that can be adsorbed on a surface of an aluminum support and a hydrophilic group, as described in JP2005-125749A and JP2006-188038A.

The content of the compound containing an adsorptive group that can be adsorbed on the surface of the aluminum support is preferably in a range of 0.01% to 100% by mass, more preferably in a range of 10% to 100% by mass, and still more preferably in a range of 30% to 100% by mass with respect to the solid content of the non-photosensitive hydrophilic layer.

As the hydrophilic component, a surfactant, a phosphoric acid compound, or the like can be used. Components other than the hydrophilic components which can be contained in the non-photosensitive hydrophilic layer, such as a surfactant, a phosphoric acid compound, and the like which can be used as the hydrophilic component, a method of forming the non-photosensitive hydrophilic layer, and the film thickness of the non-photosensitive hydrophilic layer are described, for example, in paragraphs [0021] to [0046] of JP2017-065184A.

The key plate precursor according to the present invention may further include a non-photosensitive resin layer between the non-photosensitive hydrophilic layer and the protective layer. In a case where the key plate precursor includes a non-photosensitive resin layer, an effect of improving the scratch resistance while handling the key plate precursor can be obtained.

The non-photosensitive resin layer is a layer which can be removed by at least one of acidic to alkaline dampening water or printing ink on the printing press.

The non-photosensitive resin layer contains a resin. The resin is mainly used for the purpose of improving the film hardness of the non-photosensitive resin layer. As the resin contained in the non-photosensitive resin layer, a known resin of the related art which is used as a binder polymer in an image recording layer of a typical planographic printing plate precursor can be used, and a resin having coated-film properties is preferable. Among examples thereof, an acrylic resin, a polyvinyl acetal resin, and a polyurethane resin are preferable.

Further, it is preferable that the resin contained in the non-photosensitive resin layer contains a hydrophilic group. The hydrophilic group contributes to imparting the on-press developability to the non-photosensitive resin layer.

Examples of the hydrophilic group include a hydroxy group, a carboxy group, an alkylene oxide structure, an amino group, an ammonium group, an amide group, a sulfo group, and a phosphoric acid group. Among these, an alkylene oxide structure having 1 to 9 alkylene oxide units with 2 or 3 carbon atoms is preferable. A monomer having a hydrophilic group may be copolymerized in order to provide a hydrophilic group for a binder polymer.

The mass average molecular weight (Mw) of the resin contained in the non-photosensitive resin layer is preferably 2000 or greater, more preferably 5000 or greater, and still more preferably in a range of 10000 to 300000.

The content of the resin contained in the non-photosensitive resin layer is appropriately in a range of 3% to 90% by mass, preferably in a range of 5% to 80% by mass, and more preferably in a range of 10% to 70% by mass with respect to the total solid content of the non-photosensitive resin layer.

Preferred examples of the resin contained in the non-photosensitive resin layer include a polymer compound having a polyoxyalkylene chain in a side chain. In a case where the non-photosensitive resin layer contains the polymer compound having a polyoxyalkylene chain in a side chain, the permeability of dampening water is promoted and the on-press developability is improved.

Preferred other examples of the polymer compound having a polyoxyalkylene chain in a side chain and the resin contained in the non-photosensitive resin layer, components other than the resin which can be contained in the non-photosensitive resin layer, such as a low-molecular-weight hydrophilic compound, a plasticizer, a polymer compound having a fine particle shape, and other components, a method of forming the non-photosensitive resin layer, and the film thickness of the non-photosensitive resin layer are described in paragraphs [0084] of JP2017-065184A.

In the key plate precursor according to the present invention, the arithmetic average height Sa of the surface of the outermost layer at the side where the protective layer is provided is preferably in a range of 0.3 µm to 20 µm. In this manner, as described in the planographic printing plate precursor including the image recording layer described above, the effect of preventing multiple plates from being fed is enhanced, and an excellent property of preventing scratches is obtained.

[Planographic Printing Plate Precursor Laminate]

It is preferable that a planographic printing plate precursor laminate according to the embodiment of the present invention is a laminate which is obtained by laminating a plurality of the planographic printing plate precursors according to the embodiment of the present invention, in which the outermost layer at the side where the image recording layer is provided and the outermost layer at the side opposite to the side where the image recording layer is provided are laminated to be directly brought into contact with each other.

In a case of the key plate precursor which is another embodiment of the planographic printing plate precursor according to the present invention, the laminate is a key plate precursor laminate obtained by laminating a plurality of key plate precursors, in which the outermost layer at the side where the protective layer is provided and the outermost layer at the side opposite to the side where the protective layer is provided are laminated to be directly brought into contact with each other.

Further, it is preferable that the planographic printing plate precursor laminate according to the embodiment of the present invention is a laminate obtained by laminating a plurality of planographic printing plate precursors according to the embodiment of the present invention without interposing interleaving paper therebetween.

The number of sheets of laminated precursors is not particularly limited, but is preferably in a range of 2 sheets to 500 sheets.

The planographic printing plate precursor laminate according to the embodiment of the present invention has an excellent property of preventing multiple plates from being fed and an excellent property of preventing scratches due to the characteristics of the planographic printing plate precursor according to the embodiment of the present invention and also has a characteristic that accumulation deviation is unlikely to occur.

[Plate-Making Method for Planographic Printing Plate and Planographic Printing Method]

A plate-making method for the planographic printing plate according to the embodiment of the present invention is not particularly limited as long as the method is a plate-making method for the planographic printing plate precursor according to the embodiment of the present invention, and it is preferable that the method includes a step of image-exposing the planographic printing plate precursor according to the embodiment of the present invention (also referred to as an "image exposure step"), and a step of supplying at least any one of printing ink or dampening water to remove an unexposed portion of the image recording layer on the printing press and preparing a planographic printing plate (also referred to as a "development treatment step").

The above-described plate-making method is also referred to as an "on-press development system" below.

A planographic printing method according to the embodiment of the present invention is a method of plate-making the planographic printing plate using the planographic printing plate precursor according to the embodiment of the present invention and performing printing, and it is preferable that the method includes a step of image-exposing the planographic printing plate precursor according to the embodiment of the present invention (also referred to as an "image exposure step"), a step of supplying at least any one of printing ink or dampening water to remove an unexposed portion of the image recording layer on the printing press to prepare a planographic printing plate (also referred to as a "development treatment step"), and a step of performing printing using the obtained planographic printing plate (also referred to as a "printing step").

Further, in the planographic printing plate precursor according to the embodiment of the present invention, the development treatment step is performed without performing the image exposure step in a case of the key plate precursor. In this case, it is preferable that the method includes a step of supplying at least any one of printing ink or dampening water to the key printing plate to remove the protective layer on the printing press to prepare a planographic printing plate, and a step of performing printing using the obtained planographic printing plate.

<Image Exposure Step>

The image exposure of the planographic printing plate precursor can be performed in conformity with an image exposure operation for a typical planographic printing plate precursor.

The image exposure is performed by laser exposure through a transparent original picture having a line image, a halftone image, and the like or by laser beam scanning using digital data. The wavelength of a light source is preferably in a range of 700 nm to 1400 nm. As the light source having a wavelength of 700 nm to 1400 nm, a solid-state laser or a semiconductor laser that radiates infrared rays is preferable. The output of the infrared laser is preferably 100 mW or greater, the exposure time per one pixel is preferably less than 20 microseconds, and the irradiation energy quantity is preferably in a range of 10 mJ/cm$^2$ to 300 mJ/cm$^2$. For the purpose of reducing the exposure time, it is preferable to use a multi-beam laser device. The exposure mechanism may be any of an internal drum system, an external drum system, and a flat bed system. The image exposure can be performed using a plate setter according to a usual method.

<Development Treatment Step>

The development treatment can be performed using a typical method. In a case of on-press development, a printing ink receiving portion having a lipophilic surface is formed by the image recording layer cured by light exposure in the exposed portion of the image recording layer in a case where at least any one of dampening water or printing ink is supplied to the image-exposed planographic printing plate precursor on a printing press. Meanwhile, in an unexposed portion, a non-cured image recording layer is dissolved or dispersed by supplied at least any one of dampening water or printing ink and then removed, a hydrophilic surface is exposed to the portion. As the result, dampening water is exposed and adheres to the hydrophilic surface, the printing ink is impressed on the image recording layer of the exposed region, and then the printing is started.

Here, either of dampening water or printing ink may be initially supplied to the surface of the planographic printing plate precursor, but it is preferable that dampening water is initially supplied thereto by infiltrating dampening water so that the on-press developability is promoted.

<Printing Step>

The printing using the obtained planographic printing plate can be performed according to a typical method. The printing can be performed by supplying desired printing ink and dampening water, as necessary, to the planographic printing plate.

The amount of the printing ink and dampening water to be supplied is not particularly limited and may be appropriately set according to the desired printing.

The method of supplying the printing ink and dampening water to the planographic printing plate is not particularly limited and a known method can be used.

Further, a planographic printing plate can be prepared from the planographic printing plate precursor according to the embodiment of the present invention even by performing a development treatment using a developer by appropriately selecting a binder polymer or the like serving as a constituent component of the image recording layer.

According to another embodiment of the plate-making method for the planographic printing plate according to the embodiment of the present invention, it is preferable that the method includes a step of image-exposing the planographic printing plate precursor according to the embodiment of the present invention (also referred to as an "image exposure step") and a development step of supplying a developer having a pH of 2 to 14 to remove the unexposed portion (also referred to as a "developer development step").

The plate-making method is also referred to as a "developer treatment system".

According to another embodiment of the planographic printing method of the present invention, the method is a method of plate-making for a planographic printing plate using the planographic printing plate precursor according to the embodiment of the present invention and performing printing, and it is preferable that the method includes a step of image-exposing the planographic printing plate precursor according to the embodiment of the present invention (also referred to as an "image exposure step"), a development step of supplying a developer having a pH of 2 to 14 to remove the unexposed portion (also referred to as a "developer development step"), and a step of performing printing using the obtained planographic printing plate (hereinafter, also referred to as a "printing step").

<Image Exposure Step>

The image exposure step in the developer treatment system is the same as the image exposure step in the on-press development system described above.

<Developer Development Step>

Further, a planographic printing plate can be prepared from the planographic printing plate precursor according to the embodiment of the present invention even by performing a development treatment using a developer by appropriately selecting a binder polymer or the like serving as a constituent component of the image recording layer. The development treatment using a developer includes a step of supplying a developer having a pH of 2 to 12 to remove an unexposed portion of the image recording layer (also referred to as a simple development treatment). The developer having a pH of 2 to 12 may contain at least one compound selected from the group consisting of a surfactant and a water-soluble polymer compound.

Further, the embodiment that includes the step of supplying a developer having a pH of 2 to 10 to remove an unexposed portion of the image recording layer but does not include a water washing step after the unexposed portion removal step is also a preferred embodiment of the simple development treatment.

The development treatment and a gum liquid treatment step can be simultaneously performed using a method of allowing a developer to contain a water-soluble polymer compound as necessary.

Accordingly, a post-water washing step is not particularly required, and a drying step can be performed after the development treatment and the gum liquid treatment are performed using one liquid in one step. Therefore, it is preferable that the development treatment using a developer is performed according to the method of preparing a planographic printing plate, including a step of performing a development treatment on the image-exposed planographic printing plate precursor using a developer having a pH of 2 to 12. After the development treatment, it is preferable that the drying is performed after the excessive developer is removed using a squeeze roller.

That is, in the development step of the method of preparing a planographic printing plate according to the present invention, it is preferable that the development treatment and the gum liquid treatment are performed using one liquid in one step.

The expression "the development treatment and the gum liquid treatment are performed using one liquid and one step" means that the development treatment and the gum liquid treatment are performed in one step using one liquid without separately performing the development treatment and the gum liquid treatment as individual steps.

The development treatment can be suitably performed using an automatic development treatment device provided with developer supply means and a rubbing member. As the rubbing member, an automatic development treatment device provided with a rotary brush roll is particularly preferable.

It is preferable that two or more rotary brush rolls are used. Further, it is preferable that an automatic development treatment device includes means for removing the excessive developer, such as a squeeze roller, and drying means such as a hot air device on the rear side of the development treatment means. Further, the automatic development treatment device may include pre-heating means for performing a heating treatment on the image-exposed planographic printing plate precursor on the front side of the development treatment means.

The treatment carried out using such an automatic development treatment device has an advantage that it is no longer necessary to deal with development scum derived from an image recording layer (a protective layer in a case where the planographic printing plate precursor has a protective layer) which is generated in a case of a so-called on-press development treatment.

In a case where the development is carried out by performing a treatment manually, a method of allowing sponge or absorbent cotton to contain an aqueous solution, performing treatment while rubbing the entire plate surface, and drying the aqueous solution after the treatment is completed is suitably exemplified as the development treatment method. In a case of an immersion treatment, for example, a method of immersing the planographic printing plate precursor in a tray, a deep tank, or the like containing an aqueous solution therein for approximately 60 seconds, stirring the solution, and drying the aqueous solution while rubbing the plate surface with absorbent cotton or sponge is suitably exemplified.

It is preferable that a device capable of simplifying the structure and the steps is used in the development treatment.

For example, in the alkali development treatment, a protective layer is removed by the pre-water washing step, development is performed using an alkali developer having a high pH, an alkali is removed by the post-water washing step, the gum treatment is performed by a gum coating step, and drying is performed by a drying step. In the simple development treatment, development and gum coating can be simultaneously performed using one liquid. Therefore, the post-water washing step and the gum treatment step can be omitted, and it is preferable that the drying step is performed as necessary after development and gum coating (gum liquid treatment) are performed using one liquid.

Further, it is preferable that removal of the protective layer, development, and gum coating are simultaneously performed using one liquid without performing the pre-water washing step. Further, it is preferable that the excessive developer is removed using a squeeze roller after the development and the gum coating and then drying is performed.

The development treatment may be performed according to a method of performing immersion in a developer once or a method of performing immersion twice or more times. Among these, a method of performing immersion in the developer once or twice is preferable.

The immersion may be carried out by passing the exposed planographic printing plate precursor through a developer tank in which the developer is stored or spraying the developer onto the plate surface of the exposed planographic printing plate precursor using a spray or the like.

Further, the development treatment is performed using one liquid (one liquid treatment) even in a case where the planographic printing plate precursor is immersed in the developer twice or more times or in a case where the planographic printing plate precursor is immersed, twice or more times, in the same developer as described above or a developer (fatigue liquid) obtained by dissolving or dispersing components of the image recording layer using the developer and the development treatment.

In the development treatment, it is preferable to use a rubbing member and also preferable that a rubbing member such as a brush is installed in a developing bath which removes a non-image area of the image recording layer.

The development treatment can be performed by immersing the planographic printing plate precursor which has been subjected to the exposure treatment and rubbing the plate surface with brushes or pumping up the treatment liquid added to an external tank using a pump, spraying the developer from a spray nozzle, and rubbing the plate surface with brushes at a temperature of preferably 0° C. to 60° C. and more preferably 15° C. to 40° C., according to a conventional method. These development treatments can be continuously performed plural times. For example, the development treatment can be performed by pumping up the developer added to an external tank using a pump, spraying the developer from a spray nozzle, rubbing the plate surface with brushes, spraying the developer from the spray nozzle again, and rubbing the plate surface with the brushes. In a case where the development treatment is performed using an automatic development treatment device, since the developer is fatigued as the treatment amount increases, it is preferable that the treatment capability is recovered using a replenisher or a fresh developer.

In the development treatment, an automatic development treatment device and a gum coater known for a presensitized (PS) plate and computer to plate (CTP) in the related art can also be used. In a case where an automatic development treatment device is used, for example, any system from among a system of performing the treatment by pumping the developer added to a developer tank or the developer added to an external tank using a pump and spraying the developer from a spray nozzle, a system of performing the treatment by immersing a printing plate in a tank filled with the developer and transporting the printing plate using a guide roller in the developer, and a so-called disposable treatment system, which is a system of performing the treatment by supplying the substantially unused developer by an amount required for each plate can be employed. In all systems, it is preferable that a rubbing mechanism using brushes or a molleton is provided. For example, commercially available automatic development treatment devices (Clean Out Unit C85/C125, Clean-Out Unit+C85/120, FCF 85V, FCF 125V, FCF News (manufactured by Glunz & Jensen); and Azura CX85, Azura CX125, and Azura CX150 (manufactured by AGFA GRAPHICS) can be used. In addition, a device in which a laser exposure portion and an automatic development treatment device portion are integrally incorporated can also be used.

The components and the like of the developer used for the development step will be described in detail.

—pH—

The pH of the developer is preferably in a range of 2 to 12, more preferably in a range of 5 to 9, and still more preferably in a range of 7 to 9. From the viewpoints of the developability and the dispersibility of the image recording layer, it is advantageous that the value of the pH is set to be higher. However, from the viewpoints of the printability and suppression of stain, it is effective that the value of the pH is set to be low.

Here, the pH is a value obtained by performing measurement at 25° C. using a pH meter (model number: HM-31, manufactured by DKK-TOA Corporation).

—Surfactant—

The developer may contain a surfactant such as an anionic surfactant, a non-ionic surfactant, a cationic surfactant, or an amphoteric surfactant.

From the viewpoint of blanket stain properties, it is preferable that the developer contains at least one selected from the group consisting of an anionic surfactant and an amphoteric surfactant.

Further, it is preferable that the developer contains a non-ionic surfactant and more preferable that the developer contains at least one selected from the group consisting of a non-ionic surfactant, an anionic surfactant, and an amphoteric surfactant.

Preferred examples of the anionic surfactant include compounds represented by Formula (I).

$$R^1—Y^1—X^1 \qquad (I)$$

In Formula (I), $R^1$ represents an alkyl group, a cycloalkyl group, an alkenyl group, an aralkyl group, or an aryl group which may have a substituent.

As the alkyl group, an alkyl group having 1 to 20 carbon atoms is preferable, and preferred specific examples thereof include a methyl group, an ethyl group, a propyl group, an n-butyl group, a sec-butyl group, a hexyl group, a 2-ethylhexyl group, an octyl group, a decyl group, a dodecyl group, a hexadecyl group, and a stearyl group.

The cycloalkyl group may be monocyclic or polycyclic. As the monocyclic cycloalkyl group, a monocyclic cycloalkyl group having 3 to 8 carbon atoms is preferable, and a cyclopropyl group, a cyclopentyl group, a cyclohexyl group, or a cyclooctyl group is more preferable. Preferred examples of the polycyclic cycloalkyl group include an adamantyl group, a norbornyl group, an isobornyl group, a camphanyl group, a dicyclopentyl group, an α-pinel group, and a tricyclodecanyl group.

As the alkenyl group, for example, an alkenyl group having 2 to 20 carbon atoms is preferable, and preferred specific examples thereof include a vinyl group, an allyl group, a butenyl group, and a cyclohexenyl group.

As the aralkyl group, for example, an aralkyl group having 7 to 12 carbon atoms is preferable, and preferred specific examples thereof include a benzyl group, a phenethyl group, and a naphthylmethyl group.

As the aryl group, for example, an aryl group having 6 to 15 carbon atoms is preferable, and preferred specific examples thereof include a phenyl group, a tolyl group, a dimethylphenyl group, a 2,4,6-trimethylphenyl group, a naphthyl group, an anthryl group, and a 9,10-dimethoxyanthryl group.

As the substituent, a monovalent nonmetallic atom group excluding a hydrogen atom is used, and preferred examples thereof include a halogen atom (F, Cl, Br, or I), a hydroxy group, an alkoxy group, an aryloxy group, an acyl group, an amide group, an ester group, an acyloxy group, a carboxy group, a carboxylic acid anion group, and a sulfonic acid anion group.

As specific examples of the alkoxy group in the substituent, a methoxy group, an ethoxy group, a propyloxy group, an isopropyloxy group, a butyloxy group, a pentyloxy group, a hexyloxy group, a dodecyloxy group, a stearyloxy group, a methoxyethoxy group, a poly(ethyleneoxy) group, and a poly(propyleneoxy) group, respectively having 1 to 40 carbon atoms, are preferable; and these groups respectively having 1 to 20 carbon atoms are more preferable. Examples of the aryloxy group include a phenoxy group, a tolyloxy group, a xylyloxy group, a mesityloxy group, a cumenyloxy group, a methoxyphenyloxy group, an ethoxyphenyloxy group, a chlorophenyloxy group, a bromophenyloxy group, and a naphthyloxy group, respectively having 6 to 18 carbon atoms. Examples of the acyl group include an acetyl group, a propanoyl group, a butanoyl group, a benzoyl group, and a naphthoyl group, respectively having 2 to 24 carbon atoms. Examples of the amide group include an acetamide group, a propionic acid amide group, a dodecanoic acid amide group, a palmitic acid amide group, a stearic acid amide group, a benzoic acid amide group, and a naphthoic acid amide group, respectively having 2 to 24 carbon atoms. Examples of the acyloxy group include an acetoxy group, a propanoyloxy group, a benzoyloxy group, and a naphthoyloxy group, respectively having 2 to 20 carbon atoms. Examples of the ester group include a methyl ester group, an ethyl ester group, a propyl ester group, a hexyl ester group, an octyl ester group, a dodecyl ester group, and a stearyl ester group, respectively having 1 to 24 carbon atoms. The substituent may be formed by combining two or more substituents described above.

$X^1$ represents a sulfonate group, a sulfate monoester group, a carboxylate group, or a phosphate group.

$Y^1$ represents a single bond, $-CH_2H_{2n}-$, $-C_{n-m}H_{2(n-m)}OC_mH_{2m}-$, $-O-(CH_2CH_2O)_n-$, $-O-(CH_2CH_2CH_2O)_n-$, $-CO-NH-$, or a divalent linking group formed by combining two or more of these and satisfies the expressions of "$n^3 1$" and "$n^3 m^3 0$".

Among examples of the compound represented by Formula (I), from the viewpoint of scratch and stain resistance, a compound represented by Formula (I-A) or Formula (I-B) is preferable.

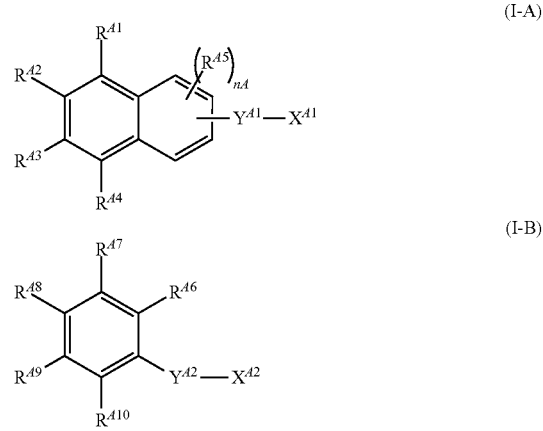

In Formulae (I-A) and (I-B), $R^{41}$ to $R^{410}$ each independently represent a hydrogen atom or an alkyl group, nA represents an integer of 1 to 3, $X^{41}$ and $X^{42}$ each independently represent a sulfonate group, a sulfate monoester group, a carboxylate group, or a phosphate group, and $Y^{41}$ and $Y^{42}$ each independently represent a single bond, $-C_nH_{2n}-$, $-C_{n-m}H_{2(n-m)}OC_mH_{2m}-$, $-O-(CH_2CH_2O)_n-$, $-O-(CH_2CH_2CH_2O)_n-$, $-CO-NH-$, or a divalent linking group formed by combining two or more of these and satisfy the inequations of "n≥1" and "n≥m≥0". The total number of carbon atoms in $R^{41}$ to $R^{45}$ or $R^{46}$ to $R^{410}$ and $Y^{41}$ and $Y^{42}$ is 3 or greater.

The total number of carbon atoms in $R^{41}$ to $R^{45}$ and $Y^{14}$ or $R^{46}$ to $R^{410}$ and $Y^{42}$ in the compound represented by Formula (I-A) or (I-B) is preferably 25 or less and more preferably in a range of 4 to 20. The structure of the above-described alkyl group may be linear or branched.

It is preferable that $X^{41}$ and $X^{42}$ in the compound represented by Formula (I-A) or (I-B) represent a sulfonate group or a carboxylate group. Further, the salt structure in $X^{41}$ and $X^{42}$ is preferable from the viewpoint that the solubility of the alkali metal salt in a water-based solvent is particularly excellent. Among the salt structures, a sodium salt or a potassium salt is particularly preferable.

As the compound represented by Formula (I-A) or (I-B), the description in paragraphs 0019 to 0037 of JP2007-206348A can be referred to.

As the anionic surfactant, the compounds described in paragraphs 0023 to 0028 of JP2006-065321A can be suitably used.

The amphoteric surfactant used for the developer is not particularly limited, and examples thereof include an amine oxide-based surfactant such as alkyl dimethylamine oxide; a betaine-based surfactant such as alkyl betaine, fatty acid amide propyl betaine, or alkyl imidazole; and an amino acid-based surfactant such as sodium alkylamino fatty acid.

Particularly, alkyl dimethylamine oxide which may have a substituent, alkyl carboxy betaine which may have a substituent, or alkyl sulfobetaine which may have a substituent is preferably used. Specific examples of these include compounds represented by Formula (2) in paragraph 0256 of JP2008-203359A, compounds represented by Formulae (I), (II), and (VI) in paragraph 0028 of JP2008-276166A, and compounds described in paragraphs 0022 to 0029 of JP2009-047927A.

As the amphoteric ion-based surfactant used for the developer, a compound represented by formula (1) or a compound represented by Formula (2) is preferable.

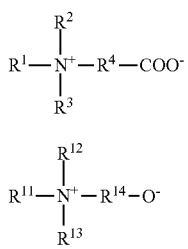

(1)

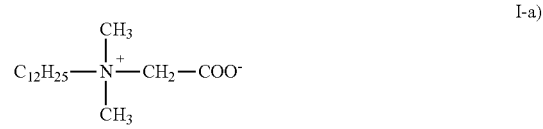
(Formula 2 shown above as part of header area)

In Formulae (1) and (2), $R^1$ and $R^{11}$ each independently represent an alkyl group having 8 to 20 carbon atoms or an alkyl group that contains a linking group having 8 to 20 carbon atoms.

$R^2$, $R^3$, $R^{12}$, and $R^{13}$ each independently represent a hydrogen atom, an alkyl group, or a group containing an ethylene oxide structure.

$R^4$ and $R^{14}$ each independently represent a single bond or an alkylene group.

Further, two groups from among $R^1$, $R^2$, $R^3$, and $R^4$ may be bonded to each other to form a ring structure, and two groups from among $R^{11}$, $R^{12}$, $R^{13}$, and $R^{14}$ may be bonded to each other to form a ring structure.

In the compound represented by Formula (1) or the compound represented by Formula (2), the size of the hydrophobic portion increases as the total number of carbon atoms increases, and the solubility in a water-based developer is decreased. In this case, the solubility is improved by mixing an organic solvent such as alcohol that assists dissolution with water as a dissolution assistant, but the surfactant cannot be dissolved within a proper mixing range in a case where the total number of carbon atoms is extremely large. Accordingly, the total number of carbon atoms of $R^1$ to $R^4$ or $R^{11}$ to $R^{14}$ is preferably in a range of 10 to 40 and more preferably in a range of 12 to 30.

The alkyl group containing a linking group represented by $R^1$ or $R^{11}$ has a structure in which a linking group is present between alkyl groups. In other words, in a case where one linking group is present, the structure can be represented by "-alkylene group-linking group-alkyl group". Examples of the linking group include an ester bond, a carbonyl bond, and an amide bond. The structure may have two or more linking groups, but it is preferable that the structure has one linking group, and an amide bond is particularly preferable as the linking group. The total number of carbon atoms of the alkylene group bonded to the linking group is preferably in a range of 1 to 5. The alkylene group may be linear or branched, but a linear alkylene group is preferable. The number of carbon atoms of the alkyl group bonded to the linking group is preferably in a range of 3 to 19, and the alkyl group may be linear or branched, but a linear alkyl group is preferable.

In a case where $R^2$ or $R^{12}$ represents an alkyl group, the number of carbon atoms thereof is preferably in a range of 1 to 5 and particularly preferably in a range of 1 to 3. The alkyl group may be linear or branched, but a linear alkyl group is preferable.

In a case where $R^3$ or $R^{13}$ represents an alkyl group, the number of carbon atoms thereof is preferably in a range of 1 to 5 and particularly preferably in a range of 1 to 3. The alkyl group may be linear or branched, but a linear alkyl group is preferable.

As the group containing an ethylene oxide structure represented by $R^3$ or $R^{13}$, a group represented by $-R^a-$ $(CH_2CH_2O)_n R^b$ is exemplified. Here, $R^a$ represents a single bond, an oxygen atom, or a divalent organic group (preferably having 10 or less carbon atoms), $R^b$ represents a hydrogen atom or an organic group (preferably having 10 or less carbon atoms), and n represents an integer of 1 to 10.

In a case where $R^4$ and $R^{14}$ represents an alkylene group, the number of carbon atoms thereof is preferably in a range of 1 to 5 and particularly preferably in a range of 1 to 3. The alkylene group may be linear or branched, but a linear alkylene group is preferable.

The compound represented by Formula (1) or the compound represented by Formula (2) has preferably an amide bond and more preferably an amide bond as a linking group represented by $R^1$ or $R^{11}$.

Representative examples of the compound represented by Formula (1) or the compound represented by Formula (2) are as follows, but the present invention is not limited thereto.

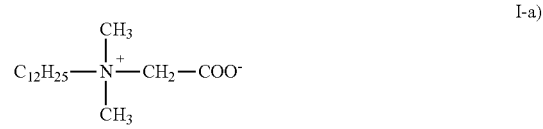

I-a)

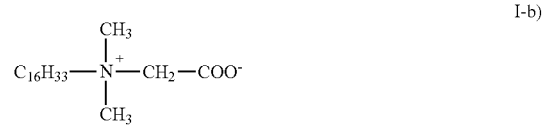

I-b)

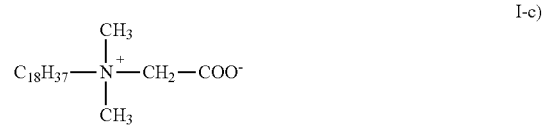

I-c)

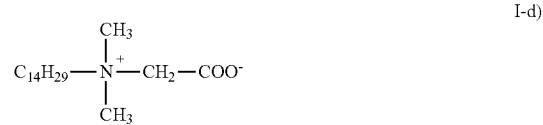

I-d)

I-e)

I-f)

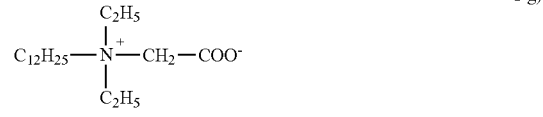

I-g)

I-h)

I-i)

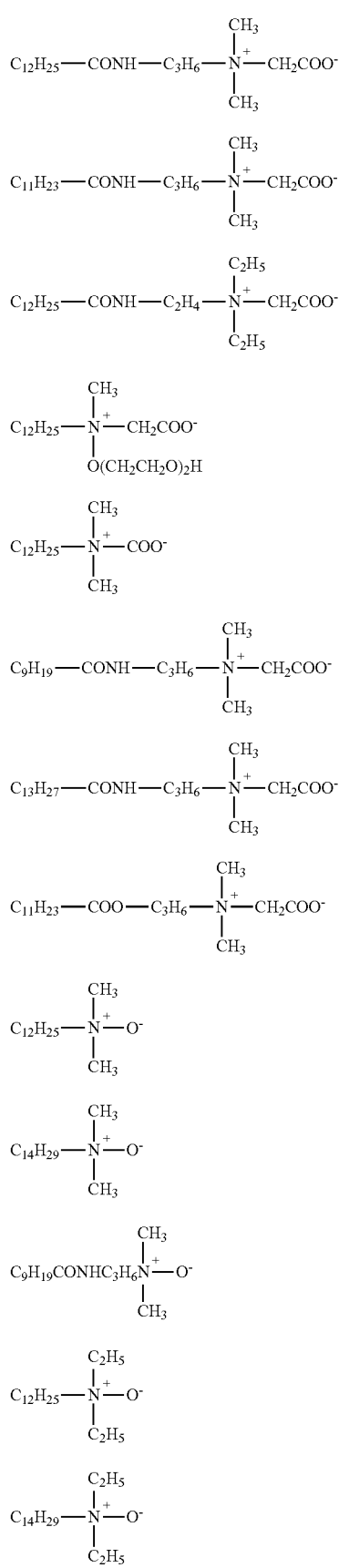

I-j)

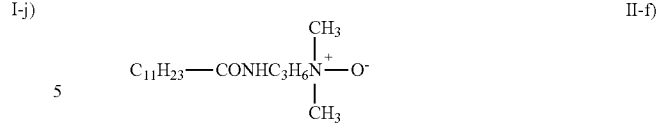

I-k)

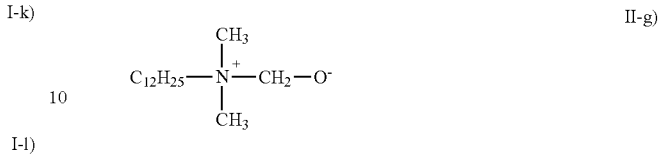

I-l)

The compound represented by Formula (1) or (2) can be synthesized according to a known method. Further, commercially available products may be used. Examples of the commercially available products of the compound represented by Formula (1) include SOFRAZOLINE LPB, SOFTAZOLINE LPB-R, and VISTA MAP (manufactured by Kawaken Fine Chemicals Co., Ltd.), and TAKESAAF C-157L (manufactured by TAKEMOTO OIL & FAT Co., Ltd.). Examples of the commercially available products of the compound represented by Formula (2) include SOFTAZOLINE LAO (manufactured by Kawaken Fine Chemicals Co., Ltd.) and AMOGEN AOL (manufactured by DKS Co., Ltd.).

The amphoteric ion-based surfactant may be used alone or in combination of two or more kinds thereof in a developer.

Examples of non-ionic surfactant include polyoxyethylene alkyl ethers, polyoxyethylene alkyl phenyl ethers, polyoxyethylene polystyryl phenyl ether, glycerin fatty acid partial esters, sorbitan fatty acid partial esters, pentaerythritol fatty acid partial esters, propylene glycol monofatty acid ester, sucrose fatty acid partial ester, polyoxyethylene sorbitan fatty acid partial esters, polyoxyethylene sorbitol fatty acid partial esters, polyethylene glycol fatty acid esters, polyglycerin fatty acid partial esters, polyoxyethylene glycerin fatty acid partial esters, polyoxyethylene diglycerins, fatty acid diethanolamides, N,N-bis-2-hydroxyalkylamines, polyoxyethylene alkylamine, triethanolamine fatty acid ester, trialkylamine oxide, polyoxyethylene alkyl phenyl ethers, and polyoxyethylene-polyoxypropyleneblockcopolymers.

Further, acetylene glycol-based and acetylene alcohol-based oxyethylene adducts, and fluorine-based surfactants can also be used. These surfactants can be used in combination of two or more kinds thereof.

Particularly preferred examples of the non-ionic surfactant include a non-ionic aromatic ether-based surfactant represented by Formula (N1).

$$X^N—Y^N—O\text{-}(A^1)_{nB}\text{-}(A^2)_{mB}\text{-}H \qquad (N1)$$

In the formula, $X^N$ represents an aromatic group which may have a substituent, $Y^N$ represents a single bond or an alkylene group having 1 to 10 carbon atoms, $A^1$ and $A^2$ are different groups and represent any of —CH$_2$CH$_2$O— or —CH$_2$CH(CH$_3$)O—, nB and mB each independently represent an integer of 0 to 100, where both nB and mB do not represent 0 at the same time. Further, both nB and mB do not represent 1 at the same time in a case where any of nB or mB represents 0.

In the formula, examples of the aromatic group as $X^N$ include a phenyl group, a naphthyl group, and an anthranyl group. These aromatic groups may have a substituent. As the substituent, an organic group having 1 to 100 carbon atoms is exemplified. Further, in the formula, the copolymer may be a random or block copolymer in a case where both A and B are present.

Specific examples of the organic group having 1 to 100 carbon atoms include aliphatic hydrocarbon groups and aromatic hydrocarbon groups, which may be saturated or unsaturated and linear or branched, such as an alkyl group, an alkenyl group, an alkynyl group, an aryl group, an aralkyl group, an alkoxy group, an aryloxy group, a N-alkylamino group, a N,N-dialkylamino group, a N-arylamino group, a N,N-diarylamino group, a N-alkyl-N-arylamino group, an acyloxy group, a carbamoyloxy group, a N-alkylcarbamoyloxy group, a N-arylcarbamoyloxy group, a N,N-dialkylcarbamoyloxy group, a N,N-diarylcarbamoyloxy group, a N-alkyl-N-arylcarbamoyloxy group, an acylamino group, a N-alkylacylamino group, a N-arylacylamino group, an acyl group, an alkoxycarbonylamino group, an alkoxycarbonyl group, an aryloxycarbonyl group, a carbamoyl group, a N-alkylcarbamoyl group, a N,N-dialkylcarbamoyl group, a N-arylcarbamoyl group, a N,N-diarylcarbamoyl group, a N-alkyl-N-arylcarbamoyl group, a polyoxyalkylene chain, and the above-described organic group to which a polyoxyalkylene chain is bonded. The alkyl group may be linear or branched.

Further, as the non-ionic surfactants, compounds described in paragraphs 0030 to 0040 of JP2006-065321A can also be suitably used.

The cationic surfactant is not particularly limited, and known surfactants of the related art can be used. Examples thereof include alkylamine salts, quaternary ammonium salts, alkylimidazolinium salts, polyoxyethylene alkylamine salts, and a polyethylene polyamine derivative.

The surfactant may be used alone or in combination of two or more kinds thereof.

The content of the surfactant is preferably in a range of 1% by mass to 25% by mass, more preferably in a range of 2% by mass to 20% by mass, still more preferably in a range of 3% by mass to 15% by mass, and particularly preferably in a range of 5% by mass to 10% by mass with respect to the total mass of the developer. In a case where the content thereof is in the above-described range, the scratch and stain resistance is excellent, the dispersibility of the development scum is excellent, and the ink impressing property of the planographic printing plate to be obtained is excellent.

—Water-Soluble Polymer Compound—

From the viewpoints of adjusting the viscosity of the developer and protecting the plate surface of the planographic printing plate to be obtained, the developer may contain a water-soluble polymer compound.

Examples of the water-soluble polymer compound which can be contained in the developer include soybean polysaccharides, modified starch, arabic gum, dextrin, a fiber derivative (such as carboxymethyl cellulose, carboxyethyl cellulose, or methyl cellulose) and a modified product thereof, pullulan, polyvinyl alcohol and a derivative thereof, polyvinylpyrrolidone, polyacrylamide and an acrylamide copolymer, a vinyl methyl ether/maleic anhydride copolymer, a vinyl acetate/maleic anhydride copolymer, and a styrene/maleic anhydride copolymer.

As the soybean polysaccharides, those which have been known in the related art can be used. For example, SOYAFIBE (trade name, manufactured by FUJI OIL, CO., LTD.) can be used as a commercially available product, and various grades of products can be used. Preferred examples thereof include products in which the viscosity of a 10 mass % aqueous solution is in a range of 10 mPa·s to 100 mPa·s.

As the modified starch, starch represented by Formula (III) is preferable. Any of starch such as corn, potato, tapioca, rice, or wheat can be used as the starch represented by Formula (III). The modification of the starch can be performed according to a method of decomposing 5 to 30 glucose residues per one molecule with an acid or an enzyme and adding oxypropylene to an alkali.

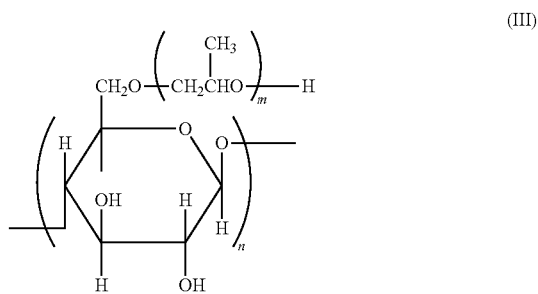

In the formula, the etherification degree (degree of substitution) is in a range of 0.05 to 1.2 per glucose unit, n represents an integer of 3 to 30, and m represents an integer of 1 to 3.

Among the examples of the water-soluble polymer compound, soybean polysaccharides, modified starch, arabic gum, dextrin, carboxymethyl cellulose, and polyvinyl alcohol are particularly preferable.

The water-soluble polymer compound can be used in combination of two or more kinds thereof.

In a case where the developer contains a water-soluble polymer compound, the content of the water-soluble polymer compound is preferably 3% by mass or less and more preferably 1% by mass or less with respect to the total mass of the developer. In a case where the content thereof is in the above-described range, the viscosity of the developer is moderate, and deposition of development scum and the like on a roller member of an automatic development treatment device can be suppressed.

—Other Additives—

The developer used in the present invention may contain a wetting agent, a preservative, a chelate compound, an antifoaming agent, an organic acid, an organic solvent, an inorganic acid, and an inorganic salt in addition to those described above.

Suitable examples of the wetting agent include ethylene glycol, propylene glycol, triethylene glycol, butylene glycol, hexylene glycol, diethylene glycol, dipropylene glycol, glycerin, trimethylolpropane, and diglycerin. The wetting agent may be used alone or in combination of two or more kinds thereof. The content of the wetting agent is preferably in a range of 0.1% by mass to 5% by mass with respect to the total mass of the developer.

Preferred examples of the preservative include phenol and a derivative thereof, formalin, an imidazole derivative, a sodium dehydroacetate, 4-isothiazoline-3-one derivative, benzoisothiazolin-3-one, 2-methyl-4-isothiazolin-3-one, a benzotriazole derivative, an amidine guanidine derivative, derivatives of quaternary ammonium salts, pyridine, quinoline, and guanidine, diazine, a triazole derivative, oxazole, an oxazole derivative, nitrobromo alcohol-based 2-bromo-2-nitropropane-1,3-diol, 1,1-dibromo-1-nitro-2-ethanol, and 1,1-dibromo-1-nitro-2-propanol.

The amount of the preservative to be added is an amount of stably exhibiting the efficacy for bacteria, molds, yeasts, or the like, and is preferably in a range of 0.01% by mass to 4% by mass with respect to the total mass of the developer even though the amount thereof varies depending on the type of bacteria, molds, and the yeasts. Further, it is preferable that the preservative is used in combination of two or more kinds thereof so as to be effective for sterilizing various molds.

Examples of the chelate compound include ethylenediamine tetraacetic acid, a potassium salt thereof, and a sodium salt thereof; diethylenetriamine pentaacetic acid, a potassium salt thereof, and a sodium salt thereof, triethylenetetraminehexaacetic acid, a potassium salt thereof, and a sodium salt thereof; hydroxyethylethylenediamine triacetic acid, a potassium salt thereof, and a sodium salt thereof; nitrilotriacetic acid and a sodium salt thereof, and organic phosphonic acids such as 1-hydroxyethane-1,1-diphosphonic acid, a potassium salt thereof, and a sodium salt thereof; and aminotri(methylenephosphonic acid), a potassium salt, and a sodium salt thereof. A salt of an organic amine is effectively used in place of a sodium salt or a potassium salt of a chelating agent.

A chelating agent which is stably present in the composition of the treatment liquid and does not disturb the printability is preferable as the chelating agent. The content of the chelating agent is preferably in a range of 0.001% by mass to 1.0% by mass with respect to the total mass of the developer.

As the antifoaming agent, a typical silicone-based self-emulsifying type agent, an emulsifying type agent, or a nonionic compound in which the hydrophilic-lipophilic balance (HLB) is 5 or less can be used. A silicone antifoaming agent is preferable.

Further, a silicone-based surfactant is regarded as an antifoaming agent.

The content of the antifoaming agent is suitably in a range of 0.001% by mass to 1.0% by mass with respect to the total mass of the developer.

Examples of the organic acid include citric acid, acetic acid, oxalic acid, malonic acid, salicylic acid, caprylic acid, tartaric acid, malic acid, lactic acid, levulinic acid, p-toluenesulfonic acid, xylenesulfonic acid, phytic acid, and organic phosphonic acid. The organic acid can be used in the form of an alkali metal salt or ammonium salt thereof. The content of the organic acid is preferably in a range of 0.01% by mass to 0.5% by mass with respect to the total mass of the developer.

Examples of the organic solvent include aliphatic hydrocarbons (hexane, heptane, "ISOPAR E, H, G" (manufactured by Exxon Chemical Japan Ltd.), and the like), aromatic hydrocarbons (toluene, xylene, and the like), halogenated hydrocarbon (methylene dichloride, ethylene dichloride, trichlene, monochlorobenzene, or the like), and a polar solvent.

Examples of the polar solvent include alcohols (such as methanol, ethanol, propanol, isopropanol, benzyl alcohol, ethylene glycol monomethyl ether, 2-ethoxyethanol, diethylene glycol monoethyl ether, diethylene glycol monohexyl ether, triethylene glycol monomethyl ether, propylene glycol monoethyl ether, propylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, methyl phenyl carbinol, n-amyl alcohol, and methyl amyl alcohol), ketones (such as acetone, methyl ethyl ketone, ethyl butyl ketone, methyl isobutyl ketone, and cyclohexanone), esters (such as ethyl acetate, propyl acetate, butyl acetate, amyl acetate, benzyl acetate, methyl lactate, butyl lactate, ethylene glycol monobutyl acetate, propylene glycol monomethyl ether acetate, diethylene glycol acetate, diethyl phthalate, and butyl levulinate), and others (such as triethyl phosphate, tricresyl phosphate, N-phenylethanolamine, and N-phenyldiethanolamine).

In a case where the organic solvent is insoluble in water, the organic solvent can be used by being solubilized in water using a surfactant or the like. In a case where the developer contains an organic solvent, from the viewpoints of safety and inflammability the concentration of the solvent in the developer is preferably less than 40% by mass.

Examples the inorganic acid and inorganic salt include phosphoric acid, metaphosphoric acid, primary ammonium phosphate, secondary ammonium phosphate, primary sodium phosphate, secondary sodium phosphate, primary potassium phosphate, secondary potassium phosphate, sodium tripolyphosphate, potassium pyrophosphate, sodium hexametaphosphate, magnesium nitrate, sodium nitrate, potassium nitrate, ammonium nitrate, sodium sulfate, potassium sulfate, ammonium sulfate, sodium sulfite, ammonium sulfite, sodium hydrogen sulfate, and nickel sulfate. The content of the inorganic salt is preferably in a range of 0.01% by mass to 0.5% by mass with respect to the total mass of the developer.

The developer is prepared by dissolving or dispersing each of the above-described components in water as necessary. The concentration of solid contents in the developer is preferably in a range of 2% by mass to 25% by mass. The developer can be used by preparing a concentrate and diluting the concentrate with water in a case of use.

It is preferable that the developer is an aqueous developer.

From the viewpoint of the dispersibility of the development scum, it is preferable that the developer contains an alcohol compound.

Examples of the alcohol compound include methanol, ethanol, propanol, isopropanol, and benzyl alcohol. Among these, benzyl alcohol is preferable.

From the viewpoint of the dispersibility of the development scum, the content of the alcohol compound is preferably in a range of 0.01% by mass to 5% by mass, more preferably in a range of 0.1% by mass to 2% by mass, and particularly preferably in a range of 0.2% by mass to 1% by mass with respect to the total mass of the developer.

<Printing Step>

The printing method of using the planographic printing plate obtained according to the developer treatment system is not particularly limited, and the printing may be performed using a known method.

Examples thereof include a method of performing printing by supplying ink and dampening water as necessary to the planographic printing plate.

The planographic printing method according to the embodiment of the present invention may include known steps other than the above-described steps. Examples of other steps include a plate inspection step of confirming the orientation or position of the planographic printing plate precursor before each step and a confirmation step of confirming the printed image after the development treatment step.

EXAMPLES

Hereinafter, the present invention will be described in detail with reference to examples, but the present invention is not limited thereto. In the examples, "%" and "part" respectively indicate "% by mass" and "part by mass" unless otherwise specified. In a polymer compound, the molecular weight indicates the mass average molecular weight (Mw) and the proportion of constitutional repeating units indicates the mole percentage unless otherwise specified. Further, the mass average molecular weight (Mw) is a value in terms of polystyrene obtained by performing measurement using a gel permeation chromatography (GPC) method.

Examples 1 to 45 and Comparative Examples 1 to 6

<Preparation of Support 1>

The following treatments (A-a) to (A-g) were performed on an aluminum plate [aluminum alloy plate] formed of a material 1S having a thickness of 0.3 mm, thereby preparing a support 1. Moreover, during all treatment steps, a water washing treatment was performed, and liquid cutting was performed using a nip roller after the water washing treatment.

(A-a) Alkali Etching Treatment

The aluminum plate was subjected to an etching treatment by spraying a caustic soda aqueous solution having a caustic soda concentration of 26% by mass and an aluminum ion concentration of 6.5% by mass, to the aluminum plate using a spray at a temperature of 70° C. The amount of aluminum dissolved in the surface to be subsequently subjected to an electrochemical roughening treatment was 5 g/m$^2$.

(A-b) Desmutting Treatment Using Acidic Aqueous Solution

A desmutting treatment was performed by spraying, as an acidic aqueous solution, an aqueous solution having a sulfuric acid concentration of 150 g/L at a liquid temperature of 30° C., to the aluminum plate using a spray for 3 seconds.

(A-c) Electrochemical Roughening Treatment Using Hydrochloric Acid Aqueous Solution An electrochemical roughening treatment was performed using the AC current and an electrolytic solution having a hydrochloric acid concentration of 14 g/L, an aluminum ion concentration of 13 g/L, and a sulfuric acid concentration of 3 g/L. The liquid temperature of the electrolytic solution was 30° C. The aluminum ion concentration was adjusted by adding aluminum chloride.

The waveform of the AC current was a sine wave in which the positive and negative waveforms were symmetrical, the frequency was 50 Hz, the ratio between the anodic reaction time and the cathodic reaction time in one cycle of the AC current was 1:1, and the current density was 75 A/dm$^2$ in terms of the peak current value of the AC current waveform. Further, the total electric quantity of the aluminum plate used for the anodic reaction was 450 C/dm$^2$, and the electrolytic treatment was performed four times at energization intervals of 4 seconds for each of the electric quantity of 112.5 C/dm$^2$. A carbon electrode was used as a counter electrode of the aluminum plate.

(A-d) Alkali Etching Treatment

The aluminum plate was subjected to an etching treatment by spraying a caustic soda aqueous solution having a caustic soda concentration of 5% by mass and an aluminum ion concentration of 0.5% by mass, to the aluminum plate using a spray at a temperature of 45° C. The amount of aluminum dissolved in the surface after being subjected to an electrochemical roughening treatment was 0.2 g/m$^2$.

(A-e) Desmutting Treatment Using Acidic Aqueous Solution

A desmutting treatment was performed by spraying, as an acidic aqueous solution, a waste liquid (an aqueous solution having a sulfuric acid concentration of 170 g/L and an aluminum ion concentration of 5 g/L) generated in the anodization treatment step at a liquid temperature of 30° C., to the aluminum plate using a spray for 3 seconds.

(A-f) Anodization Treatment

Figure 3:
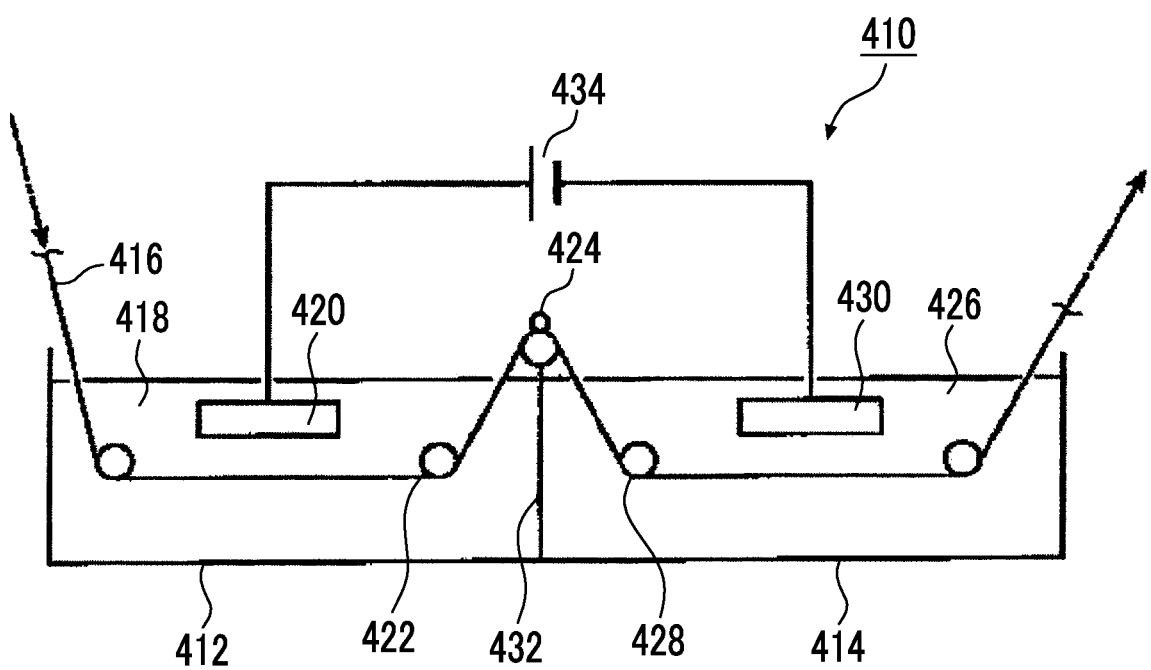
FIG. 3 is a schematic view illustrating an anodization treatment device used for an anodization treatment.

An anodization treatment was performed by an anodization device having a structure illustrated in FIG. 3 using DC electrolysis. The anodization treatment was performed using a 170 g/L sulfuric acid aqueous solution as an electrolytic solution under conditions of a liquid temperature of 50° C. and a current density of 30 A/dm$^2$ to form an anodized film having a coating amount of 2.4 g/m$^2$.

In an anodization treatment device 410 illustrated in FIG. 3, an aluminum plate 416 was transported as indicated by the arrow in FIG. 3. The aluminum plate 416 was positively (+) charged by a power supply electrode 420 in a power supply tank 412 in which an electrolytic solution 418 was stored. Further, the aluminum plate 416 was transported upward by a roller 422 in the power supply tank 412, redirected downward by a nip roller 424, transported toward an electrolytic treatment tank 414 in which an electrolytic solution 426 was stored, and redirected to the horizontal direction by a roller 428. Next, the aluminum plate 416 was negatively (−) charged by an electrolytic electrode 430 so that an anodized film was formed on the surface thereof, and the aluminum plate 416 coming out of the electrolytic treatment tank 414 was transported to the next step. In the anodization treatment device 410, a direction changing unit is formed of the roller 422, the nip roller 424, and the roller 428. The aluminum plate 416 was transported in a mountain shape and an inverted U shape by the rollers 422, 424, and 428 in an inter-tank portion between the power supply tank 412 and the electrolytic treatment tank 414. The power supply electrode 420 and the electrolytic electrode 430 are connected to a DC power source 434.

(A-g) Pore Widening Treatment

The aluminum plate after being subjected to the anodization treatment was subjected to a pore widening treatment by being immersed in a caustic soda aqueous solution having a caustic soda concentration of 5% by mass and an aluminum ion concentration of 0.5% by mass at a temperature of 40° C. for 3 seconds. Thereafter, the aluminum plate was washed with water using a spray. The average diameter of the micropores was 30 nm.

<Preparation of Support 2>

The following treatments (a) to (m) were performed on an aluminum alloy plate having a thickness of 0.3 mm with the composition listed in Table 1, thereby preparing a support 2. Moreover, during all treatment steps, a water washing treatment was performed, and liquid cutting was performed using a nip roller after the water washing treatment.

TABLE 1

| Composition (% by mass) | | | | | | | |
|---|---|---|---|---|---|---|---|
| Si | Fe | Cu | Mn | Mg | Zn | Ti | Al |
| 0.085 | 0.303 | 0.037 | 0 | 0 | 0 | 0.018 | Remainder |

(a) Mechanical Roughening Treatment (Brush Grain Method)

While supplying a suspension of pumice (specific gravity of 1.1 g/cm$^3$) to the surface of the aluminum plate as a polishing slurry liquid, a mechanical roughening treatment was performed using rotating bundle bristle brushes.

The mechanical roughening treatment was performed under conditions in which the median diameter of a polishing material pumice was 30 mm, the number of the bundle bristle brushes was four, and the rotation speed of the bundle bristle brushes was set to 250 rpm. The material of the bundle bristle brushes was nylon 6.10, the diameter of the brush bristles was 0.3 mm, and the bristle length was 50 mm. The bundle bristle brushes were produced by implanting bristles densely into the holes in a stainless steel cylinder having a diameter of 300 mm. The distance between two support rollers (with a diameter of 200 mm) of the lower portion of the bundle bristle brush was 300 mm. The bundle bristle brushes were pressed until the load of a driving motor for rotating the brushes became 10 kW plus with respect to the load before the bundle bristle brushes were pressed against the aluminum plate. The rotation direction of the bundle bristle brushes was the same as the moving direction of the aluminum plate.

(b) Alkali Etching Treatment

The aluminum plate was subjected to an etching treatment by spraying a caustic soda aqueous solution having a caustic soda concentration of 26% by mass and an aluminum ion concentration of 6.5% by mass, to the aluminum plate using a spray tube at a temperature of 70° C. The amount of aluminum dissolved was 10 g/m$^2$.

(c) Desmutting Treatment in Acidic Aqueous Solution

Next, a desmutting treatment was performed in a nitric acid aqueous solution. As the nitric acid aqueous solution used in the desmutting treatment, a nitric acid electrolytic solution used for electrochemical roughening in the subsequent step was used. The liquid temperature was 35° C. The desmutting treatment was performed for 3 seconds by spraying the desmutting liquid using a spray.

(d) Electrochemical Roughening Treatment

An electrochemical roughening treatment was continuously performed using an AC voltage of 60 Hz. An electrolytic solution which had been adjusted to have an aluminum ion concentration of 4.5 g/L by adding aluminum nitrate to an aqueous solution having a nitric acid concentration of 10.4 g/L at a temperature of 35° C. was used as the electrolytic solution. Using a trapezoidal rectangular waveform AC having a time tp, until the current value reached a peak from zero, of 0.8 msec and a duty ratio of 1:1 as the AC power source waveform, the electrochemical roughening treatment was performed using a carbon electrode as a counter electrode. As an auxiliary anode, ferrite was used. The current density was 30 A/dm$^2$ in terms of the peak current value, and 5% of the current from the power source was separately flowed to the auxiliary anode. The electric quantity was 185 C/dm$^2$ as the total electric quantity during the anodization of the aluminum plate.

(e) Alkali Etching Treatment

The aluminum plate was subjected to an etching treatment by spraying a caustic soda aqueous solution having a caustic soda concentration of 5% by mass and an aluminum ion concentration of 0.5% by mass using a spray tube at a temperature of 50° C. The amount of aluminum dissolved was 0.5 g/m$^2$.

(f) Desmutting Treatment in Acidic Aqueous Solution

A desmutting treatment was performed by spraying, as an acidic aqueous solution, a sulfuric acid aqueous solution having a sulfuric acid concentration of 170 g/L and an aluminum ion concentration of 5 g/L at a liquid temperature of 60° C., to the aluminum plate using a spray for 3 seconds.

(g) Electrochemical Roughening Treatment

An electrochemical roughening treatment was continuously performed using an AC voltage of 60 Hz. An electrolytic solution which had been adjusted to have an aluminum ion concentration of 4.5 g/L by adding aluminum chloride to an aqueous solution having a hydrochloric acid concentration of 6.2 g/L at a liquid temperature of 35° C. was used. Using a trapezoidal rectangular waveform AC having a time tp, until the current value reached a peak from zero, of 0.8 msec and a duty ratio of 1:1 as the AC power source waveform, the electrochemical roughening treatment was performed using a carbon electrode as a counter electrode. As an auxiliary anode, ferrite was used. The current density was 25 A/dm$^2$ in terms of the peak current value, and the electric quantity in the hydrochloric acid electrolysis was 63 C/dm$^2$ as the total electric quantity during the anodization of the aluminum plate.

(h) Alkali Etching Treatment

The aluminum plate was subjected to an etching treatment by spraying a caustic soda aqueous solution having a caustic soda concentration of 5% by mass and an aluminum ion concentration of 0.5% by mass using a spray tube at a temperature of 50° C. The amount of aluminum dissolved was 0.1 g/m$^2$.

(i) Desmutting Treatment in Acidic Aqueous Solution

A desmutting treatment was performed by spraying, as an acidic aqueous solution, a sulfuric acid aqueous solution (an aqueous solution having a sulfuric acid concentration of 170 g/L and an aluminum ion concentration of 5 g/L) used in the anodization treatment step at a liquid temperature of 35° C., to the aluminum plate using a spray for 3 seconds.

(j) First Anodization Treatment

A first stage of an anodization treatment was performed with an anodization device using DC electrolysis. An anodized film having a predetermined film thickness was formed by performing an anodization treatment under conditions listed in Table 2. An aqueous solution containing components listed in Table 2 was used as the electrolytic solution. In Tables 2 to 4, the "component concentration" indicates the concentration (g/L) of each component described in the section of "liquid component".

TABLE 2

| | First anodization treatment | | | | | |
| --- | --- | --- | --- | --- | --- | --- |
| Type of liquid | Liquid component | Concentration of component (g/L) | Temperature (° C.) | Current density (A/dm2) | Time (s) | Film thickness (nm) |
| Sulfuric acid | H$_2$SO$_4$/Al | 170/5 | 55 | 90 | 0.40 | 110 |

(k) Second Anodization Treatment

A second stage of an anodization treatment was performed with an anodization device using DC electrolysis. An anodized film having a predetermined film thickness was formed by performing an anodization treatment under conditions listed in Table 3. An aqueous solution containing components listed in Table 3 was used as the electrolytic solution.

TABLE 3

Second anodization treatment

| Type of liquid | Liquid component | Concentration of component (g/L) | Temperature (° C.) | Current density (A/dm2) | Time (s) | Film thickness (nm) |
|---|---|---|---|---|---|---|
| Sulfuric acid | $H_2SO_4$/Al | 170/5 | 54 | 15 | 13 | 900 |

(l) Third Anodization Treatment

A third stage of an anodization treatment was performed with an anodization device using DC electrolysis. An anodized film having a predetermined film thickness was formed by performing an anodization treatment under conditions listed in Table 4. An aqueous solution containing components listed in Table 4 was used as the electrolytic solution.

TABLE 4

Third anodization treatment

| Type of liquid | Liquid component | Concentration of component (g/L) | Temperature (° C.) | Current density (A/dm2) | Time (s) | Film thickness (nm) |
|---|---|---|---|---|---|---|
| Sulfuric acid | $H_2SO_4$/Al | 170/5 | 54 | 50 | 0.4 | 100 |

(m) Hydrophilization Treatment

In order to ensure hydrophilicity of a non-image area, the non-image area was subjected to a silicate treatment by being immersed using 2.5% by mass of a No. 3 sodium silicate aqueous solution at 50° C. for 7 seconds. The adhesion amount of Si was 8.5 mg/m$^2$.

The average diameter (average diameter of surface layers) of large-diameter pores in the surface of the anodized film having micropores obtained in the above-described manner, the average diameter (average diameter of bottom portions) of the large-diameter pores in a communication position, the average diameter (diameter of small-diameter pores) of small-diameter pores in the communication position, the average depth of the large-diameter pores and the small-diameter pores, the thickness (thickness of barrier layer) of the anodized film from the bottom portions of the small-diameter pores to the surface of the aluminum plate, and the density of the small-diameter pores are listed in Tables 5 and 6. The small-diameter pores include first small-diameter pores and second small-diameter pores with depths different from each other and small-diameter pores which are deeper than the other are referred to as the first small-diameter pores.

TABLE 5

Micropores
Large-diameter pores

| Average diameter of surface layers (nm) | Average diameter of bottom portions (nm) | Average depth (nm) | Average depth/Average diameter of surface layers | Average depth/Average diameter of bottom portions | Shape |
|---|---|---|---|---|---|
| 12 | 25 | 98 | 8.2 | 3.9 | Reversed tapered shape |

TABLE 6

Micropores

| Small-diameter pores | | | | | | Ratio |
|---|---|---|---|---|---|---|
| Average diameter (nm) | Average depth (nm) | Density of communication portion (particles/μm$^2$) | Average thickness of barrier layers (nm) | Minimum thickness of barrier layer (nm) | Density of micropores (particles/μm$^2$) | Increase magnification of surface area | (average thickness of surface layers/diameter of small-diameter pores) |
| 9.8 | 888, 968 | 800 (650) | 17 | 16 | 500 | 4.0 | 1.22 |

In Table 6, the average value and the minimum value are shown as the barrier layer thickness. The average value is obtained by measuring 50 thicknesses of the anodized film from the bottom portions of the first small-diameter pores to the surface of the aluminum plate and arithmetically averaging the values.

The average diameter of micropores (average diameter of the large-diameter pores and the small-diameter pores) is a value obtained by observing 4 sheets (N=4) of the surfaces of the large-diameter pores and the surfaces of the small-diameter pores using a field emission scanning electron microscope (FE-SEM) at a magnification of 150000, measuring the diameters of micropores (the large-diameter pores and the small-diameter pores) present in a range of 400×600 nm$^2$ in the obtained four sheets of images, and averaging the values. Further, in a case where the depth of the large-diameter pores is deep and the diameter of the small-diameter pores is unlikely to be measured, the upper portion of the anodized film is cut and then various kinds of diameters are acquired.

The average depth of the large-diameter pores is a value obtained by observing the cross section of the support (anodized film) using FE-TEM at a magnification of 500000, measuring 60 cases (N=60) of distances from the surface of an arbitrary micropore to the communication position in the obtained image, and averaging the values. Further, the average depth of the small-diameter pores is a value obtained by observing the cross section of the support (anodized film) using FE-SEM (at a magnification of 50000), measuring 25 cases of depths of arbitrary micropores in the obtained image, and averaging the values.

The "density of the communication portion" indicates the density of the small-diameter pores of the cross section of the anodized film in the communication position. The "increase magnification of the surface area" indicates the value calculated based on the following Equation (A).

Increase magnification of surface area=1+pore density×((π×(average diameter of surface layers/2+ average diameter of bottom portions/2)×((average diameter of bottom portions/2−average diameter of surface layers/2)$^2$+depth A$^2$)$^{1/2}$+πx
(average diameter of bottom portions/2)$^2$−πx
(average diameter of surface layers/2)$^2$))  Equation (A)

In the column of the "average depth (nm)" of the small-diameter pores, the average depth of the second small-diameter pores is shown on the left side and the average depth of the first small-diameter pores is shown on the right side. In the column of the "density of communication portion" of the small-diameter pores, the density of the first small-diameter pores is shown in the parentheses together with the density of the communication portion of the small-diameter pores.

In addition, the average diameter of the first small-diameter pores positioning from the bottom portions of the second small-diameter pores to the bottom portions of the first small-diameter pores was approximately 12 nm.

<Preparation of Support 3>

A support 3 was prepared in the same manner as in the preparation of the support 1 except that the temperature of the pore widening treatment (A-g) was changed to 28° C. in the preparation of the support 1. The average diameter of the micropores was 13 nm.

<Preparation of Support 4>

A support 4 was prepared in the same manner as in the preparation of the support 1 except that the liquid temperature in the anodization treatment (A-f) was changed to 15° C., the current density was changed to 60 A/dm$^2$, and the time of the pore widening treatment (A-g) was changed to 15 seconds in the preparation of the support 1. The average diameter of the micropores was 100 nm.

<Preparation of Support 5>

The following treatments (B-a) to (B-h) were performed on an aluminum plate formed of a material 1S having a thickness of 0.3 mm, thereby preparing a support 5. Moreover, during all treatment steps, a water washing treatment was performed, and liquid cutting was performed using a nip roller after the water washing treatment.

(B-a) Alkali Etching Treatment

The aluminum plate was subjected to an etching treatment by spraying a caustic soda aqueous solution having a caustic soda concentration of 26% by mass and an aluminum ion concentration of 6.5% by mass, to the aluminum plate using a spray at a temperature of 70° C. The amount of aluminum dissolved in the surface to be subsequently subjected to an electrochemical roughening treatment was 5 g/m$^2$.

(B-b) Desmutting Treatment Using Acidic Aqueous Solution

A desmutting treatment was performed by spraying, as an acidic aqueous solution, an aqueous solution having a sulfuric acid concentration of 150 g/L at a liquid temperature of 30° C., to the aluminum plate using a spray for 3 seconds.

(B-c) Electrochemical Roughening Treatment Using Hydrochloric Acid Aqueous Solution.

An electrochemical roughening treatment was performed using the AC current and an electrolytic solution having a hydrochloric acid concentration of 14 g/L, an aluminum ion concentration of 13 g/L, and a sulfuric acid concentration of 3 g/L. The liquid temperature of the electrolytic solution was 30° C. The aluminum ion concentration was adjusted by adding aluminum chloride.

The waveform of the AC current was a sine wave in which the positive and negative waveforms were symmetrical, the frequency was 50 Hz, the ratio between the anodic reaction time and the cathodic reaction time in one cycle of the AC current was 1:1, and the current density was 75 A/dm$^2$ in terms of the peak current value of the AC current waveform. Further, the total electric quantity of the aluminum plate used for the anodic reaction was 450 C/dm$^2$, and the electrolytic treatment was performed four times at energization intervals of 4 seconds for each of the electric quantity of 112.5 C/dm$^2$. A carbon electrode was used as a counter electrode of the aluminum plate.

(B-d) Alkali Etching Treatment

The aluminum plate was subjected to an etching treatment by spraying a caustic soda aqueous solution having a caustic soda concentration of 5% by mass and an aluminum ion concentration of 0.5% by mass, to the aluminum plate using a spray at a temperature of 45° C. The amount of aluminum dissolved in the surface after being subjected to an electrochemical roughening treatment was 0.2 g/m$^2$.

(B-e) Desmutting Treatment Using Acidic Aqueous Solution

A desmutting treatment was performed by spraying, as an acidic aqueous solution, a waste liquid (an aqueous solution having a sulfuric acid concentration of 170 g/L and an aluminum ion concentration of 5 g/L) generated in the anodization treatment step at a liquid temperature of 30° C., to the aluminum plate using a spray for 3 seconds.

(B-f) First Stage Anodization Treatment

A first stage anodization treatment was performed by an anodization device having a structure illustrated in FIG. 3 using DC electrolysis. The anodization treatment was performed using a 170 g/L sulfuric acid aqueous solution as an electrolytic solution under conditions of a liquid temperature of 50° C. and a current density of 30 A/dm$^2$ to form an anodized film having a coating amount of 0.3 g/m$^2$.

(B-g) Pore Widening Treatment

The aluminum plate after being subjected to the anodization treatment was subjected to a pore widening treatment by being immersed in a caustic soda aqueous solution having a caustic soda concentration of 5% by mass and an aluminum ion concentration of 0.5% by mass at a temperature of 40° C. for 3 seconds.

(B-h) Second Stage Anodization Treatment

A second stage anodization treatment was performed by an anodization device having a structure illustrated in FIG. 3 using DC electrolysis. The anodization treatment was performed using a 170 g/L sulfuric acid aqueous solution as an electrolytic solution under conditions of a liquid temperature of 50° C. and a current density of 13 A/dm$^2$ to form an anodized film having a coating amount of 2.1 g/m$^2$. The average diameter of the micropores was 30 nm.

<Preparation of Support 6>

The following treatments (D-a) to (D-l) were performed on an aluminum plate formed of a material 1S having a thickness of 0.3 mm, thereby preparing a support 6. Moreover, during all treatment steps, a water washing treatment was performed, and liquid cutting was performed using a nip roller after the water washing treatment.

(D-a) Mechanical Roughening Treatment (Brush Grain Method)

Figure 5:
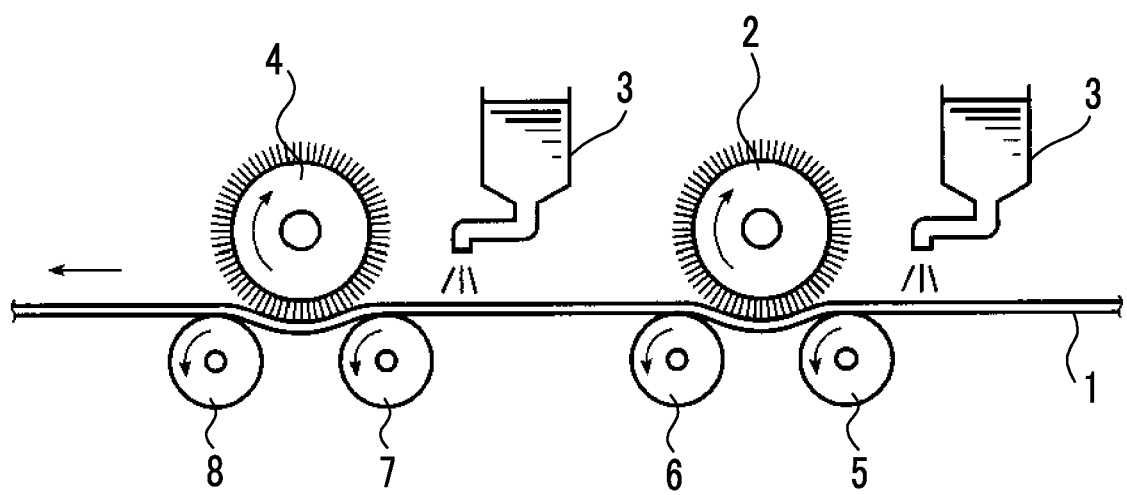
FIG. 5 is a side view illustrating the concept of a brush graining step used for a mechanical roughening treatment in preparation of an aluminum support.

While supplying a suspension of pumice (specific gravity of 1.1 g/cm$^3$) to the surface of the aluminum plate as a polishing slurry liquid using a device illustrated in FIG. 5, a mechanical roughening treatment was performed using rotating bundle bristle brushes. In FIG. 5, the reference numeral 1 represents an aluminum plate, the reference numerals 2 and 4 represent roller-like brushes (in the present examples, bundle bristle brushes), the reference numeral 3 represents a polishing slurry liquid, and the reference numerals 5, 6, 7, and 8 represent a support roller.

The mechanical roughening treatment was performed under conditions in which the median diameter (m) of a polishing material was 30 mm, the number of the brushes was four, and the rotation speed (rpm) of the brushes was set to 250 rpm. The material of the bundle bristle brushes was nylon 6.10, the diameter of the brush bristles was 0.3 mm, and the bristle length was 50 mm. The brushes were produced by implanting bristles densely into the holes in a stainless steel cylinder having a diameter of 300 mm. The distance between two support rollers (a diameter of 200 mm) of the lower portion of the bundle bristle brush was 300 mm. The bundle bristle brushes were pressed until the load of a driving motor for rotating the brushes became 10 kW plus with respect to the load before the bundle bristle brushes were pressed against the aluminum plate. The rotation direction of the brushes was the same as the moving direction of the aluminum plate.

(D-b) Alkali Etching Treatment

The aluminum plate was subjected to an etching treatment by spraying a caustic soda aqueous solution having a caustic soda concentration of 26% by mass and an aluminum ion concentration of 6.5% by mass, to the aluminum plate using a spray at a temperature of 70° C. The amount of aluminum dissolved in the surface to be subsequently subjected to an electrochemical roughening treatment was 10 g/m².

(D-c) Desmutting Treatment Using Acidic Aqueous Solution

A desmutting treatment was performed by spraying, as an acidic aqueous solution, a waste liquid of nitric acid used for the electrochemical roughening treatment in the subsequent step at a liquid temperature of 35° C., to the aluminum plate using a spray for 3 seconds.

(D-d) Electrochemical Roughening Treatment Using Nitric Acid Aqueous Solution

An electrochemical roughening treatment was continuously performed using an AC voltage of 60 Hz. As an electrolytic solution, an electrolytic solution which had been adjusted to have an aluminum ion concentration of 4.5 g/L by adding aluminum nitrate to an aqueous solution having a nitric acid concentration of 10.4 g/L at a liquid temperature of 35° C. was used. The AC power source waveform is a waveform illustrated in FIG. 1. Further, using a trapezoidal rectangular waveform AC having a time tp, until the current value reached a peak from zero, of 0.8 msec and a duty ratio of 1:1 as the AC power source waveform, the electrochemical roughening treatment was performed using a carbon electrode as a counter electrode. As an auxiliary anode, ferrite was used. An electrolytic cell illustrated in FIG. 2 was used as the electrolytic cell. The current density was 30 A/dm² in terms of the peak current value, and 5% of the current from the power source was separately flowed to the auxiliary anode. The electric quantity (C/dm²) was 185 C/dm² as the total electric quantity during the anodization of the aluminum plate.

(D-e) Alkali Etching Treatment

An aluminum plate was subjected to an etching treatment by spraying a caustic soda aqueous solution having a caustic soda concentration of 27% by mass and an aluminum ion concentration of 2.5% by mass, to the aluminum plate using a spray at a temperature of 50° C. The amount of aluminum dissolved was 3.5 g/m².

(D-f) Desmutting Treatment Using Acidic Aqueous Solution

A desmutting treatment was performed by spraying, as an acidic aqueous solution, an aqueous solution having a sulfuric acid concentration of 170 g/L and an aluminum ion concentration of 5 g/L at a liquid temperature of 30° C., to the aluminum plate using a spray for 3 seconds.

(D-g) Electrochemical Roughening Treatment Using Hydrochloric Acid Aqueous Solution An electrochemical roughening treatment was continuously performed using an AC voltage of 60 Hz. As an electrolytic solution, an electrolytic solution which had been adjusted to have an aluminum ion concentration of 4.5 g/L by adding aluminum chloride to an aqueous solution having 6.2 g/L of hydrochloric acid at a liquid temperature of 35° C. was used. The AC power source waveform is a waveform illustrated in FIG. 1. Further, using a trapezoidal rectangular waveform AC having a time tp, until the current value reached a peak from zero, of 0.8 msec and a duty ratio of 1:1 as the AC power source waveform, the electrochemical roughening treatment was performed using a carbon electrode as a counter electrode. As an auxiliary anode, ferrite was used. An electrolytic cell illustrated in FIG. 2 was used as the electrolytic cell. The current density was 25 A/dm² in terms of the peak current value, and the electric quantity (C/dm²) in the hydrochloric acid electrolysis was 63 C/dm² as the total electric quantity during the anodization of the aluminum plate.

(D-h) Alkali Etching Treatment

An aluminum plate was subjected to an etching treatment by spraying a caustic soda aqueous solution having a caustic soda concentration of 5% by mass and an aluminum ion concentration of 0.5% by mass, to the aluminum plate using a spray at a temperature of 60° C. The amount of aluminum dissolved was 0.2 g/m².

(D-i) Desmutting Treatment Using Acidic Aqueous Solution

A desmutting treatment was performed by spraying, as an acidic aqueous solution, a waste liquid (an aqueous solution having a sulfuric acid concentration of 170 g/L and an aluminum ion concentration of 5 g/L) generated in the anodization treatment step at a liquid temperature of 35° C., to the aluminum plate using a spray for 4 seconds.

(D-j) Anodization Treatment

An anodization treatment was performed by an anodization device having a structure illustrated in FIG. 3 using DC electrolysis. The anodization treatment was performed using a 170 g/L sulfuric acid aqueous solution as an electrolytic solution under conditions of a liquid temperature of 50° C. and a current density of 30 A/dm² to form an anodized film having a coating amount of 2.4 g/m².

(D-k) Pore Widening Treatment

The aluminum plate after being subjected to the anodization treatment was subjected to a pore widening treatment by being immersed in a caustic soda aqueous solution having a caustic soda concentration of 5% by mass and an aluminum ion concentration of 0.5% by mass at a temperature of 40° C. for 3 seconds. The average diameter of the micropores was 30 nm.

(D-l) Hydrophilization Treatment

In order to ensure the hydrophilicity of a non-image area, the aluminum plate was subjected to a silicate treatment by being immersed using 2.5% by mass of a No. 3 sodium silicate aqueous solution at 50° C. for 7 seconds. The adhesion amount of Si was 8.5 mg/m².

<Preparation of Support 7>

The following treatments (F-a) to (F-g) were performed on an aluminum plate formed of a material 1S having a thickness of 0.3 mm, thereby preparing a support 7. Moreover, during all treatment steps, a water washing treatment was performed, and liquid cutting was performed using a nip roller after the water washing treatment.

(F-a) Alkali Etching Treatment

The aluminum plate was subjected to an etching treatment by spraying a caustic soda aqueous solution having a caustic soda concentration of 26% by mass and an aluminum ion concentration of 6.5% by mass, to the aluminum plate using a spray at a temperature of 70° C. The amount of aluminum dissolved in the surface to be subsequently subjected to an electrochemical roughening treatment was 5 g/m².

(F-b) Desmutting Treatment Using Acidic Aqueous Solution

A desmutting treatment was performed by spraying, as an acidic aqueous solution, an aqueous solution having a sulfuric acid concentration of 150 g/L at a liquid temperature of 30° C., to the aluminum plate using a spray for 3 seconds.

(F-c) Electrochemical Roughening Treatment

An electrochemical roughening treatment was performed using the AC current and an electrolytic solution having a hydrochloric acid concentration of 14 g/L, an aluminum ion concentration of 13 g/L, and a sulfuric acid concentration of 3 g/L. The liquid temperature of the electrolytic solution was 30° C. The aluminum ion concentration was adjusted by adding aluminum chloride.

The waveform of the AC current was a sine wave in which the positive and negative waveforms were symmetrical, the frequency was 50 Hz, the ratio between the anodic reaction time and the cathodic reaction time in one cycle of the AC current was 1:1, and the current density was 75 A/dm² in terms of the peak current value of the AC current waveform. Further, the total electric quantity of the aluminum plate used for the anodic reaction was 450 C/dm², and the electrolytic treatment was performed four times at energization intervals of 4 seconds for each of the electric quantity of 112.5 C/dm². A carbon electrode was used as a counter electrode of the aluminum plate.

(F-d) Alkali Etching Treatment

The aluminum plate was subjected to an etching treatment by spraying a caustic soda aqueous solution having a caustic soda concentration of 5% by mass and an aluminum ion concentration of 0.5% by mass, to the aluminum plate using a spray at a temperature of 45° C. The amount of aluminum dissolved in the surface after being subjected to an electrochemical roughening treatment was 0.2 g/m².

(F-e) Desmutting Treatment Using Acidic Aqueous Solution

A desmutting treatment was performed by spraying, as an acidic aqueous solution, an aqueous solution having a sulfuric acid concentration of 170 g/L and an aluminum ion concentration of 5 g/L at a liquid temperature of 35° C., to the aluminum plate using a spray for 3 seconds.

(F-f) First Stage Anodization Treatment

A first stage anodization treatment was performed by an anodization device having a structure illustrated in FIG. 3 using DC electrolysis. The anodization treatment was performed using a 150 g/L phosphoric acid aqueous solution as an electrolytic solution under conditions of a liquid temperature of 35° C. and a current density of 4.5 A/dm² to form an anodized film having a coating amount of 1 g/m².

(F-g) Second Stage Anodization Treatment

A second stage anodization treatment was performed by an anodization device having a structure illustrated in FIG. 3 using DC electrolysis. The anodization treatment was performed using a 170 g/L sulfuric acid aqueous solution as an electrolytic solution under conditions of a liquid temperature of 50° C. and a current density of 13 A/dm² to form an anodized film having a coating amount of 2.1 g/m². The average diameter of the micropores was 40 nm.

<Preparation of Support 8>

The following treatments (G-a) to (G-h) were performed on an aluminum plate formed of a material 1S having a thickness of 0.3 mm, thereby preparing a support 8. Moreover, during all treatment steps, a water washing treatment was performed, and liquid cutting was performed using a nip roller after the water washing treatment.

(G-a) Alkali Etching Treatment

The aluminum plate was subjected to an etching treatment by spraying a caustic soda aqueous solution having a caustic soda concentration of 26% by mass and an aluminum ion concentration of 6.5% by mass, to the aluminum plate using a spray at a temperature of 70° C. The amount of aluminum dissolved in the surface to be subsequently subjected to an electrochemical roughening treatment was 5 g/m².

(G-b) Desmutting Treatment Using Acidic Aqueous Solution

A desmutting treatment was performed by spraying, as an acidic aqueous solution, an aqueous solution having a sulfuric acid concentration of 150 g/L at a liquid temperature of 30° C., to the aluminum plate using a spray for 3 seconds.

(G-c) Electrochemical Roughening Treatment

An electrochemical roughening treatment was performed using the AC current and an electrolytic solution having a hydrochloric acid concentration of 14 g/L, an aluminum ion concentration of 13 g/L, and a sulfuric acid concentration of 3 g/L. The liquid temperature of the electrolytic solution was 30° C. The aluminum ion concentration was adjusted by adding aluminum chloride.

The waveform of the AC current was a sine wave in which the positive and negative waveforms were symmetrical, the frequency was 50 Hz, the ratio between the anodic reaction time and the cathodic reaction time in one cycle of the AC current was 1:1, and the current density was 75 A/dm² in terms of the peak current value of the AC current waveform. Further, the total electric quantity of the aluminum plate used for the anodic reaction was 450 C/dm², and the electrolytic treatment was performed four times at energization intervals of 4 seconds for each of the electric quantity of 112.5 C/dm². A carbon electrode was used as a counter electrode of the aluminum plate.

(G-d) Alkali Etching Treatment

The aluminum plate was subjected to an etching treatment by spraying a caustic soda aqueous solution having a caustic soda concentration of 5% by mass and an aluminum ion concentration of 0.5% by mass, to the aluminum plate using a spray at a temperature of 45° C. The amount of aluminum dissolved in the surface after being subjected to an electrochemical roughening treatment was 0.2 g/m².

(G-e) Desmutting Treatment Using Acidic Aqueous Solution

A desmutting treatment was performed by spraying, as an acidic aqueous solution, an aqueous solution having a sulfuric acid concentration of 170 g/L and an aluminum ion concentration of 5 g/L at a liquid temperature of 35° C., to the aluminum plate using a spray for 3 seconds.

(G-f) First Stage Anodization Treatment

A first stage anodization treatment was performed by an anodization device having a structure illustrated in FIG. 3 using DC electrolysis. The anodization treatment was performed using a 150 g/L phosphoric acid aqueous solution as an electrolytic solution under conditions of a liquid temperature of 35° C. and a current density of 4.5 A/dm² to form an anodized film having a coating amount of 1 g/m².

(G-g) Pore Widening Treatment

The aluminum plate after being subjected to the anodization treatment was subjected to a pore widening treatment by being immersed in a caustic soda aqueous solution having a caustic soda concentration of 5% by mass and an aluminum ion concentration of 0.5% by mass at a temperature of 40° C. for 4 seconds.

(G-h) Second Stage Anodization Treatment

A second stage anodization treatment was performed by an anodization device having a structure illustrated in FIG. 3 using DC electrolysis. The anodization treatment was performed using a 170 g/L sulfuric acid aqueous solution as an electrolytic solution under conditions of a liquid temperature of 50° C. and a current density of 13 A/dm$^2$ to form an anodized film having a coating amount of 2.1 g/m$^2$. The average diameter of the micropores was 100 nm.

<Preparation of Support 9>

A support 9 was prepared in the same manner as in the preparation of the support 7 except that the second stage anodization treatment (F-g) was changed as follows in the preparation of the support 7.

(H-g) Second Stage Anodization Treatment

The anodization treatment was performed using a 150 g/L phosphoric acid aqueous solution as an electrolytic solution under conditions of a liquid temperature of 35° C. and a current density of 4.5 A/dm$^2$ to form an anodized film having a coating amount of 1.2 g/m$^2$. The average diameter of the micropores was 40 nm.

<Preparation of Support 10>

A support 10 was prepared in the same manner as in the preparation of the support 8 except that the immersion time in the pore widening treatment (G-g) was changed to 8 seconds and the second stage anodization treatment (G-h) was changed as follows in the preparation of the support 8.

(I-h) Second Stage Anodization Treatment

The anodization treatment was performed using a 150 g/L phosphoric acid aqueous solution as an electrolytic solution under conditions of a liquid temperature of 35° C. and a current density of 4.5 A/dm$^2$ to form an anodized film having a coating amount of 2.1 g/m$^2$. The average diameter of the micropores was 148 nm.

<Preparation of Support 11>

A molten metal was prepared using an aluminum alloy containing 0.06% by mass of Si, 0.30% by mass of Fe, 0.005% by mass of Cu, 0.001% by mass of Mn, 0.001% by mass of Mg, 0.001% by mass of Zn, and 0.03% by mass of Ti and, as the remainder, aluminum and unavoidable impurities, a molten metal treatment and filtration were performed, and an ingot having a thickness of 500 mm and a width of 1200 mm was prepared according to a DC casting method. The surface was scraped off using a surface grinder having an average thickness of 10 mm and heated at 550° C. and maintained the state for approximately 5 hours. After the temperature was decreased to 400° C., a rolled sheet having a thickness of 2.7 mm was obtained using a hot rolling mill. Further, a heat treatment was performed thereon at 500° C. using a continuous annealing machine, and a cold rolling was performed so that the thickness of the rolled sheet was finished to 0.24 mm, thereby preparing an aluminum plate (width of 1030 mm) formed of JIS 1050 material.

The following surface treatments (b) to (j) were continuously performed on an aluminum plate, thereby preparing a support 11. Moreover, during all treatment steps, a water washing treatment was performed, and liquid cutting was performed using a nip roller after the water washing treatment.

(b) Alkali Etching Treatment

The aluminum plate was subjected to an etching treatment by spraying an aqueous solution having a caustic soda concentration of 2.6% by mass and an aluminum ion concentration of 6.5% by mass at a temperature of 70° C. so that 6 g/m$^2$ of the aluminum plate was dissolved.

(c) Desmutting Treatment

A desmutting treatment was performed by spraying an acidic aqueous solution (containing 0.5% by mass of aluminum ions) having a nitric acid concentration of 1% by mass at a temperature of 30° C. using a spray. As the nitric acid aqueous solution used for the desmutting treatment, a waste liquid used for the step of performing the electrochemical roughening treatment using the alternating current in a nitric acid aqueous solution was used.

(d) Electrochemical Roughening Treatment

An electrochemical roughening treatment was continuously performed using an AC voltage of 60 Hz. As an electrolytic solution, an aqueous solution containing 10.5 g/L of nitric acid (containing 5 g/L of aluminum ions and 0.007% by mass of ammonium ions) at a liquid temperature of 50° C. was used. The AC power source waveform is a waveform illustrated in FIG. 1. Further, using a trapezoidal rectangular waveform AC having a time tp, until the current value reached a peak from zero, of 0.8 msec and a duty ratio of 1:1 as the AC power source waveform, the electrochemical roughening treatment was performed using a carbon electrode as a counter electrode. As an auxiliary anode, ferrite was used. An electrolytic cell illustrated in FIG. 2 was used as the electrolytic cell. The current density was 30 A/dm$^2$ in terms of the peak current value, and the electric quantity was 220 C/dm$^2$ as the total electric quantity during the anodization of the aluminum plate. Further, 5% of the current from the power source was separately flowed to the auxiliary anode.

(e) Alkali Etching Treatment

The aluminum plate was subjected to an etching treatment by spraying an aqueous solution having a caustic soda concentration of 26% by mass and an aluminum ion concentration of 6.5% by mass at a temperature of 32° C. so that 0.25 g/m$^2$ of the aluminum plate was dissolved. Further, a smut component mainly containing aluminum hydroxide generated during the electrochemical roughening treatment using the alternating current at the former stage was removed, an edge portion of a generated pit was dissolved to smooth the edge portion.

(f) Desmutting Treatment

A desmutting treatment was performed by spraying an aqueous solution (containing 4.5% by mass of aluminum ions) having a sulfuric acid concentration of 15% by mass at a temperature of 30° C. using a spray. As the nitric acid aqueous solution used for the desmutting treatment, a waste liquid used for the step of performing the electrochemical roughening treatment using the alternating current in a nitric acid aqueous solution was used.

(g) Electrochemical Roughening Treatment

An electrochemical roughening treatment was continuously performed using an AC voltage of 60 Hz. As an electrolytic solution, an aqueous solution containing 2.5 g/L of hydrochloric acid (containing 5 g/L of aluminum ions) at a temperature of 35° C. was used. The AC power source waveform is a waveform illustrated in FIG. 1. Further, using a trapezoidal rectangular waveform AC having a time tp, until the current value reached a peak from zero, of 0.8 msec and a duty ratio of 1:1 as the AC power source waveform, the electrochemical roughening treatment was performed using a carbon electrode as a counter electrode. As an auxiliary anode, ferrite was used. An electrolytic cell illustrated in FIG. 2 was used as the electrolytic cell. The current density was 25 A/dm$^2$ in terms of the peak current value, and the electric quantity was 50 C/dm² as the total electric quantity during the anodization of the aluminum plate.

(h) Alkali Etching Treatment

The aluminum plate was subjected to an etching treatment by spraying an aqueous solution having a caustic soda concentration of 26% by mass and an aluminum ion concentration of 6.5% by mass at a temperature of 32° C. so that 0.1 g/m² of the aluminum plate was dissolved. Further, a smut component mainly containing aluminum hydroxide generated during the electrochemical roughening treatment using the alternating current at the former stage was removed, an edge portion of a generated pit was dissolved to smooth the edge portion.

(i) Desmutting Treatment

A desmutting treatment was performed by spraying an aqueous solution (containing 0.5% by mass of aluminum ions) having a sulfuric acid concentration of 25% by mass at a temperature of 60° C. using a spray.

(j) Anodization Treatment

An anodization treatment was performed by an anodization device having a structure illustrated in FIG. 3 using DC electrolysis. The anodization treatment was performed using an aqueous solution (containing 0.5% by mass of aluminum ions) having a sulfuric acid concentration of 170 g/L as an electrolytic solution under conditions of a liquid temperature of 38° C. and a current density of 30 A/dm² to form an anodized film having a coating amount of 2.7 g/m². The average diameter of the micropores was 7 nm.

<Preparation of Support 12>

In order to remove rolling oil on a surface of an aluminum plate (material JIS A 1050) having a thickness of 0.3 mm, after a degreasing treatment was performed at 50° C. for 30 seconds using a 10 mass % sodium aluminate aqueous solution, the surface of the aluminum plate was grained using three bundle nylon brushes having a hair diameter of 0.3 mm and a pumice-water suspension (specific gravity of 1.1 g/cm³) having a median diameter of 25 µm, and the surface was thoroughly washed with water. The aluminum plate was etched by being immersed in a 25 mass % sodium hydroxide aqueous solution at 45° C. for 9 seconds, washed with water, further immersed in a 20 mass % nitric acid aqueous solution at 60° C. for 20 seconds, and washed with water. The etching amount of the grained surface was approximately 3 g/m².

An electrochemical roughening treatment was continuously performed using an AC voltage of 60 Hz. An aqueous solution (containing 0.5% by mass of aluminum ions) having a nitric acid concentration of 1% by mass was used as the electrolytic solution, and the liquid temperature was 50° C. Using a trapezoidal rectangular waveform AC having a time tp, until the current value reached a peak from zero, of 0.8 msec and a duty ratio of 1:1 as the AC power source waveform, the electrochemical roughening treatment was performed using a carbon electrode as a counter electrode. As an auxiliary anode, ferrite was used. The current density was 30 A/dm² in terms of the peak current value, and 5% of the current from the power source was separately flowed to the auxiliary anode. The electric quantity in the nitric acid electrolysis was 175 C/dm² as the electric quantity during the anodization of the aluminum plate. Thereafter, the aluminum plate was washed with water using a spray.

Next, the aluminum plate was subjected to an electrochemical roughening treatment according to the same method as that for the nitric acid electrolysis under conditions of an electric quantity of 50 C/dm² during the anodization using an aqueous solution (containing 0.5% by mass of aluminum ions) containing 0.5% by mass of hydrochloric acid and an electrolytic solution at a liquid temperature of 50° C., and the aluminum plate was washed with water using a spray.

A DC anodized film having a coating amount of 2.5 g/m² at a current density of 15 A/dm² was provided on the aluminum plate using a 15 mass % sulfuric acid aqueous solution (containing 0.5% by mass of aluminum ions) as an electrolytic solution, washed with water, and dried.

Next, a sealing treatment was performed by spraying water vapor at 100° C. to the anodized film at a pressure of 1.033×10⁵ Pa for 8 seconds. Further, the aluminum support was immersed in a treatment liquid obtained by dissolving 0.4% by mass of polyvinyl phosphonic acid (manufactured by PCAS) in pure water at 53° C. for 10 seconds, and the excess treatment liquid was completely removed by a nip roll, thereby preparing a support 12.

<Preparation of Support 13>

An aluminum plate formed of a material 1S having a thickness of 0.19 mm was immersed in a 40 g/L sodium hydroxide aqueous solution at 60° C. for 8 seconds so as to be degreased and then washed with demineralized water for 2 seconds. The aluminum plate was subjected to an electrochemical roughening treatment in an aqueous solution containing 12 g/L of hydrochloric acid and 38 g/L of aluminum sulfate (18 hydrate) at a temperature of 33° C. and at a current density of 130 A/dm² using an AC for 15 seconds. Next, the aluminum plate was washed with demineralized water for 2 seconds, subjected to a desmutting treatment by being etched using 155 g/L of a sulfuric acid aqueous solution at 70° C. for 4 seconds, and washed with demineralized water at 25° C. for 2 seconds. The aluminum plate was subjected to an anodization treatment in 155 g/L of a sulfuric acid aqueous solution for 13 seconds at a temperature of 45° C. and at a current density of 22 A/dm² and washed with demineralized water for 2 seconds. Further, the aluminum plate was treated at 40° C. for 10 seconds using 4 g/L of a polyvinyl phosphonic acid aqueous solution, washed with demineralized water at 20° C. for 2 seconds, and then dried, thereby preparing a support 13. The average diameter of the micropores was 7 nm.

<Preparation of Support 14>

The following treatments (K-a) to (K-l) were performed on an aluminum plate formed of a material 1S having a thickness of 0.3 mm, thereby preparing a support 14. Moreover, during all treatment steps, a water washing treatment was performed, and liquid cutting was performed using a nip roller after the water washing treatment.

(D-a) Mechanical Roughening Treatment (Brush Grain Method)

While supplying a suspension of pumice (specific gravity of 1.1 g/cm³) to the surface of the aluminum plate as a polishing slurry liquid using a device illustrated in FIG. 5, a mechanical roughening treatment was performed using rotating bundle bristle brushes. The mechanical roughening treatment was performed under conditions in which the median diameter (µm) of a polishing material was 30 mm, the number of the brushes was four, and the rotation speed (rpm) of the brushes was set to 250 rpm. The material of the bundle bristle brushes was nylon 6.10, the diameter of the brush bristles was 0.3 mm, and the bristle length was 50 mm. The brushes were produced by implanting bristles densely into the holes in a stainless steel cylinder having a diameter of 300 mm. The distance between two support rollers (a diameter of 200 mm) of the lower portion of the bundle bristle brush was 300 mm. The bundle bristle brushes were pressed until the load of a driving motor for rotating the brushes became 10 kW plus with respect to the load before the bundle bristle brushes were pressed against the aluminum plate. The rotation direction of the brushes was the same as the moving direction of the aluminum plate.

(K-b) Alkali Etching Treatment

The aluminum plate was subjected to an etching treatment by spraying a caustic soda aqueous solution having a caustic soda concentration of 26% by mass and an aluminum ion concentration of 6.5% by mass, to the aluminum plate using a spray at a temperature of 70° C. The amount of aluminum dissolved in the surface to be subsequently subjected to an electrochemical roughening treatment was 10 $g/m^2$.

(K-c) Desmutting Treatment Using Acidic Aqueous Solution

A desmutting treatment was performed by spraying, as an acidic aqueous solution, a waste liquid of nitric acid used for the electrochemical roughening treatment in the subsequent step at a liquid temperature of 35° C., to the aluminum plate using a spray for 3 seconds.

(K-d) Electrochemical Roughening Treatment Using Nitric Acid Aqueous Solution

An electrochemical roughening treatment was continuously performed using an AC voltage of 60 Hz. As an electrolytic solution, an electrolytic solution which had been adjusted to have an aluminum ion concentration of 4.5 g/L by adding aluminum nitrate to an aqueous solution having a nitric acid concentration of 10.4 g/L at a liquid temperature of 35° C. was used. The AC power source waveform is a waveform illustrated in FIG. 1. Further, using a trapezoidal rectangular waveform AC having a time tp, until the current value reached a peak from zero, of 0.8 msec and a duty ratio of 1:1 as the AC power source waveform, the electrochemical roughening treatment was performed using a carbon electrode as a counter electrode. As an auxiliary anode, ferrite was used. An electrolytic cell illustrated in FIG. 2 was used as the electrolytic cell. The current density was 30 $A/dm^2$ in terms of the peak current value, and 5% of the current from the power source was separately flowed to the auxiliary anode. The electric quantity ($C/dm^2$) was 185 $C/dm^2$ as the total electric quantity during the anodization of the aluminum plate.

(K-e) Alkali Etching Treatment

An aluminum plate was subjected to an etching treatment by spraying a caustic soda aqueous solution having a caustic soda concentration of 27% by mass and an aluminum ion concentration of 2.5% by mass, to the aluminum plate using a spray at a temperature of 50° C. The amount of aluminum dissolved was 0.5 $g/m^2$.

(K-f) Desmutting Treatment Using Acidic Aqueous Solution

A desmutting treatment was performed by spraying, as an acidic aqueous solution, an aqueous solution having a sulfuric acid concentration of 170 g/L and an aluminum ion concentration of 5 g/L at a liquid temperature of 30° C., to the aluminum plate using a spray for 3 seconds.

(K-g) Electrochemical Roughening Treatment Using Hydrochloric Acid Aqueous Solution An electrochemical roughening treatment was continuously performed using an AC voltage of 60 Hz. As an electrolytic solution, an electrolytic solution which had been adjusted to have an aluminum ion concentration of 4.5 g/L by adding aluminum chloride to an aqueous solution having 6.2 g/L of hydrochloric acid at a liquid temperature of 35° C. was used. The AC power source waveform is a waveform illustrated in FIG. 1. Further, using a trapezoidal rectangular waveform AC having a time tp, until the current value reached a peak from zero, of 0.8 msec and a duty ratio of 1:1 as the AC power source waveform, the electrochemical roughening treatment was performed using a carbon electrode as a counter electrode. As an auxiliary anode, ferrite was used. An electrolytic cell illustrated in FIG. 2 was used as the electrolytic cell. The current density was 25 $A/dm^2$ in terms of the peak current value, and the electric quantity ($C/dm^2$) in the hydrochloric acid electrolysis was 63 $C/dm^2$ as the total electric quantity during the anodization of the aluminum plate.

(K-h) Alkali Etching Treatment

An aluminum plate was subjected to an etching treatment by spraying a caustic soda aqueous solution having a caustic soda concentration of 5% by mass and an aluminum ion concentration of 0.5% by mass, to the aluminum plate using a spray at a temperature of 60° C. The amount of aluminum dissolved was 0.1 $g/m^2$.

(K-i) Desmutting Treatment Using Acidic Aqueous Solution

A desmutting treatment was performed by spraying, as an acidic aqueous solution, a waste liquid (an aqueous solution having a sulfuric acid concentration of 170 g/L and an aluminum ion concentration of 5 g/L) generated in the anodization treatment step at a liquid temperature of 35° C., to the aluminum plate using a spray for 4 seconds.

(K-j) Anodization Treatment

An anodization treatment was performed by an anodization device having a structure illustrated in FIG. 3 using DC electrolysis. The anodization treatment was performed using a 170 g/L sulfuric acid aqueous solution as an electrolytic solution under conditions of a liquid temperature of 50° C. and a current density of 30 $A/dm^2$ to form an anodized film having a coating amount of 2.4 $g/m^2$.

(K-k) Hydrophilization Treatment

In order to ensure the hydrophilicity of a non-image area, the aluminum plate was subjected to a silicate treatment by being immersed using 2.5% by mass of a No. 3 sodium silicate aqueous solution at 50° C. for 7 seconds. The adhesion amount of Si was 8.5 $mg/m^2$.

<Preparation of Support 15>

The following treatments (J-a) to (J-m) were performed on an aluminum plate formed of a material 1S having a thickness of 0.3 mm, thereby preparing a support 15. Moreover, during all treatment steps, a water washing treatment was performed, and liquid cutting was performed using a nip roller after the water washing treatment.

(J-a) Mechanical Roughening Treatment (Brush Grain Method)

While supplying a suspension of pumice (specific gravity of 1.1 $g/cm^3$) to the surface of the aluminum plate as a polishing slurry liquid using a device illustrated in FIG. 5, a mechanical roughening treatment was performed using rotating bundle bristle brushes. The mechanical roughening treatment was performed under conditions in which the median diameter (m) of a polishing material was 30 mm, the number of the brushes was four, and the rotation speed (rpm) of the brushes was set to 250 rpm. The material of the bundle bristle brushes was nylon 6.10, the diameter of the brush bristles was 0.3 mm, and the bristle length was 50 mm. The brushes were produced by implanting bristles densely into the holes in a stainless steel cylinder having a diameter of 300 mm. The distance between two support rollers (a diameter of 200 mm) of the lower portion of the bundle bristle brush was 300 mm. The bundle bristle brushes were pressed until the load of a driving motor for rotating the brushes became 10 kW plus with respect to the load before the bundle bristle brushes were pressed against the aluminum plate. The rotation direction of the brushes was the same as the moving direction of the aluminum plate.

(J-b) Alkali Etching Treatment

The aluminum plate was subjected to an etching treatment by spraying a caustic soda aqueous solution having a caustic soda concentration of 26% by mass and an aluminum ion concentration of 6.5% by mass, to the aluminum plate using a spray at a temperature of 70° C. The amount of aluminum dissolved in the surface to be subsequently subjected to an electrochemical roughening treatment was 10 g/m$^2$.

(J-c) Desmutting Treatment Using Acidic Aqueous Solution

A desmutting treatment was performed by spraying, as an acidic aqueous solution, a waste liquid of nitric acid used for the electrochemical roughening treatment in the subsequent step at a liquid temperature of 35° C., to the aluminum plate using a spray for 3 seconds.

(J-d) Electrochemical Roughening Treatment Using Nitric Acid Aqueous Solution

An electrochemical roughening treatment was continuously performed using an AC voltage of 60 Hz. As an electrolytic solution, an electrolytic solution which had been adjusted to have an aluminum ion concentration of 4.5 g/L by adding aluminum nitrate to an aqueous solution having a nitric acid concentration of 10.4 g/L at a liquid temperature of 35° C. was used. The AC power source waveform is a waveform illustrated in FIG. 1. Further, using a trapezoidal rectangular waveform AC having a time tp, until the current value reached a peak from zero, of 0.8 msec and a duty ratio of 1:1 as the AC power source waveform, the electrochemical roughening treatment was performed using a carbon electrode as a counter electrode. As an auxiliary anode, ferrite was used. An electrolytic cell illustrated in FIG. 2 was used as the electrolytic cell. The current density was 30 A/dm$^2$ in terms of the peak current value, and 5% of the current from the power source was separately flowed to the auxiliary anode. The electric quantity (C/dm$^2$) was 185 C/dm$^2$ as the total electric quantity during the anodization of the aluminum plate.

(J-e) Alkali Etching Treatment

An aluminum plate was subjected to an etching treatment by spraying a caustic soda aqueous solution having a caustic soda concentration of 27% by mass and an aluminum ion concentration of 2.5% by mass, to the aluminum plate using a spray at a temperature of 50° C. The amount of aluminum dissolved was 3.5 g/m$^2$.

(J-f) Desmutting Treatment Using Acidic Aqueous Solution

A desmutting treatment was performed by spraying, as an acidic aqueous solution, an aqueous solution having a sulfuric acid concentration of 170 g/L and an aluminum ion concentration of 5 g/L at a liquid temperature of 30° C., to the aluminum plate using a spray for 3 seconds.

(J-g) Electrochemical Roughening Treatment Using Hydrochloric Acid Aqueous Solution An electrochemical roughening treatment was continuously performed using an AC voltage of 60 Hz. As an electrolytic solution, an electrolytic solution which had been adjusted to have an aluminum ion concentration of 4.5 g/L by adding aluminum chloride to an aqueous solution having 6.2 g/L of hydrochloric acid at a liquid temperature of 35° C. was used. The AC power source waveform is a waveform illustrated in FIG. 1. Further, using a trapezoidal rectangular waveform AC having a time tp, until the current value reached a peak from zero, of 0.8 msec and a duty ratio of 1:1 as the AC power source waveform, the electrochemical roughening treatment was performed using a carbon electrode as a counter electrode. As an auxiliary anode, ferrite was used. An electrolytic cell illustrated in FIG. 2 was used as the electrolytic cell. The current density was 25 A/dm$^2$ in terms of the peak current value, and the electric quantity (C/dm$^2$) in the hydrochloric acid electrolysis was 63 C/dm$^2$ as the total electric quantity during the anodization of the aluminum plate.

(J-h) Alkali Etching Treatment

An aluminum plate was subjected to an etching treatment by spraying a caustic soda aqueous solution having a caustic soda concentration of 5% by mass and an aluminum ion concentration of 0.5% by mass, to the aluminum plate using a spray at a temperature of 60° C. The amount of aluminum dissolved was 0.2 g/m$^2$.

(J-i) Desmutting Treatment Using Acidic Aqueous Solution

A desmutting treatment was performed by spraying, as an acidic aqueous solution, a waste liquid (an aqueous solution having a sulfuric acid concentration of 170 g/L and an aluminum ion concentration of 5 g/L) generated in the anodization treatment step at a liquid temperature of 35° C., to the aluminum plate using a spray for 4 seconds.

(J-j) First Stage Anodization Treatment

A first stage anodization treatment was performed by an anodization device having a structure illustrated in FIG. 3 using DC electrolysis. The anodization treatment was performed using a 170 g/L sulfuric acid aqueous solution as an electrolytic solution under conditions of a liquid temperature of 50° C. and a current density of 30 A/dm$^2$ to form an anodized film having a coating amount of 0.3 g/m$^2$.

(J-k) Pore Widening Treatment

The aluminum plate after being subjected to the anodization treatment was subjected to a pore widening treatment by being immersed in a caustic soda aqueous solution having a caustic soda concentration of 5% by mass and an aluminum ion concentration of 0.5% by mass at a temperature of 40° C. for 3 seconds.

(J-l) Second Stage Anodization Treatment

A second stage anodization treatment was performed by an anodization device having a structure illustrated in FIG. 3 using DC electrolysis. The anodization treatment was performed using a 170 g/L sulfuric acid aqueous solution as an electrolytic solution under conditions of a liquid temperature of 50° C. and a current density of 13 A/dm$^2$ to form an anodized film having a coating amount of 2.1 g/m$^2$ (J-m) Hydrophilization Treatment In order to ensure the hydrophilicity of a non-image area, the aluminum plate was subjected to a silicate treatment by being immersed using 2.5% by mass of a No. 3 sodium silicate aqueous solution at 50° C. for 7 seconds. The adhesion amount of Si was 8.5 mg/m$^2$. The average diameter of the micropores was 30 nm.

<Formation of Undercoat Layer 1>

The support was coated with an undercoat layer coating solution (1) having the following composition such that the dry coating amount was set to 20 mg/m$^2$, thereby forming an undercoat layer 1.

(Undercoat Layer Coating Solution (1))

Compound (UC-1) for undercoat layer (the following structure): 0.18 parts

Hydroxyethyliminodiacetic acid: 0.05 parts

Surfactant (EMALEX 710, manufactured by Nihon Emulsion Co., Ltd.): 0.03 parts

Water: 28.0 parts

Compound (UC-1) for undercoat layer

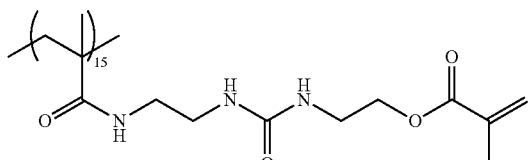

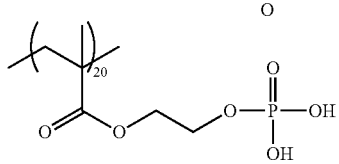

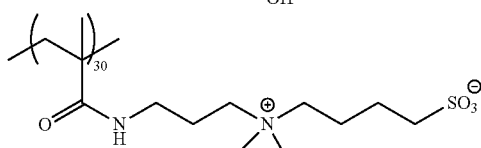

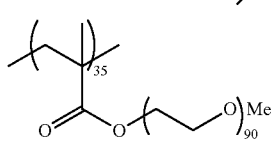

Mw 210,000

<Formation of Undercoat Layer 2>

The support was coated with an undercoat layer coating solution (2) having the following composition such that the dry coating amount was set to 20 mg/m², thereby forming an undercoat layer 2.

(Undercoat Layer Coating Solution (2))

Compound (2) for undercoat layer (the following structure): 0.18 parts

Tetrasodium ethylenediamine tetraacetate: 0.10 parts

Polyoxyethylene lauryl ether: 0.03 parts

Water: 61.39 parts

Compound (2) for undercoat layer

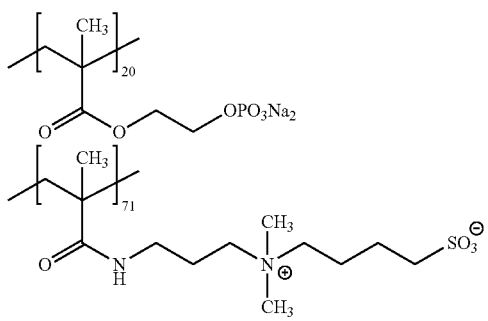

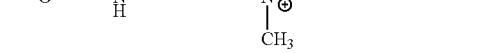

Mw of 100000

The numbers on the lower right side of the parentheses of each constitutional unit in the compound (2) for an undercoat layer indicate the mass ratios and the numbers on the lower right side of the parentheses of each ethyleneoxy unit indicate repetition numbers.

<Formation of Undercoat Layer 3>

The support was coated with an undercoat layer coating solution (3) having the following composition using a wire bar and dried at 90° C. for 30 seconds such that the dry coating amount was set to 0.5 mg/m², thereby forming an undercoat layer 3.

(Undercoat Layer Coating Solution (3))

Polymer compound A (the following structure) (mass average molecular weight: 30000): 0.0049 g Methanol: 55.19 g 1-Methoxy-2-propanol: 0.0154 g Pure water: 6.1432 g Polymer compound A

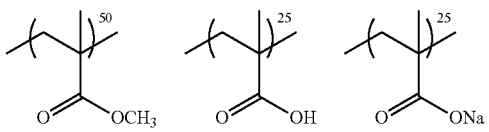

<Formation of Undercoat Layer 4>

The support was coated with an undercoat layer coating solution (4) having the following composition using a bar coater and dried at 80° C. for 15 seconds such that the dry coating amount was set to 18 mg/m², thereby forming an undercoat layer 4.

<Undercoat Layer Coating Solution (4)>

Polymer U (the following structure): 0.3 parts by mass

Pure water: 60.0 parts by mass

Methanol: 939.7 parts by mass

Polymer U

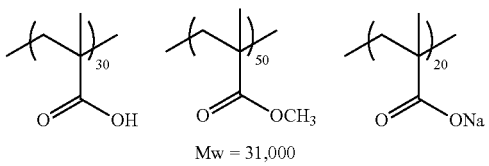

Mw = 31,000

<Formation of Undercoat Layer 5>

The surface of the support 15 on the printing surface side was coated with an undercoat layer coating solution (5) having the following composition such that the dry coating amount was set to 10 mg/m², thereby forming an undercoat layer 5.

<Undercoat Layer Coating Solution (5)>

Compound (2) for undercoat layer (described above): 0.13 parts by mass

Hydroxyethyliminodiacetic acid: 0.05 parts by mass

Tetrasodium ethylenediamine tetraacetate: 0.05 parts by mass

Polyoxyethylene lauryl ether: 0.03 parts by mass

Water: 61.39 parts by mass

<Formation of Image Recording Layer 1>

The support was bar-coated with an image recording layer coating solution (1) having the following composition and dried in an oven at 100° C. for 60 seconds, thereby forming an image recording layer 1 having a thickness of 0.6 μm.

(Image Recording Layer Coating Solution (1))

Infrared absorbing agent 4 (the following structure): 0.030 parts

Polymerization initiator I (the following structure): 0.032 parts

Polymerizable compound (1) A-9300 (manufactured by Shin-Nakamura Chemical Co., Ltd.) (the following structure): 0.05 parts Polymerizable compound (2) A-DPH (manufactured by Shin-Nakamura Chemical Co., Ltd.) (the following structure): 0.05 parts Binder polymer 3 (described below): 0.825 parts Surfactant BYK306 (manufactured by BYK Chemie GmbH): 0.008 parts 1-Methoxy-2-propanol: 8.609 parts Methyl ethyl ketone: 1.091 parts

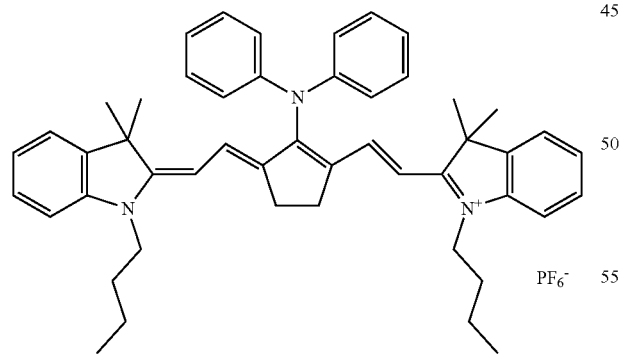

Infrared absorbing agent 4

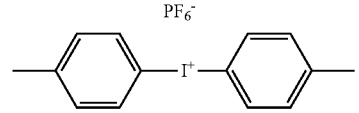

Polymerization initiator I

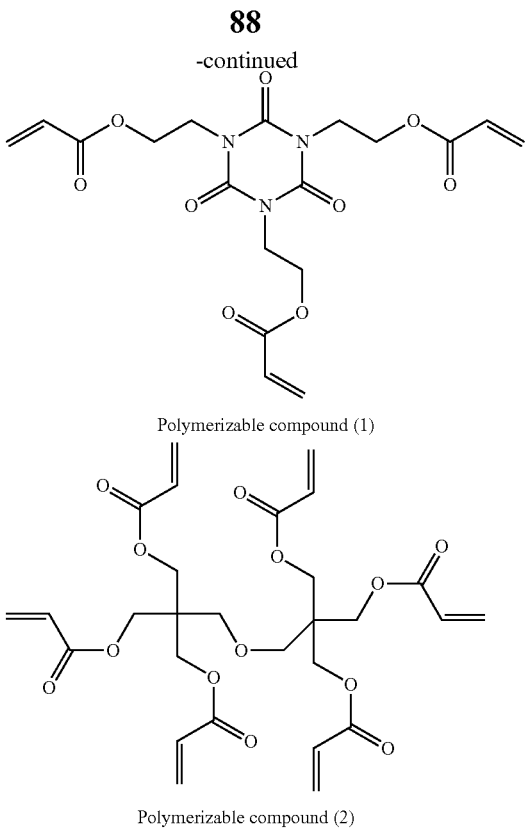

Polymerizable compound (1)

Polymerizable compound (2)

(Synthesis of Binder Polymer 3)

300 g of methyl ethyl ketone was poured into a three-neck flask and heated to 80° C. in a nitrogen stream. A mixed solution consisting of 50.0 g of the following compound 1, 30.0 g of the following compound 2, 20.0 g of the following compound 3, 0.7 g of azobisisobutyronitrile (AIBN), and 100 g of methyl ethyl ketone was added dropwise to the reaction container for 30 minutes. After the completion of the dropwise addition, the reaction was allowed to further continue for 7.5 hours. Thereafter, 0.3 g of AIBN was added thereto, and the reaction was allowed to further continue for 12 hours. After the completion of the reaction, the reaction solution was cooled to room temperature, thereby obtaining a binder polymer 3. The mass average molecular weight of the obtained binder polymer 3 was 75000.

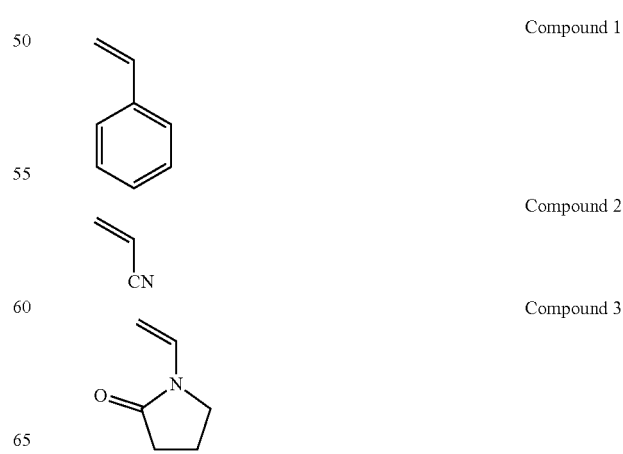

Compound 1

Compound 2

Compound 3

89

<Formation of Image Recording Layer 2>

The undercoat layer was bar-coated with an image recording layer coating solution (2) having the following composition and dried in an oven at 100° C. for 60 seconds, thereby forming an image recording layer 2 having a thickness of 1 μm.

The image recording layer coating solution (2) was obtained by mixing a photosensitive solution (1) and a microgel solution (1) described below immediately before the coating and then stirring the solution.

(Image Recording Layer Coating Solution (2))

(Photosensitive Solution (1))

Binder polymer (1) (the following structure, Mw: 55000 and n (number of ethylene oxide (EO) repeating units): 2): 0.240 parts Infrared absorbing agent (1) (the following structure): 0.020 parts Borate compound (1) (Sodium tetraphenyl borate): 0.010 parts Polymerization initiator (1) (the following structure): 0.162 parts Polymerizable compound (tris(acryloyloxyethyl) isocyanurate, NK ESTER A-9300, manufactured by Shin-Nakamura Chemical Co., Ltd.): 0.192 parts Anionic surfactant 1 (the following structure): 0.050 parts Fluorine-based surfactant (1) (the following structure): 0.008 parts 2-Butanone: 1.091 parts 1-Methoxy-2-propanol: 8.609 parts (Microgel Solution (1))

Microgel (1): 2.640 parts

Distilled water: 2.425 parts

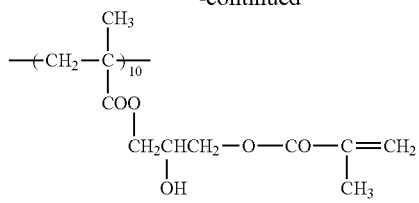

Polymer moiety described above

Binder polymer (1)

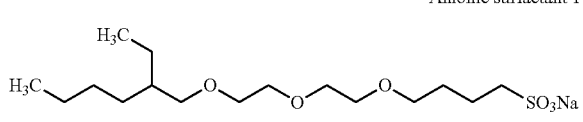

90

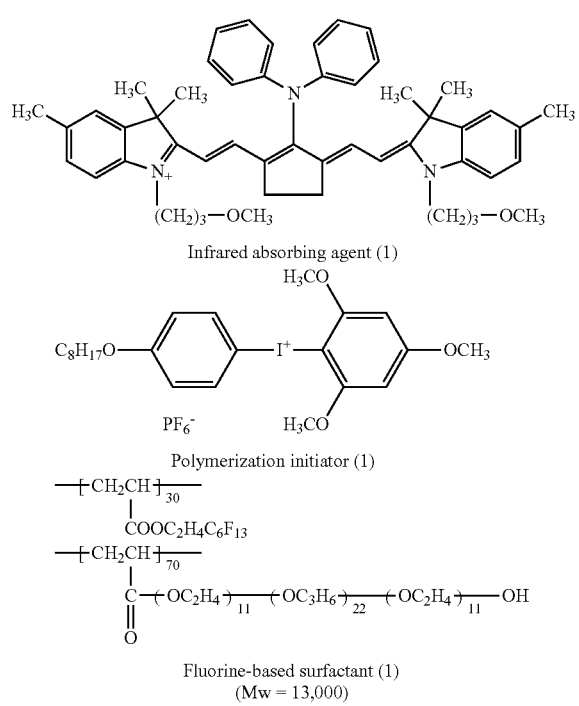

The numbers on the lower right side of the parentheses of each constitutional unit in the binder polymer (1) indicate the molar ratios. Me represents a methyl group.

The numbers on the lower right side of the parentheses of each constitutional unit in the fluorine-based surfactant (1) indicate the molar ratios and the numbers on the lower right side of the parentheses of each ethyleneoxy unit or each propyleneoxy unit indicate repetition numbers.

(Preparation of Microgel (1))

A method of preparing a microgel (1) used for the microgel solution (1) will be described below.

<Preparation of Polyvalent Isocyanate Compound (1)>

0.043 parts of bismuth tris(2-ethylhexanoate) (NEOSTANN U-600 (manufactured by NITTO KASEI CO., LTD.)) was added to an ethyl acetate (25.31 parts) suspension solution of 17.78 parts (80 molar equivalent) of isophorone diisocyanate and 7.35 parts (20 molar equivalent) of the following polyhydric phenol compound (1), and the resulting solution was stirred. The reaction temperature was set to 500 in a case of heat generation being subsided, and the solution was stirred for 3 hours, thereby obtaining an ethyl acetate (50% by mass) solution of a polyvalent isocyanate compound (1).

Polyhydric phenol compound (1)

<Preparation of Microgel (1)>

The oil phase components and the water phase components were mixed with each other and emulsified at 12000 rpm for 10 minutes using a homogenizer. The obtained emulsion was stirred at 45° C. for 4 hours, 5.20 parts of a 10 mass % aqueous solution of 1,8-diazabicyclo[5.4.0]undeca-7-ene-octylate (U-CAT SA102, manufactured by San-Apro Ltd.) was added thereto, and the solution was stirred at room temperature for 30 minutes and allowed to stand at 45° C. for 24 hours. The concentration of solid contents was adjusted to 20% by mass using distilled water, thereby obtaining an aqueous dispersion liquid of the microgel (1). The volume average particle diameter was measured using a dynamic light scattering type particle size distribution measuring device LB-500 (manufactured by Horiba Ltd.) according to a light scattering method, and the value was 0.28 μm.

(Oil Phase Components)

(Component 1) ethyl acetate: 12.0 parts (Component 2) adduct (50 mass % ethyl acetate solution, manufactured by Mitsui Chemicals, Inc.) obtained by adding trimethylolpropane (6 mol) and xylene diisocyanate (18 mol) and adding methyl one-terminal polyoxyethylene (1 mol, repetition number of oxyethylene units: 90) thereto: 3.76 parts (Component 3) polyvalent isocyanate compound (1) (as 50 mass % ethyl acetate solution): 15.0 parts (Component 4) 65 mass % solution of dipentaerythritol pentaacrylate (SR-399, manufactured by Sartomer Japan Inc.) in ethyl acetate: 11.54 parts (Component 5) 10% solution of sulfonate type surfactant (PIONINE A-41-C, manufactured by TAKEMOTO OIL & FAT Co., Ltd.) in ethyl acetate: 4.42 parts (Water Phase Components)

Distilled water: 46.87 parts

<Formation of Image Recording Layer 3>

The undercoat layer was bar-coated with an image recording layer coating solution (3) having the following composition and dried in an oven at 100° C. for 60 seconds, thereby forming an image recording layer 3 having a thickness of 1 μm.

The image recording layer coating solution (3) was obtained by mixing a photosensitive solution (2) and a microgel solution (2) described below immediately before the coating and then stirring the solution.

<Photosensitive Solution (2)>

Binder polymer (2) (the following structure, Mw: 50000 and n (number of ethylene oxide (EO) repeating units): 4): 0.480 parts Infrared absorbing agent (1) (described above): 0.030 parts Borate compound (Sodium tetraphenyl borate): 0.014 parts Polymerization initiator (1) (described above): 0.234 parts Polymerizable compound (tris(acryloyloxyethyl) isocyanurate, NK ESTER A-9300, manufactured by Shin-Nakamura Chemical Co., Ltd.): 0.192 parts Low-molecular-weight hydrophilic compound (1) (tris (2-hydroxyethyl)isocyanurate): 0.052 parts Anionic surfactant 1 (described above): 0.099 g Oil sensitizer phosphonium compound (1) (the following structure): 0.12 parts Oil sensitizer ammonium group-containing polymer (the following structure, reduced specific viscosity of 44 ml/g): 0.035 parts Oil sensitizer benzyl dimethyl octyl ammonium $PF_6$ salt: 0.032 parts Colorant ethyl violet (the following structure): 0.030 parts Fluorine-based surfactant (1) (described above): 0.02 parts 2-Butanone: 1.091 parts 1-Methoxy-2-propanol: 8.609 parts Polymer moiety described above Binder polymer (2)

Ammonium group-containing polymer

-continued

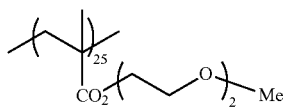

The numbers on the lower right side of the parentheses of each constitutional unit in the binder polymer (2) and the ammonium group-containing polymer indicate the molar ratios. Me represents a methyl group.

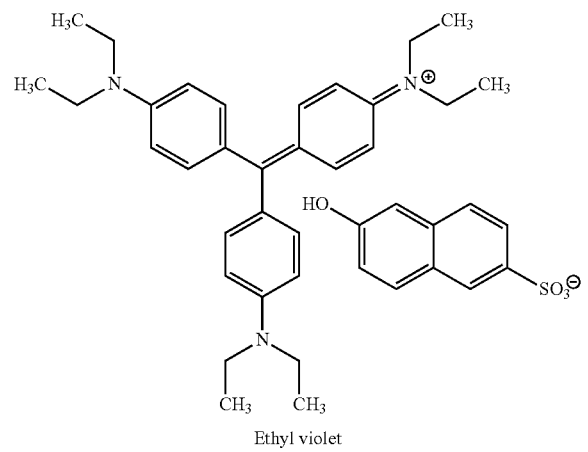

Ethyl violet

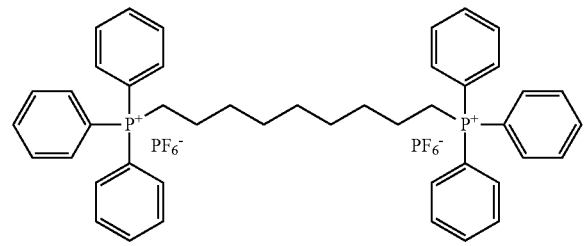

Phosphonium compound (1)

<Microgel Solution (2)>
Microgel (2): 1.580 parts
Distilled water: 1.455 parts
(Preparation of Microgel (2))

A method of preparing a microgel (2) used in the microgel solution (2) will be described below.

10 parts of an adduct (TAKENATE D-110N, manufactured by Mitsui Chemicals polyurethanes, Inc.) of trimethylolpropane and xylene diisocyanate, 5.54 parts of dipentaerythritol pentaacrylate (SR399, manufactured by Sartomer Japan Inc.), and 0.1 parts of PIONINE A-41C (manufactured by TAKEMOTO OIL & FAT Co., Ltd.), as oil phase components, were dissolved in 17 parts of ethyl acetate. As a water phase component, 40 parts of a 4 mass % aqueous solution of PVA-205 was prepared. The oil phase components and the water phase components were mixed with each other and emulsified at 12000 rpm for 10 minutes using a homogenizer. 25 parts of distilled water was added to the obtained emulsion, and the resultant was stirred at room temperature (25° C., the same applies hereinafter) for 30 minutes and stirred at 50° C. for 3 hours. The microgel solution obtained in this manner was diluted with distilled water such that the concentration of solid contents was set to 15% by mass, thereby preparing a microgel (2). The average particle diameter of the microgel measured by a light scattering method was 0.2 mm.

<Formation of Image Recording Layer 4>

The support was bar-coated with an image recording layer coating solution (4) having the following composition and dried in an oven at 120° C. for 40 seconds, thereby forming an image recording layer 4 having a thickness of 1 µm.

<Image Recording Layer Coating Solution (4)>
Binder polymer (4) (the following structure): 4.09 parts by mass
SR399: 2.66 parts by mass
NK-Ester A-DPH: 2.66 parts by mass
CD9053: 0.53 parts by mass
Bis-t-butylphenyliodonium tetraphenylborate: 0.96 parts by mass
Fluor N2900: 0.11 parts by mass
Pigment 1 (described below): 0.73 parts by mass
Infrared absorbing agent (4) (the following structure): 0.27 parts by mass
PHOSMER PE (manufactured by Uni-Chemical Co., Ltd.): 0.55 parts by mass
Ion exchange water: 13.77 parts
1-Methoxy-2-propanol: 48.18 parts by mass
2-Butyrolactone: 13.77 parts by mass
2-Butanone: 61.94 parts by mass

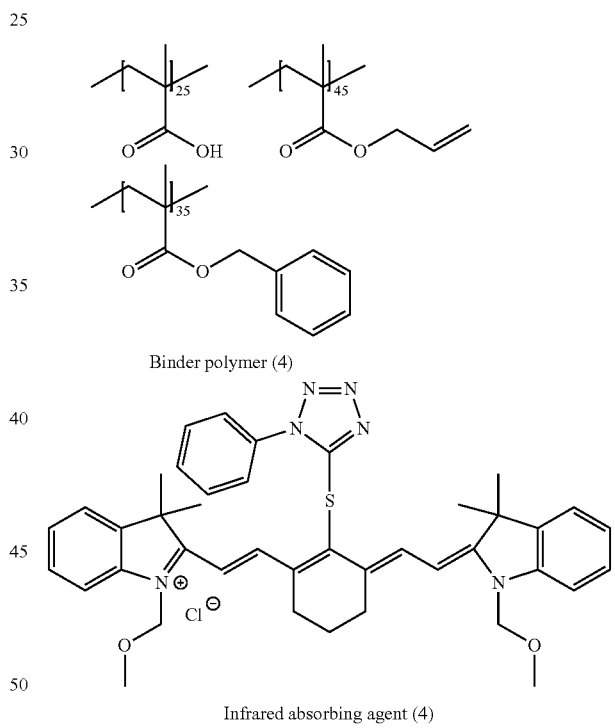

Binder polymer (4)

Infrared absorbing agent (4)

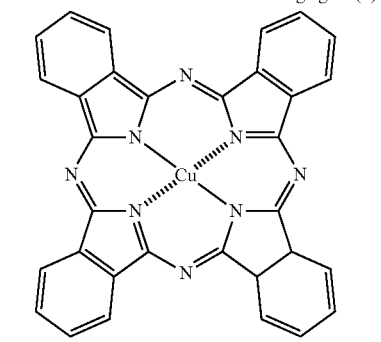

Irgalith Blue GLVO
(C.I. Pigment Blue 15:4):76.9% by mass

-continued

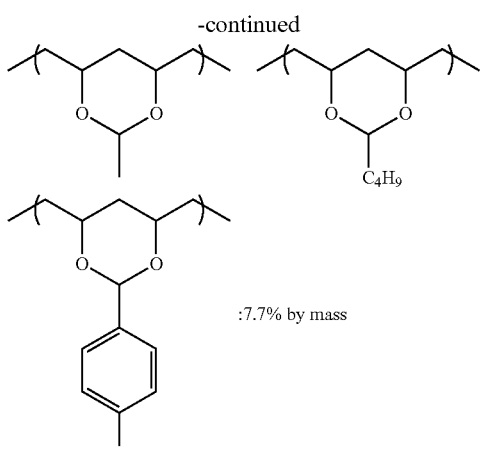

:7.7% by mass

Disperbyk 167:15.4% by mass
Pigment 1

Pigment 1 is a mixture consisting of the above-described components (a pigment, a polymer, and a dispersant). Disperbyk 167 is a dispersant available from BYK Chemie GmbH.

SR-399: Dipentaerythritol pentaacrylate (manufactured by Sartomer Japan Inc.)

NK-Ester A-DPH: Dipentaerythritol hexaacrylate (manufactured by Shin-Nakamura Chemical Co., Ltd.)

CD9053: Acid-modified acrylate (trifunctional) (manufactured by Sartomer Japan Inc.)

Fluor N2900: surfactant (available from Cytonix Corporation)

PHOSMER PE (manufactured by Uni-chemical Co., Ltd.): the following structure

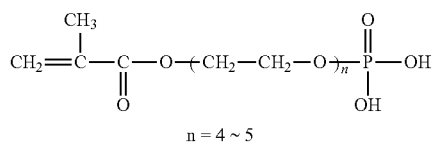

n = 4 ~ 5

<Formation of Image Recording Layer 5>

The support was bar-coated with an image recording layer coating solution (5) having the following composition and dried in an oven at 90° C. for 60 seconds, thereby forming an image recording layer 5 having a thickness of 1.3 μm.

<Image Recording Layer Coating Solution (5)>
Binder polymer (4) (described above): 0.23 parts by mass
Urethane methacrylate oligomer (formed by reacting glycerol dimethyl acrylate, glycerol monomethyl acrylate, propylene glycol methacrylate, and hexamethylene diisocyanate): 0.38 parts by mass
Ethoxylated bisphenol A diacrylate (manufactured by Shin-Nakamura Chemical Co., Ltd.: NK ESTER BPE500): 0.06 parts by mass
Polymerization initiator (5) (the following structure): 0.07 parts by mass
Sensitizing dye (5) (the following structure): 0.04 parts by mass
Chain transfer agent (mercaptobenzothiazole): 0.005 parts by mass
Pigment (polymer dispersion of Heliogen Blue 7565): 0.038 parts by mass Surfactant (manufactured by BYK Chemie GmbH: BYK307): 0.002 parts by mass
Phenoxyethanol: 10.35 parts by mass
Acetone: 1.15 parts by mass

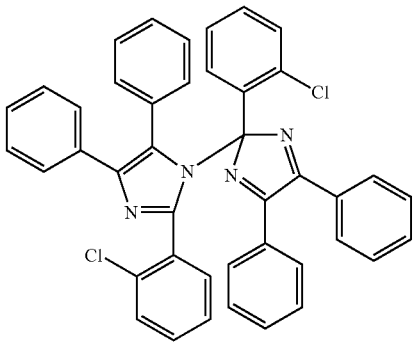

Polymerization initiator (5)

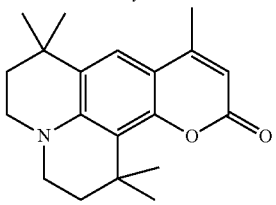

Sensitizing dye (5)

<Formation of Image Recording Layer 6>

A water-based coating solution for an image recording layer containing components such as the thermoplastic resin particles and the infrared absorbing agent shown below was prepared, and the pH thereof was adjusted to 3.6, the support was coated with the coating solution, and dried at 50° C. for 1 minute, thereby forming an image recording layer 6 having a thickness of 0.69 μm.

(Components in Water-Based Coating Solution for Image Recording Layer)
Thermoplastic resin particles (styrene/acrylonitrile copolymer (molar ratio of 50/50), average particle diameter: 61 nm): coating amount: 0.6927 (g/m$^2$)
Polyacrylic acid (Mw: 250000): coating amount: 0.09 (g/m$^2$)
Surfactant (Zonyl FSO100, manufactured by DuPont): coating amount: 0.0075 (g/m$^2$)
Infrared absorbing agent IR-01 (the following structure, Et represents an ethyl group): coating amount: $1.03 \times 10^{-4}$ (mol/m$^2$)

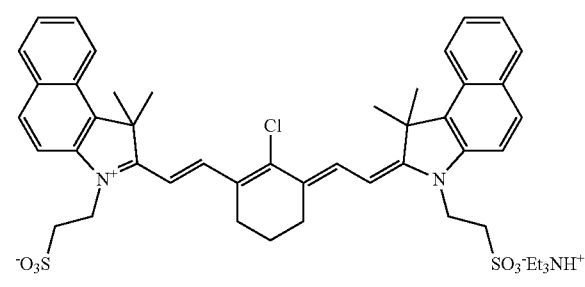

Infrared absorbing agent IR-01

<Formation of Image Recording Layer 7>

The undercoat layer was coated with an image recording layer coating solution (7) having the following composition using a wire bar and dried at 115° C. for 34 seconds using a warm air dryer, thereby forming an image recording layer 7 having a thickness of 1 μm.

(Image Recording Layer Coating Solution (7))
Methyl ethyl ketone: 2.887 g
1-Methoxy-2-propanol: 3.275 g
Methanol 1.176 g
Binder polymer 1 (the following structure): 0.066 g
Binder polymer 2 (the following structure): 0.079 g
Binder polymer 3 (the following structure, 30 mass % solution in methyl ethyl ketone): 0.350 g
Binder polymer 4 (the following structure, 9.5 mass % solution in methyl ethyl ketone/cyclohexanone): 0.350 g
Polymerizable compound (the following structure, 85 mass % solution in 1-methoxy-2-propanol): 0.463 g
Infrared absorbing agent (the following structure): 0.024 g
Polymerization initiator 1 (the following structure): 0.090 g
Polymerization initiator 2 (the following structure): 0.064 g
Sensitizing assistant (the following structure): 0.074 g
Polymerization inhibitor (the following structure): 0.001 g
Mercapto compound (the following structure): 0.023 g
Additive 1 (the following structure): 0.025 g
  Fluorine-based surfactant (the following structure, MEGAFACE F-780-F, manufactured by DIC Corporation, 10 mass % solution in methyl ethyl ketone): 0.010 g
Pigment dispersion (the following structure, concentration of solid contents: 22.5% by mass, methyl ethyl ketone: 31% by mass, 1-methoxy-2-propanol: 31% by mass, methanol: 15.5% by mass): 0.490 g

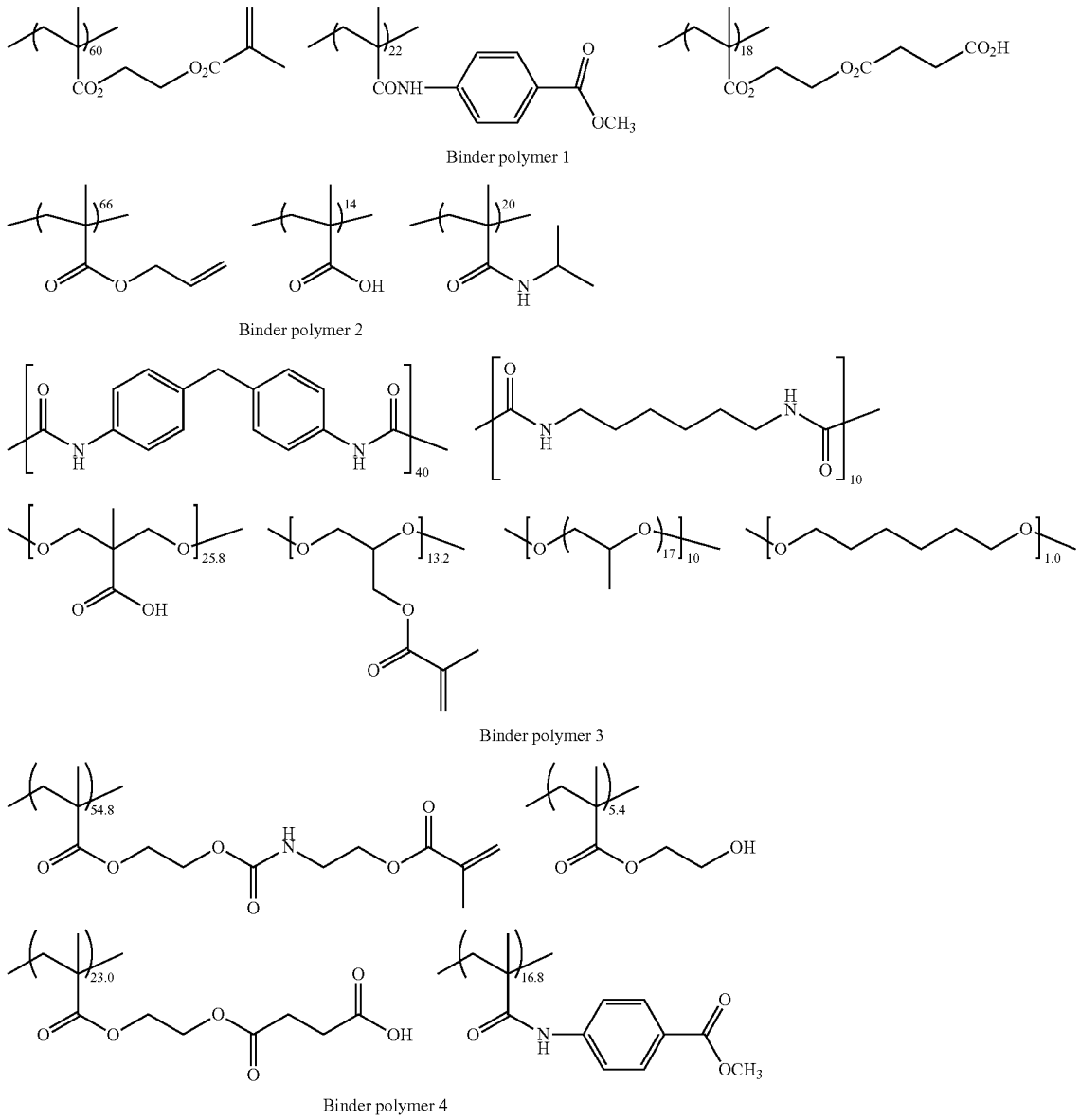

Binder polymer 1

Binder polymer 2

Binder polymer 3

Binder polymer 4

-continued
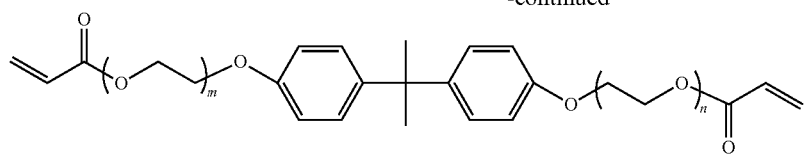
Polymerizable compound
m + n = 4
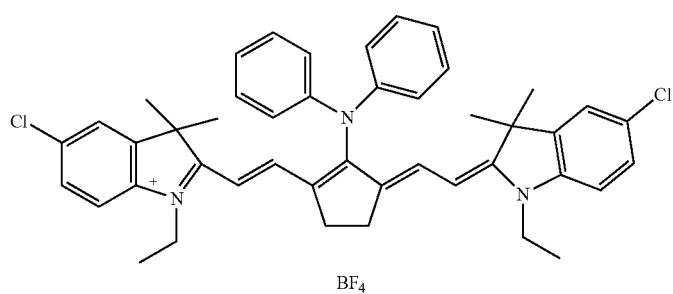
BF₄
Infrared absorbing agent
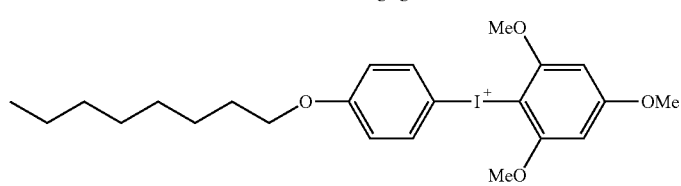
Polymerization initiator 1
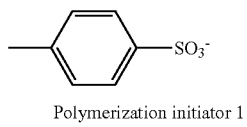
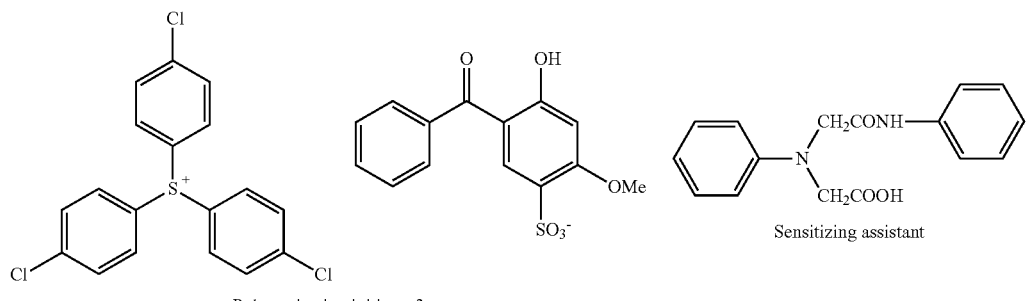
Polymerization initiator 2
Sensitizing assistant
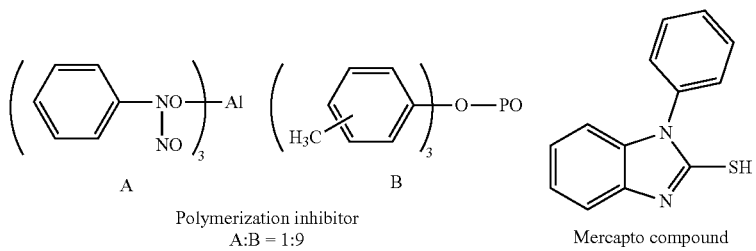
A
Polymerization inhibitor
A:B = 1:9
Mercapto compound
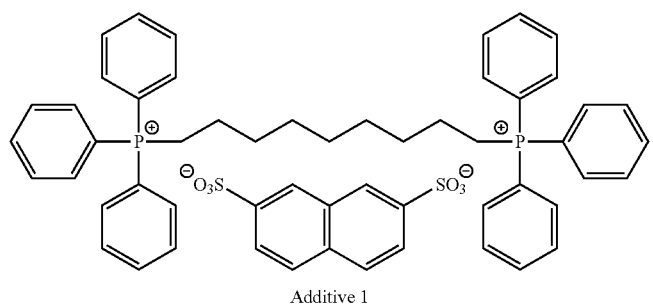
Additive 1

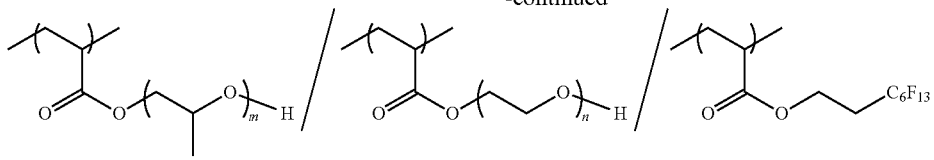

Fluorine-based surfactant

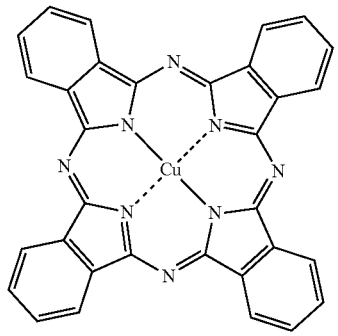

Pigment dispersion

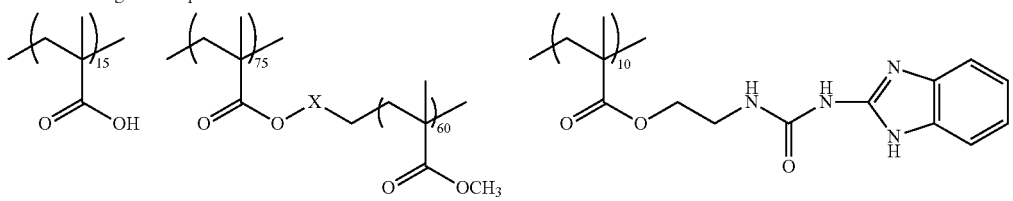

C.I. Pigment Blue 15:6
15 wt %
Dispersant A
6.75 wt %

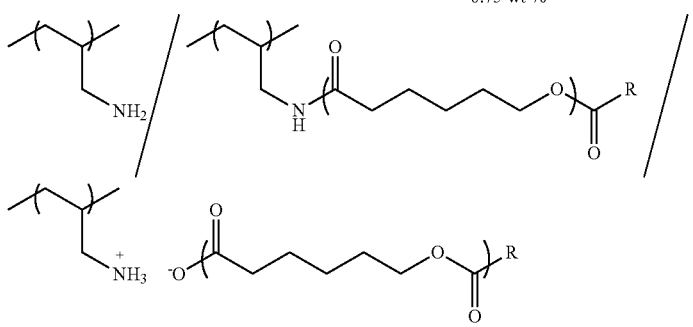

Dispersant B
0.75 wt %

<Formation of Non-Photosensitive Layer 8>

The undercoat layer was bar-coated with a non-photosensitive layer coating solution (8) having the following composition and dried at 100° C. for 60 seconds, thereby forming a non-photosensitive layer 8 having a thickness of 0.5 μm.

(Non-Photosensitive Layer Coating Solution (8))

Binder polymer A (the following structure): 2.465 parts by mass

Phosphoric acid (85 mass % aqueous solution): 0.08 parts by mass

Sulfophthalic acid (50 mass % aqueous solution): 0.017 parts by mass

Tricarballylic acid: 0.017 parts by mass

Colorant (VPB-Naps (naphthalene sulfonate of Victoria Pure Blue, manufactured by Hodogaya Chemical Co., Ltd.): 0.0014 parts by mass Fluorine-based surfactant (MEGAFACE F-780-F, manufactured by DIC Corporation, 30 mass % solution in MEK): 0.009 parts by mass Methyl ethyl ketone (MEK): 7.93 parts by mass Methanol: 6.28 parts by mass 1-Methoxy-2-propanol (MFG): 2.01 parts by mass The binder polymer A is a 16 mass % solution containing MFG/MEK at a ratio of 1/1 of a condensation reaction product (mass average molecular weight: 85000, acid content: 1.64 meq/g) of four types of monomers (1) to (4) described below.

(1) 4,4-Diphenylmethane diisocyanate: 37.5% by mole (2) Hexamethylene diisocyanate: 12.5% by mole (3) 2,2-Bis(hydroxymethyl)propionic acid: 32.5% by mole (4) Tetraethylene glycol: 17.5% by mole <Formation of Image Recording Layer 9>

The undercoat layer was bar-coated with an image recording layer coating solution (9) having the following composition and dried in an oven at 100° C. for 60 seconds, thereby forming an image recording layer 9 having a thickness of 1.2 μm.

The image recording layer coating solution (9) was obtained by mixing a photosensitive solution (3) and a microgel solution (4) described below immediately before the coating and then stirring the solution.

(Photosensitive Solution (3))

Binder polymer (6) 23 mass % 1-methoxy-2-propanol solution (the following structure, Mw: 35000, n (number of ethylene oxide (EO) repeating units): 0.300 parts Binder polymer (7) 23 mass % 1-methoxy-2-propanol solution (the following structure, Mw: 15000, n (number of ethylene oxide (EO) repeating units): 0.450 parts Infrared absorbing agent (1) (the following structure): 0.0306 parts Borate compound (1) (Sodium tetraphenyl borate): 0.0135 parts Polymerization initiator (1) (the following structure): 0.2113 parts Polymerizable compound (1) (tris(acryloyloxyethyl) isocyanurate, NK ESTER A-9300, 40% 2-butanone solution, manufactured by Shin-Nakamura Chemical Co., Ltd.): 0.2875 parts Low-molecular-weight hydrophilic compound (1) (tris (2-hydroxyethyl)isocyanurate): 0.0287 parts Low-molecular-weight hydrophilic compound (2) (trimethylglycine): 0.0147 parts Ultraviolet absorbing agent (1) (TINUVIN405, manufactured by BASF SE) (the following structure): 0.04 parts Fluorine-based surfactant (1) (the following structure): 0.004 parts Phosphonium compound (1) (the following structure): 0.020 parts Antioxidant 2,5-di-t-pentylhydroquinone (the following structure): 0.008 parts Polymerization inhibitor 4-methoxy-1-naphthol (the following structure): 0.004 parts 2-Butanone: 5.346 parts 1-Methoxy-2-propanol: 3.128 g Methanol: 0.964 parts Pure water: 0.036 parts <Synthesis of Binder Polymer (6)>

78.0 g of 1-methoxy-2-propanol was weighed in a three-neck flask and heated to 70° C. in a nitrogen stream. A mixed solution consisting of 52.1 g of BLEMMER PME-100 (methoxydiethylene glycol monomethacrylate, manufactured by NOF Corporation), 21.8 g of methyl methacrylate, 14.2 g of methacrylic acid, 2.15 g of hexakis(3-mercaptopropionic acid)dipentaerythritol, 0.38 g of V-601 (dimethyl 2,2'-azobis(isobutyrate), manufactured by FUJIFILM Wako Pure Chemical Corporation), and 54 g of 1-methoxy-2-propanol was added dropwise to the reaction container for 2 hours and 30 minutes. After the completion of the dropwise addition, the solution was heated to 80° C. and allowed to continuously react for 2 hours. A mixed solution consisting of 0.04 g of V-601 and 4 g of 1-methoxy-2-propanol was added thereto, and the resulting solution was heated to 90° C. and allowed to continuously react for 2.5 hours. After the completion of the reaction, the reaction solution was cooled to room temperature.

137.2 g of 1-methoxy-2-propanol, 0.24 g of 4-hydroxytetramethylpiperidine-N-oxide, 26.0 g of glycidyl methacrylate, and 3.0 g of tetraethylammonium bromide were added to the reaction solution, and the resulting solution was sufficiently stirred and heated at 90° C.

After 18 hours, the reaction solution was cooled to room temperature (25° C.) and diluted with 99.4 g of 1-methoxy-2-propanol.

The concentration of solid contents in the binder polymer (6) which had been obtained in the above-described manner was 23% by mass, and the weight-average molecular weight thereof in terms of polystyrene which had been measured by GPC was 35000.

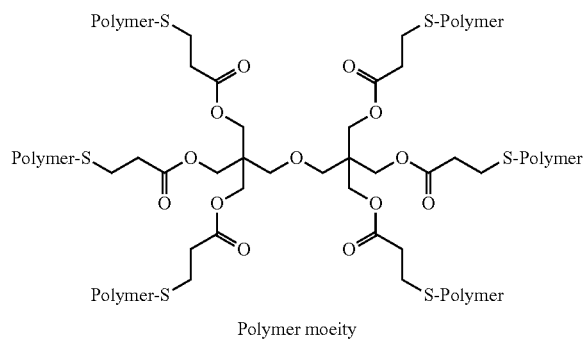

Polymer moeity

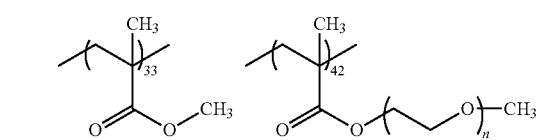

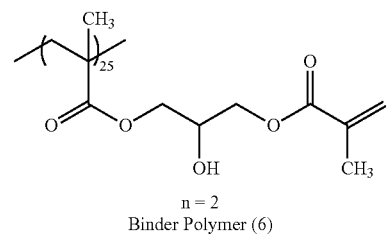

n = 2
Binder Polymer (6)

<Synthesis of Binder Polymer (7)>

78.00 g of 1-methoxy-2-propanol was weighed in a three-neck flask and heated to 70° C. in a nitrogen stream. A mixed solution consisting of 52.8 g of BLEMMER PME-100 (methoxydiethylene glycol monomethacrylate, manufactured by NOF Corporation), 2.8 g of methyl methacrylate, 25.0 g of methacrylic acid, 6.4 g of hexakis(3-mercaptopropionic acid)dipentaerythritol, 1.1 g of V-601 (dimethyl 2,2'-azobis(isobutyrate), manufactured by FUJIFILM Wako Pure Chemical Corporation), and 55 g of 1-methoxy-2-propanol was added dropwise to the reaction container for 2 hours and 30 minutes. After the completion of the dropwise addition, the solution was heated to 80° C. and allowed to continuously react for 2 hours. After 2 hours, a mixed solution consisting of 0.11 g of V-601 and 1 g of 1-methoxy-2-propanol was added thereto, and the resulting solution was heated to 90° C. and allowed to continuously react for 2.5 hours. After the completion of the reaction, the reaction solution was cooled to room temperature.

177.2 g of 1-methoxy-2-propanol, 0.28 g of 4-hydroxytetramethylpiperidine-N-oxide, 46.0 g of glycidyl methacrylate, and 3.4 g of tetrabutylammonium bromide were added to the reaction solution, and the resulting solution was sufficiently stirred and heated at 90° C.

After 18 hours, the reaction solution was cooled to room temperature (25° C.) and diluted with 0.06 g of 4-methoxyphenol and 114.5 g of 1-methoxy-2-propanol.

The concentration of solid contents in the binder polymer (7) which had been obtained in the above-described manner was 23% by mass, and the weight-average molecular weight thereof in terms of polystyrene which had been measured by GPC was 15000.

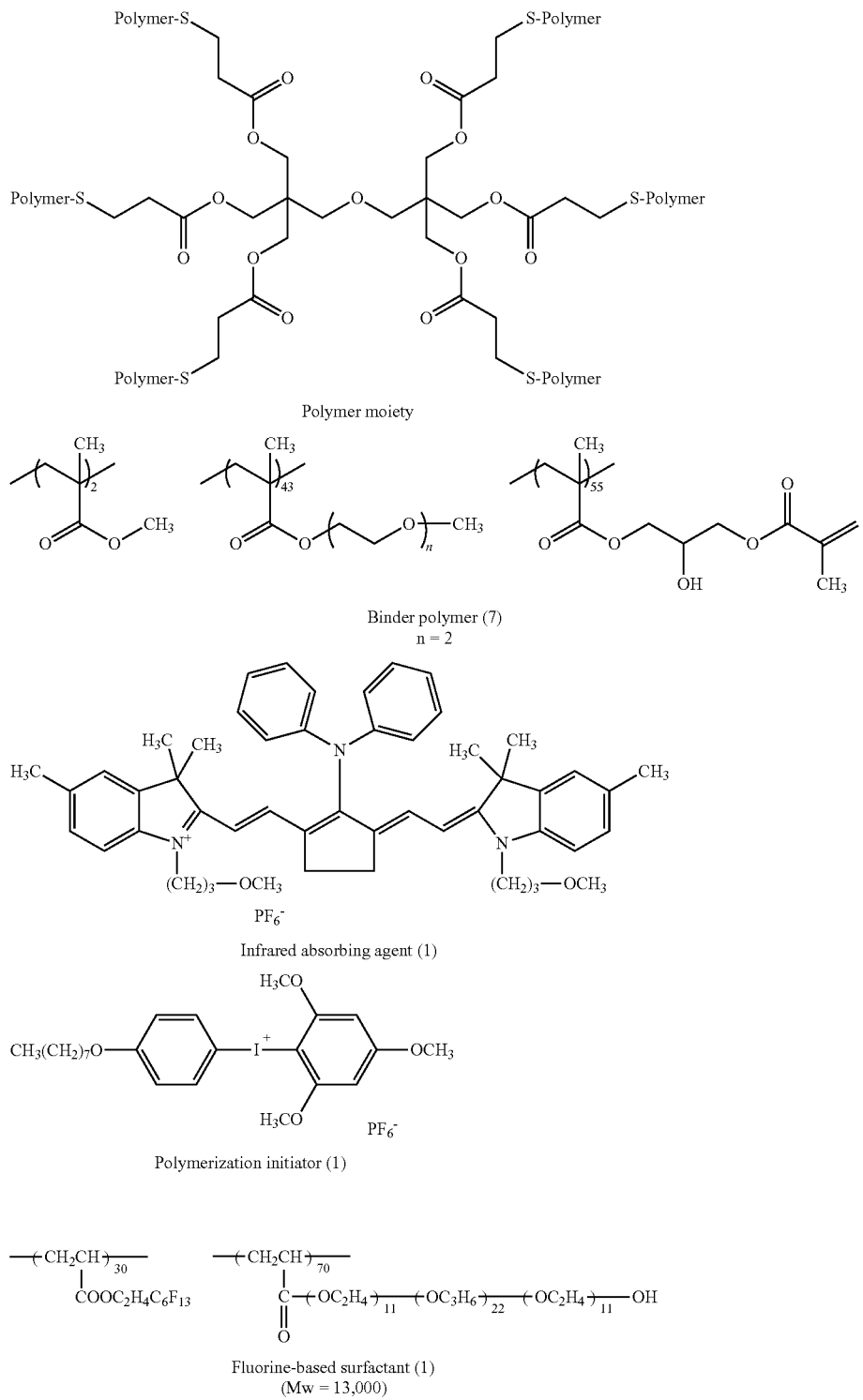

-continued

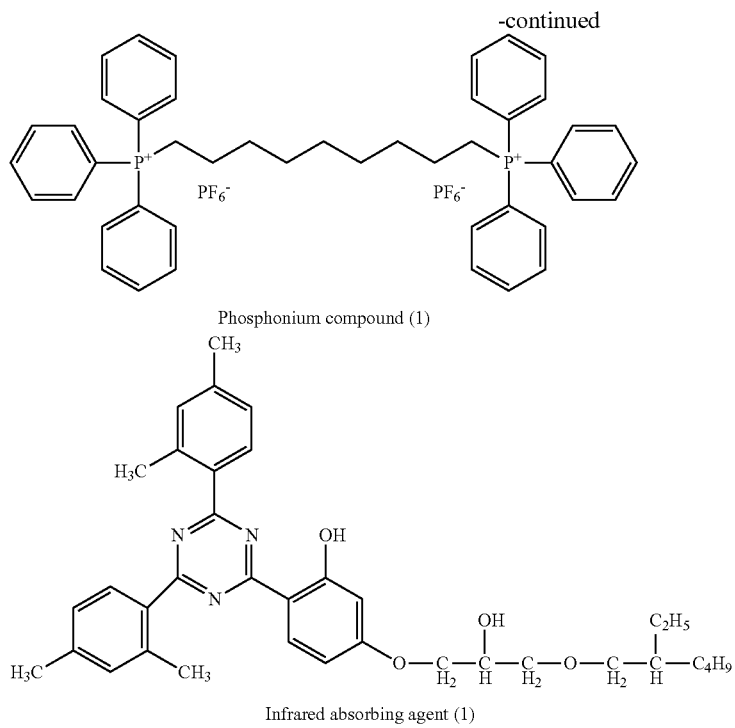

Phosphonium compound (1)

Infrared absorbing agent (1)

Low-molecular-weight hydrophilic compound (1)

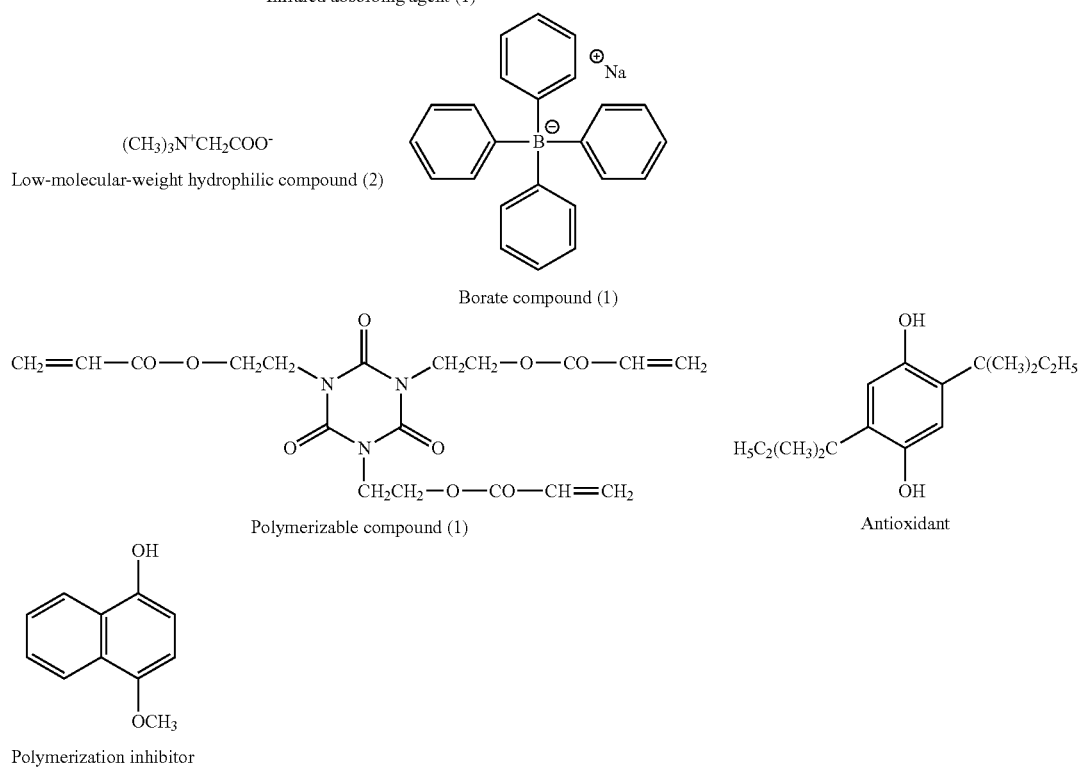

$(CH_3)_3N^+CH_2COO^-$

Low-molecular-weight hydrophilic compound (2)

Borate compound (1)

Polymerizable compound (1)

Antioxidant

Polymerization inhibitor (Microgel Solution (4))

Microgel (4) (concentration of solid contents: 21.8% by mass): 2.243 parts

1-Methoxy-2-propanol: 0.600 parts

A method of preparing a microgel (4) used in the microgel solution (4) will be described below.

<Preparation of Polyvalent Isocyanate Compound (1)>

0.043 parts of bismuth tris(2-ethylhexanoate) (NEOSTANN U-600 (manufactured by NITTO KASEI CO., LTD.)) was added to an ethyl acetate (25.31 parts) suspension solution of 17.78 parts (80 molar equivalent) of isophorone diisocyanate and 7.35 parts (20 molar equivalent) of the following polyhydric phenol compound (1), and the resulting solution was stirred. The reaction temperature was set to 50° in a case of heat generation being subsided, and the solution was stirred for 3 hours, thereby obtaining an ethyl acetate (50% by mass) solution of a polyvalent isocyanate compound (1).

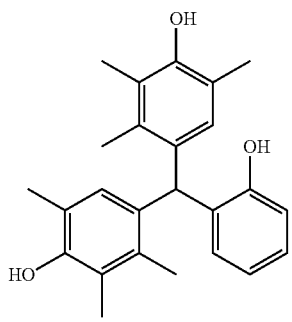

Polyhydric phenol compound (1)

<Preparation of Microgel (4)>

The oil phase components and the water phase components were mixed with each other and emulsified at 12000 rpm for 10 minutes using a homogenizer. The obtained emulsion was stirred at 45° C. for 4 hours, 5.20 parts of a 10 mass % aqueous solution of 1,8-diazabicyclo[5.4.0]undeca-7-ene-octylate (U-CAT SA102, manufactured by San-Apro Ltd.) was added thereto, and the solution was stirred at room temperature for 30 minutes and allowed to stand at 45° C. for 24 hours. The concentration of solid contents was adjusted to 21.8% by mass using distilled water, thereby obtaining an aqueous dispersion liquid of the microgel (4). The volume average particle diameter was measured using a dynamic light scattering type particle size distribution measuring device LB-500 (manufactured by Horiba Ltd.) according to a light scattering method, and the value was 0.28 μm.

(Oil Phase Components)

(Component 1) ethyl acetate: 12.0 parts (Component 2) adduct (50 mass % ethyl acetate solution, manufactured by Mitsui Chemicals, Inc.) obtained by adding trimethylolpropane (6 mol) and xylene diisocyanate (18 mol) and adding methyl one-terminal polyoxyethylene (1 mol, repetition number of oxyethylene units: 90) thereto: 3.76 parts (Component 3) polyvalent isocyanate compound (1) (as 50 mass % ethyl acetate solution): 15.0 parts (Component 4) 65 mass % solution of dipentaerythritol pentaacrylate (SR-399, manufactured by Sartomer Japan Inc.) in ethyl acetate: 11.54 parts (Component 5) 10% solution of sulfonate type surfactant (PIONINE A-41-C, manufactured by TAKEMOTO OIL & FAT Co., Ltd.) in ethyl acetate: 4.42 parts (Water Phase Components)

Distilled water: 46.87 parts

<Formation of Protective Layer 1>

The image recording layer was bar-coated with a protective layer coating solution (1) having the following composition and dried in an oven at 120° C. for 60 seconds, thereby forming a protective layer 1 having the thickness listed in Table A.

(Protective Layer Coating Solution (1))

Polyvinyl alcohol (POVAL PVA105, manufactured by Kuraray Co., Ltd.): 0.6 parts by mass Polyethylene glycol (PEG4000, manufactured by Tokyo Chemical Industry Co., Ltd.): 0.39 parts by mass Surfactant (RAPISOL A-80 (described below), manufactured by NOF Corporation): 0.01 parts by mass Water: 9 parts by mass

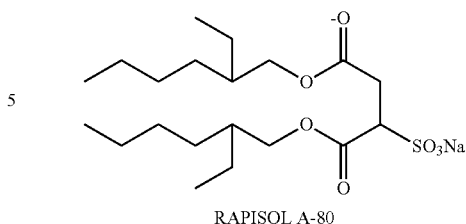

RAPISOL A-80

<Formation of Protective Layer 2>

The image recording layer was bar-coated with a protective layer coating solution (2) having the following composition and dried in an oven at 120° C. for 60 seconds, thereby forming a protective layer 2 having the thickness listed in Table A.

(Protective Layer Coating Solution (2))

Inorganic layered compound dispersion liquid (1) (described below): 1.5 parts

Hydrophilic polymer (1) (the following structure, Mw: 30000) (solid content): 0.03 parts Polyvinyl alcohol (CKS50, manufactured by Nippon Synthetic Chemical Industry Co., Ltd., sulfonic acid-modified, saponification degree of 99% by mole or greater, degree of polymerization of 300), 6 mass % aqueous solution: 0.10 parts Polyvinyl alcohol (PVA-405, manufactured by Kuraray Co., Ltd., saponification degree of 81.5% by mole, degree of polymerization of 500), 6 mass % aqueous solution: 0.03 parts Surfactant (EMALEX 710, manufactured by Nihon Emulsion Co., Ltd., the following structure), 1 mass % aqueous solution: 0.86 parts Ion exchange water: 6.0 parts

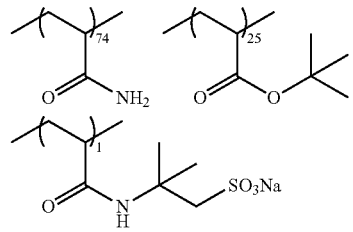

Hydrophilic polymer (1)

EMALEX 710

The numbers on the lower right side of the parentheses of each constitutional unit in hydrophilic polymer (1) indicate the molar ratios.

(Preparation of Inorganic Layered Compound Dispersion Liquid (1))

6.4 parts of synthetic mica SOMASIF ME-100 (manufactured by CO-OP CHEMICAL CO., LTD.) was added to 193.6 g of ion exchange water and dispersed therein such that the volume average particle diameter (laser scattering method) was set to 3 μm using a homogenizer, thereby preparing an inorganic layered compound dispersion liquid (1). The aspect ratio of the dispersed particles was 100 or greater.

<Formation of Protective Layer 3>

The image recording layer was bar-coated with a protective layer coating solution (3) having the following composition and dried in an oven at 120° C. for 60 seconds, thereby forming a protective layer 3 having the thickness listed in Table A.

(Protective Layer Coating Solution (3))
Polyvinyl alcohol (PVA-405, manufactured by Kuraray Co., Ltd., saponification degree of 81.5% by mole, degree of polymerization: 500), 6 mass % aqueous solution: 66.33 parts by mass
Surfactant (Masurf 1520, manufactured by Pilot Chemical Corp.): 0.02 parts by mass
Ion exchange water: 8.65 parts by mass <Formation of Protective Layer 4>
The image recording layer was bar-coated with a protective layer coating solution (4) having the following composition and dried in an oven at 125° C. for 70 seconds, thereby forming a protective layer 4 having the thickness listed in Table A.

(Protective Layer Coating Solution (4))
PVA-1 (GOHSELAN L-3266, manufactured by Nippon Synthetic Chemical Industry Co., Ltd.): 0.61 parts by mass
PVA-2 (NICHIGO G-Polymer AZF8035, manufactured by Nippon Synthetic Chemical Industry Co., Ltd.): 0.32 parts by mass
Surfactant (EMALEX 710, manufactured by Nihon Emulsion Co., Ltd.): 0.002 parts by mass
Water: 13 parts by mass <Formation of Lower Protective Layer 5A>
The image recording layer was coated with a protective layer coating solution (5A) having the following composition using a wire bar and dried at 125° C. for 60 seconds using a warm air dryer, thereby forming a protective layer 5A having the thickness listed in Table A.

<Protective Layer Coating Solution (5A)>
Synthetic mica dispersion liquid (SOMASIF MEB-3L, manufactured by CO-OP CHEMICAL CO., LTD., 3.2% aqueous dispersion liquid): 0.578 g
Polyvinyl alcohol (CKS-50, manufactured by Nippon Synthetic Chemical Industry Co., Ltd., saponification degree of 99% by mole, degree of polymerization of 300): 0.426 g
Acrylic binder (the following structure, 13 mass % aqueous solution): 0.095 g
Surfactant 1 (PLURONIC P-84, manufactured by BASF SE): 0.07 g
Surfactant 2 (EMALEX 710, manufactured by Nihon Emulsion Co., Ltd.): 0.02 g
Pure water: 10.27 g

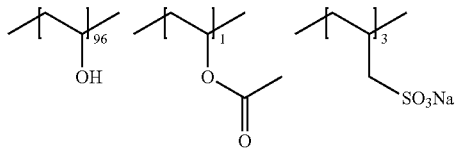

Polyvinyl alcohol CKS-50

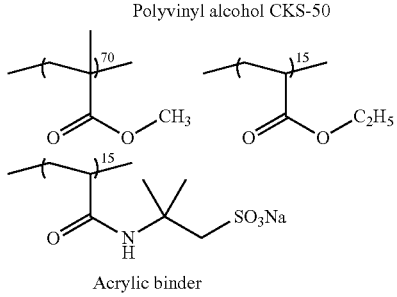

Acrylic binder

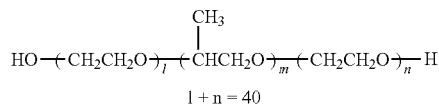

Surfactant 1 (PLURONIC P-84)

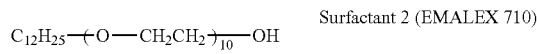

Surfactant 2 (EMALEX 710)

<Formation of Upper Protective Layer 5B>
The lower protective layer 5A was coated with a protective layer coating solution (5B) having the following composition using a wire bar and dried at 125° C. for 75 seconds using a warm air dryer, thereby forming a protective layer 5B having the thickness listed in Table A.

<Protective Layer Coating Solution (5B)>
Synthetic mica (SOMASIF MEB-3L, manufactured by CO-OP CHEMICAL CO., LTD., 3.2% aqueous dispersion liquid): 1.024 g
Polyvinyl alcohol (GOHSELAN L-3266, manufactured by Nippon Synthetic Chemical Industry Co., Ltd., saponification degree of 85% by mole, degree of polymerization of 300): 1.397 g
Carboxymethyl cellulose (CELLOGEN FS-B, manufactured by DKS Co., Ltd.): 0.215 g
Surfactant 2 (EMALEX 710, manufactured by Nihon Emulsion Co., Ltd.): 0.048 g
Silica-coated acrylic resin particles (ART PEARL J-7P, manufactured by Negami Chemical Industrial Co., Ltd.): 0.054 g
Pure water: 41.42 g

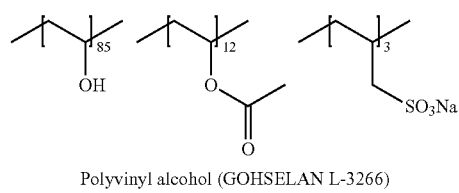

Polyvinyl alcohol (GOHSELAN L-3266)

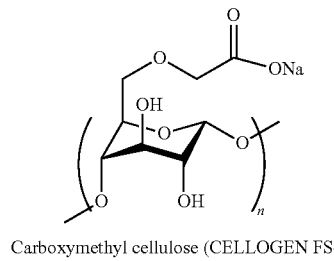

Carboxymethyl cellulose (CELLOGEN FS-B)

<Formation of Protective Layer 6>
The non-photosensitive layer 8 was bar-coated with a protective layer coating solution (6) having the following composition and dried at 125° C. for 75 seconds, thereby forming a protective layer 6 having the thickness listed in Table A.

(Protective Layer Coating Solution (6))
Synthetic mica (SOMASIF ME-100, manufactured by CO-OP CHEMICAL CO., LTD., 8% aqueous dispersion liquid): 94 parts by mass
Polyvinyl alcohol (CKS-50, manufactured by Nippon Synthetic Chemical Industry Co., Ltd., saponification degree of 99% by mole, degree of polymerization of 300): 58 parts by mass Carboxymethyl cellulose (CELLOGEN PR, manufactured by DKS Co., Ltd.): 24 parts by mass
Surfactant-1 (PLURONIC P-84, manufactured by BASF SE): 2.5 parts by mass
Surfactant-2 (EMALEX 710, manufactured by Nihon Emulsion Co., Ltd.): 5 parts by mass
Pure water: 1364 parts by mass
PLURONIC P-84 is an ethylene oxide/propylene oxide block copolymer, and EMALEX 710 is polyoxyethylene lauryl ether.

<Formation of Protective Layer 7>

The undercoat layer was bar-coated with a protective layer coating solution (7) having the following composition and dried in an oven at 120° C. for 60 seconds, thereby forming a protective layer 7 having the thickness listed in Table A.

(Protective Layer Coating Solution (7))
Polyvinyl alcohol (GOHSELAN L-3266, manufactured by Nippon Synthetic Chemical Industry Co., Ltd., sulfonic acid-modified, saponification degree of 85% by mole, 6 mass % aqueous solution): 0.501 parts
Surfactant (PIONINE A-32-B (the following structure), manufactured by TAKEMOTO OIL & FAT Co., Ltd., 40 mass % aqueous solution): 0.015 parts
Fluorine-based surfactant (1) (described above): 0.060 parts
Ammonium dihydrogen phosphate: 0.089 parts
Anionic surfactant 1 (the following structure), 30 mass % aqueous solution: 0.140 parts
Pure water: 18.413 parts

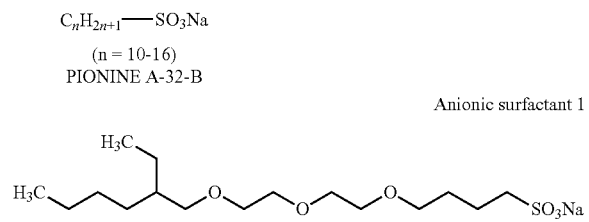

PIONINE A-32-B

Anionic surfactant 1

<Formation of Protective Layer 8>

The support was coated with a protective layer coating solution (8) having the following composition using a wire bar and dried at 125° C. for 75 seconds, thereby forming a protective layer 8 having the thickness listed in Table A.

(Protective Layer Coating Solution (8))
Resin P (the following structure): 0.30 g
Pure water: 5.20 g
Methanol: 2.00 g

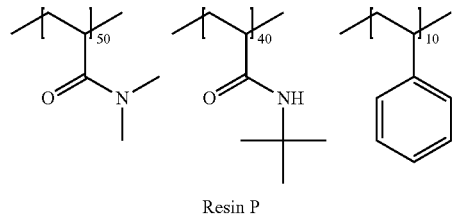

Resin P

<Formation of Protective Layer 9>

The image recording layer was bar-coated with a protective layer coating solution (9) having the following composition and dried in an oven at 120° C. for 60 seconds, thereby forming a protective layer 9 having the thickness listed in Table A.

(Protective Layer Coating Solution (9))
Inorganic layered compound dispersion liquid (1) (described above): 2.876 parts
Polyvinyl alcohol (GOHSELAN L-3266, manufactured by Nippon Synthetic Chemical Industry Co., Ltd., sulfonic acid-modified, saponification degree of 85% by mole, 6 mass % aqueous solution): 0.112 parts
Surfactant (PIONINE A-32-B (described above), manufactured by TAKEMOTO OIL & FAT Co., Ltd., 40 mass % aqueous solution): 0.018 parts
Surfactant (SURFYNOL 465 (the following structure), manufactured by Nissin Chemical Co., Ltd.): 0.007 part
Phosphoric acid (85 mass % aqueous solution): 0.027 parts
Diammonium hydrogen phosphate: 0.038 parts
Anionic surfactant 1 (described above), 30 mass % aqueous solution: 0.140 parts
Pure water: 4.519 parts

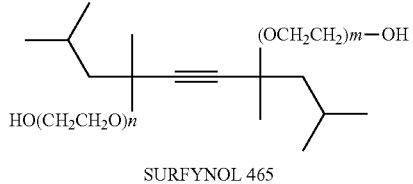

SURFYNOL 465

<Formation of Uneven Shape on Outermost Layer>

An uneven shape was formed on the outermost layer at the side where the image recording layer was provided as listed in Table A using the following particle coating method or protrusion forming method as uneven shape forming means.

(Particle Coating Method (Particles))

The particles listed in Table A were added to the coating solution described in the unevenness formation position listed in Table A such that the addition amount thereof was adjusted to obtain the in-plane density listed in Table A, thereby coating the particles with the solution.

The "ART PEARL" particles in Table A are acrylic resin particles (manufactured by Negami Chemical Industrial Co., Ltd.).

(Protrusion Forming Method (Protrusion))

A polyvinyl alcohol (PVA, manufactured by Kuraray Co., Ltd., POVAL PVA405) aqueous solution or a sodium polyacrylate (manufactured by FUJIFILM Wako Pure Chemical Corporation) aqueous solution was prepared such that the concentration of solid contents was set to 5.0% by mass, and the surface of the protective layer was coated with the solution according to a rotary atomization electrostatic coating method and dried at 100° C. for 30 seconds.

<Formation of Back Coat Layer 1>

The surface of the support at the side opposite to the side where the protective layer was provided was coated with a back coat layer coating solution (1) having the following composition and dried at 100° C. for 30 seconds, thereby forming a back coat layer 1.

(Back Coat Layer Coating Solution (1))
Poly(methyl methacrylate) (Mw: 120000, manufactured by Sigma-Aldrich Co. LLC.): 10.0 parts by mass
Fluorine-based surfactant (1) (described above): 0.05 parts by mass
Methyl ethyl ketone: 90.0 parts by mass
ART PEARL J-6P: 0.13 parts by mass <Formation of Back Coat Layer 2>

The surface of the support at the side opposite to the side where the protective layer was provided was bar-coated with a back coat layer coating solution (2) having the following composition and dried at 100° C. for 120 seconds, thereby forming a back coat layer 2 having a thickness of 0.3 μm.

(Preparation of Back Coat Layer Coating Solution (2))

Tetraethyl silicate (metal oxide): 50 parts by mass
Water: 20 parts by mass
Methanol: 15 parts by mass
Phosphoric acid: 0.05 parts by mass In a case where the above-described components were mixed and stirred, heat was generated in approximately 5 minutes. After the reaction for 60 minutes, a back coat layer coating solution (2) was prepared by adding the following mixed solution thereto.

Pyrogallol formaldehyde condensation resin (Mw: 2000): 4 parts by mass
Dimethyl phthalate: 5 parts by mass
Fluorine-based surfactant (N-butyl perfluorooctane sulfonamide ethyl acrylate/polyoxyethylene acrylate copolymer (Mw: 20000): 0.7 parts by mass
Methanol: 800 parts by mass <Preparation of Planographic Printing Plate Precursor>

The support, the undercoat layer, the image recording layer or the non-photosensitive layer, the protective layer, and the back coat layer were combined as listed in Table A, to prepare a planographic printing plate precursor. In the planographic printing plate precursors of Examples 1 to 39 and Comparative Examples 1 to 6, the Bekk smoothness of the surface of the outermost layer at the side opposite to the side where the image recording layer was provided was 1200 seconds, and the arithmetic average height Sa was 0.1 μm. In the planographic printing plate precursor of Example 40, the Bekk smoothness of the surface of the outermost layer at the side opposite to the side where the image recording layer was provided was 80 seconds, and the arithmetic average height Sa was 2.1 μm. In the planographic printing plate precursors of Examples 41 to 45, the Bekk smoothness of the surface of the outermost layer at the side opposite to the side where the image recording layer or the non-photosensitive layer was provided was 1240 seconds, and the arithmetic average height Sa was 0.1 μm.

TABLE 7

| | Support | Undercoat layer | Image recording layer or non-photosensitive layer | Protective layer/thickness (μm) | Unevenness forming means | Unevenness forming position | In-plane density of particles (particles/mm²) | Bekk smoothness (sec) | Arithmetic average height (μm) | Back coat layer | Total value of Bekk smoothness reciprocals | Total value of arithmetic average heights |
|---|---|---|---|---|---|---|---|---|---|---|---|---|
| Example 1 | 1 | — | 1 | 1/0.8 | Particles 1 | Protective layer | 1000 | 210 | 0.4 | — | 0.00560 | 0.5 |
| Example 2 | 1 | — | 1 | 1/0.8 | Particles 2 | Protective layer | 1000 | 95 | 1.0 | — | 0.01136 | 1.1 |
| Example 3 | 1 | — | 1 | 1/0.8 | Particles 3 | Protective layer | 1000 | 23 | 2.5 | — | 0.04431 | 2.6 |
| Example 4 | 1 | — | 1 | 1/0.8 | Particles 4 | Protective layer | 1000 | 8 | 4.5 | — | 0.12583 | 4.6 |
| Example 5 | 1 | — | 1 | 1/0.8 | Particles 5 | Protective layer | 1000 | 5 | 7.0 | — | 0.20083 | 7.1 |
| Example 6 | 1 | — | 1 | 1/0.2 | Particles 3 | Protective layer | 1000 | 19 | 2.7 | — | 0.05346 | 2.8 |
| Example 7 | 1 | — | 1 | 1/1 | Particles 3 | Protective layer | 1000 | 38 | 2.1 | — | 0.02715 | 2.2 |
| Example 8 | 1 | — | 1 | 1/2 | Particles 3 | Protective layer | 1000 | 47 | 1.9 | — | 0.02211 | 2.0 |
| Example 9 | 1 | — | 1 | 1/3 | Particles 3 | Protective layer | 1000 | 55 | 1.4 | — | 0.01902 | 1.5 |
| Example 10 | 1 | — | 1 | 1/0.8 | Particles 3 | Protective layer | 100 | 45 | 2.0 | — | 0.02306 | 2.1 |
| Example 11 | 1 | — | 1 | 1/0.8 | Particles 3 | Protective layer | 500 | 34 | 2.4 | — | 0.03025 | 2.5 |
| Example 12 | 1 | — | 1 | 1/0.8 | Particles 3 | Protective layer | 5000 | 19 | 3.0 | — | 0.05346 | 3.1 |
| Example 13 | 1 | — | 1 | 1/0.8 | Particles 1 | Image forming layer | 1000 | 250 | 0.3 | — | 0.00483 | 0.4 |
| Example 14 | 1 | — | 1 | 1/0.8 | Particles 2 | Image forming layer | 1000 | 154 | 0.8 | — | 0.00733 | 0.9 |
| Example 15 | 1 | — | 1 | 1/0.8 | Particles 3 | Image forming layer | 1000 | 29 | 2.3 | — | 0.03532 | 2.4 |
| Example 16 | 1 | — | 1 | 1/0.8 | Particles 4 | Image forming layer | 1000 | 9 | 3.9 | — | 0.11194 | 4.0 |
| Example 17 | 1 | — | 1 | 1/0.8 | Particles 3 | Image forming layer | 100 | 58 | 1.7 | — | 0.01807 | 1.8 |
| Example 18 | 1 | — | 1 | 1/0.8 | Particles 3 | Image forming layer | 500 | 40 | 2.1 | — | 0.02583 | 2.2 |

TABLE 7-continued

| | Support | Under-coat layer | Image recording layer or non-photo-sensitive layer | Protective layer/thickness (μm) | Unevenness forming means | Unevenness forming position | In-plane density of particles (particles/mn²) | Bekk smoothness (sec) | Arithmetic average height (μm) | Back coat layer | Total value of Bekk smoothness reciprocals | Total value of arithmetic average heights |
|---|---|---|---|---|---|---|---|---|---|---|---|---|
| Example 19 | 1 | — | 1 | 1/0.8 | Particles 3 | Image forming layer | 5000 | 24 | 2.8 | — | 0.04250 | 2.9 |
| Example 20 | 2 | 1 | 2 | 2/0.2 | Particles 3 | Image forming layer | 1000 | 46 | 1.2 | — | 0.02257 | 1.3 |
| Example 21 | 2 | 1 | 2 | 2/0.2 | Particles 3 | Protective layer | 1000 | 20 | 2.8 | — | 0.05083 | 2.9 |
| Example 22 | 2 | 1 | 2 | 2/1 | Particles 3 | Protective layer | 1000 | 25 | 2.5 | — | 0.04083 | 2.6 |

TABLE 8

| | Support | Under-coat layer | Image recording layer or non-photo-sensitive layer | Protective layer/thickness (μm) | Unevenness forming means | Unevenness forming position | In-plane density of particles (particles/mn²) | Bekk smoothness (sec) | Arithmetic average height (μm) | Back coat layer | Total value of Bekk smoothness reciprocals | Total value of arithmetic average heights |
|---|---|---|---|---|---|---|---|---|---|---|---|---|
| Example 23 | 1 | — | 1 | 1/0.8 | Protrusion 1 | On protective layer | — | 72 | 2.3 | — | 0.01472 | 2.4 |
| Example 24 | 1 | — | 1 | 1/0.8 | Protrusion 1 | On protective layer | — | 6 | 9.9 | — | 0.16750 | 10.0 |
| Example 25 | 1 | — | 1 | 1/0.8 | Protrusion 2 | On protective layer | — | 7 | 9.6 | — | 0.14369 | 9.7 |
| Example 26 | 2 | 1 | 2 | 2/1 | Protrusion 1 | On protective layer | — | 8 | 9.6 | — | 0.12583 | 9.7 |
| Example 27 | 3 | — | 1 | 1/0.8 | Particles 3 | Protective layer | 1000 | 23 | 2.5 | — | 0.04431 | 2.6 |
| Example 28 | 1 | — | 1 | 1/0.8 | Particles 3 | Protective layer | 1000 | 23 | 2.5 | — | 0.04431 | 2.6 |
| Example 29 | 4 | — | 1 | 1/0.8 | Particles 3 | Protective layer | 1000 | 23 | 2.5 | — | 0.04431 | 2.6 |
| Example 30 | 5 | — | 1 | 1/0.8 | Particles 3 | Protective layer | 1000 | 23 | 2.5 | — | 0.04431 | 2.6 |
| Example 31 | 6 | — | 1 | 1/0.8 | Particles 3 | Protective layer | 1000 | 23 | 2.5 | — | 0.04431 | 2.6 |
| Example 32 | 7 | — | 1 | 1/0.8 | Particles 3 | Protective layer | 1000 | 23 | 2.5 | — | 0.04431 | 2.6 |
| Example 33 | 8 | — | 1 | 1/0.8 | Particles 3 | Protective layer | 1000 | 23 | 2.5 | — | 0.04431 | 2.6 |
| Example 34 | 9 | — | 1 | 1/0.8 | Particles 3 | Protective layer | 1000 | 23 | 2.5 | — | 0.04431 | 2.6 |
| Example 35 | 10 | — | 1 | 1/0.8 | Particles 3 | Protective layer | 1000 | 23 | 2.5 | — | 0.04431 | 2.6 |
| Example 36 | 11 | 2 | 3 | 2/0.2 | Particles 3 | Protective layer | 1000 | 19 | 2.8 | — | 0.05346 | 2.9 |
| Example 37 | 12 | — | 4 | 3/0.2 | Particles 3 | Protective layer | 1000 | 23 | 2.5 | — | 0.04431 | 2.6 |
| Example 38 | 12 | — | 5 | 4/0.2 | Particles 3 | Protective layer | 1000 | 23 | 2.5 | — | 0.04431 | 2.6 |
| Example 39 | 13 | — | 6 | 1/0.8 | Particles 1 | Protective layer | 1000 | 22 | 2.4 | — | 0.04629 | 2.5 |
| Example 40 | 1 | — | 1 | 1/0.8 5A/0.5 | Particles 4 | Protective layer | 1000 | 210 | 0.4 | 1 | 0.01726 | 2.5 |
| Example 41 | 14 | 3 | 7 | 5B/1.7 | Particles 4 | Protective layer 5B | 1000 | 12 | 4.0 | 2 | 0.12583 | 4.1 |
| Example 42 | 14 | 4 | 8 | 6/1.6 | Particles 3 | Protective layer | 1000 | 23 | 2.2 | 2 | 0.04428 | 2.3 |
| Example 43 | 15 | 5 | - | 7/0.6 | Particles 3 | Protective layer | 1000 | 20 | 2.6 | 2 | 0.05081 | 2.7 |
| Example 44 | 15 | — | - | 8/0.3 | Particles 3 | Protective layer | 1000 | 28 | 2.4 | 2 | 0.03652 | 2.5 |

TABLE 8-continued

| | Support | Undercoat layer | Image recording layer or non-photo-sensitive layer | Protective layer/thickness (μm) | Unevenness forming means | Unevenness forming position | In-plane density of particles (particles/mm$^2$) | Bekk smoothness (sec) | Arithmetic average height (μm) | Back coat layer | Total value of Bekk smoothness reciprocals | Total value of arithmetic average heights |
|---|---|---|---|---|---|---|---|---|---|---|---|---|
| Example 45 | 15 | 5 | 9 | 9/0.3 | Particles 3 | Protective layer | 1000 | 20 | 2.6 | 2 | 0.05081 | 2.7 |
| Comparative Example 1 | 1 | — | 1 | 1/0.8 | Not available | Not available | | 1100 | 0.1 | — | 0.00174 | 0.2 |
| Comparative Example 2 | 1 | — | 1 | 1/0.1 | Particles 3 | Protective layer | 1000 | 23 | 2.5 | — | 0.04431 | 2.6 |
| Comparative Example 3 | 1 | — | 1 | 1/0.05 | Particles 3 | Protective layer | 1000 | 23 | 2.5 | — | 0.04431 | 2.6 |
| Comparative Example 4 | 1 | — | 1 | 1/0.1 | Particles 5 | Protective layer | 1000 | 5 | 7.0 | — | 0.20083 | 7.1 |
| Comparative Example 5 | 1 | — | 1 | | Particles 3 | Image recording layer | 1000 | 22 | 2.6 | — | 0.04629 | 2.7 |
| Comparative Example 6 | 1 | — | 1 | 1/0.1 | Particles 6 | Protective layer | 1000 | 2 | 22.0 | — | 0.50083 | 22.1 |

In Table A, "Particles 1" listed in the columns of the unevenness forming means indicate particles having a diameter of 1.9 μm (ART PEARL J-4P), "Particles 2" indicate particles having a diameter of 3.2 μm (ART PEARL J-5P), "Particles 3" indicates particles having a diameter of 5.3 μm (ART PEARL J-6P, "Particles 4" indicate particles having a diameter of 6.5 μm (ART PEARL J-7PS), "Particles 5" indicate particles having a diameter of 10 μm (ART PEARL GR-600 transparent), and "Particles 6" indicate particles having a diameter of 32 μm (ART PEARL GR-200).

Further, "Protrusion 1" indicates an uneven shape formed using a PVA aqueous solution according to the protrusion forming method, and "Protrusion 2" indicates an uneven shape formed using a sodium polyacrylate aqueous solution according to the protrusion forming method.

The following evaluations were performed on the obtained planographic printing plate precursors. The evaluation results are listed in Table B.

<Property of Preventing Development Delay>

(1) Planographic Printing Plate Precursor for On-Press Development (Planographic Printing Plate Precursors of Examples 1 to 35, 40, and 43 to 45)

The surface of the planographic printing plate precursor where the protective layer was provided was directly brought into contact with the opposite surface thereof and this process was repeated until a total of 50 sheets were laminated, and the laminate was pressure-bonded by a pressure of 25 kgf/cm$^2$ for 8 days. The planographic printing plate precursor on which the operation had been performed was set by Trendsetter 3244 (manufactured by Creo Co., Ltd.) and then image-exposed under conditions of a resolution of 2400 dpi, an output of 7 W, an external drum rotation speed of 150 rpm, and a plate surface energy of 110 mJ/cm$^2$. Further, image exposure was not performed on the key plate precursor. The planographic printing plate precursors after image exposure were mounted on an offset rotary printing press (manufactured by TOKYO KIKAI SEISAKUSHO, LTD.), and printing was performed on newsprint paper at a speed of 100,000 sheets/hour using SOIBI KKST-S (red) (manufactured by InkTec Corporation) as printing ink for newspaper and ECO SEVEN N-1 (manufactured by SAKATA INX CORPORATION) as dampening water. The on-press development performed on the unexposed portion of the image recording layer on the printing press was completed, and the number of sheets of printing paper required until the ink was not transferred to the non-image area was counted as the number of on-press development sheets, and the property of preventing development delay was evaluated based on the following evaluation standards. The acceptable range is 3 to 5.

5: The number of on-press development sheets of planographic printing plate precursors on which the pressure bonding operation had not been performed+3 or less of on-press development sheets 4: The number of on-press development sheets of planographic printing plate precursors on which the pressure bonding operation had not been performed+4 or more of on-press development sheets of planographic printing plate precursors on which the pressure bonding operation had not been performed+5 or less of on-press development sheets 3: The number of on-press development sheets of planographic printing plate precursors on which the pressure bonding operation had not been performed+6 or more of on-press development sheets of planographic printing plate precursors on which the pressure bonding operation had not been performed+10 or less of on-press development sheets 2: The number of on-press development sheets of planographic printing plate precursors on which the pressure bonding operation had not been performed+11 or more of on-press development sheets of planographic printing plate precursors on which the pressure bonding operation had not been performed+15 or less of on-press development sheets 1: The number of on-press development sheets of planographic printing plate precursors on which the pressure bonding operation was not performed+16 or more of on-press development sheets (2) Planographic Printing Plate Precursor for Development Using Developer (Planographic Printing Plate Precursor of Example 36)

The surface of the planographic printing plate precursor where the protective layer was provided was directly brought into contact with the opposite surface thereof and this process was repeated until a total of 50 sheets were laminated, and the laminate was pressure-bonded by a pressure of 25 kgf/cm$^2$ for 8 days. The planographic printing plate precursor on which the above-described operation had been performed was set by Luxel PLATESETTER T-6000III (manufactured by Fujifilm Corporation) equipped with an infrared semiconductor laser and then exposed under conditions of an external drum rotation speed of 1000 rpm (for each time), a laser output of 70%, and a resolution of 2400 dpi (dot per inch). A solid image and a 50% halftone dot chart were included in the exposed image.

Figure 4:
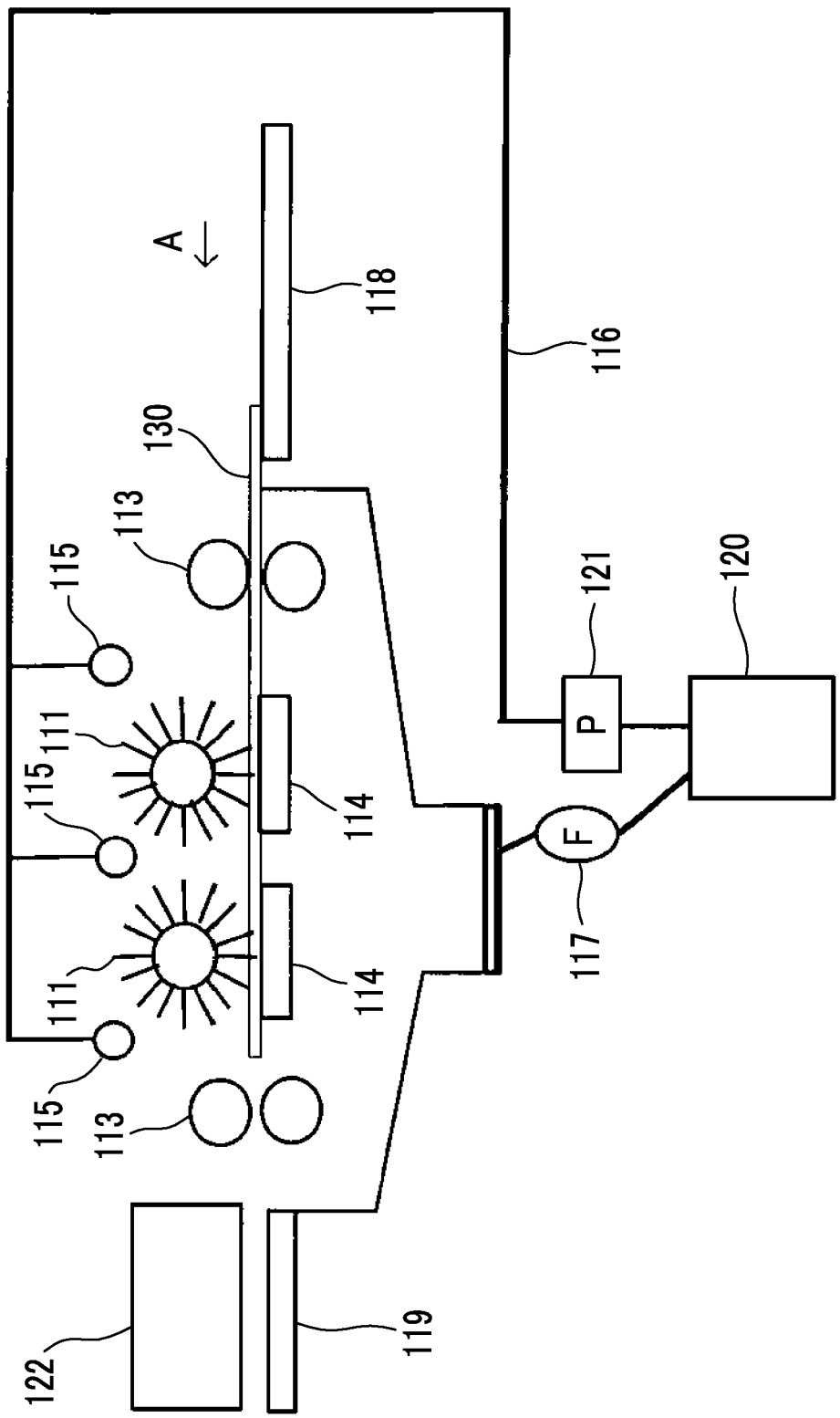
FIG. 4 is a schematic view illustrating a structure of an example of a development treatment device that can be suitably used in the present invention.

Next, the development treatment was performed using a developer 1 with the following composition and an automatic development treatment device having a structure illustrated in FIG. 4, thereby obtaining a planographic printing plate.

The development treatment device exemplified in FIG. 4 is an automatic development treatment device including two rotary brush rolls 111. A brush roll having an external diameter of 55 mm in which polybutylene terephthalate fibers (diameter of bristles: 200 mm, length of bristle: 7 mm) were implanted was used as the rotary brush roll 111, and the roll was allowed to rotate 120 times (the peripheral speed of the brush tip: 0.94 m/s) per minute in the same direction as the transportation direction.

A planographic printing plate precursor 130 after the exposure was completed was transported in the transportation direction illustrated in the figure between two pairs of transport rolls 113 from a plate feed stand 118 to a plate discharge stand 119 at a transportation speed of 60 cm/min on a transport guide plate 114 such that the planographic printing plate precursor 130 was allowed to pass through a space between the rotary brush roll 111 and the transport guide plate 114.

In three spray pipes 115, the developer stored in a developer tank 120 was supplied by a circulation pump 121 through a filter 117 using a pipe line 116, and the developer was supplied to the plate surface from each spray pipe 115 by performing showering. Further, the volume of the developer tank 120 was 20 liters, and the developer was recycled. The planographic printing plate discharged from the development treatment device was dried by a dryer 122 without being washed with water.

<Developer 1>
Surfactant-1 described below (PELEX NBL, manufactured by Kao Corporation): 7.43 g
Surfactant-2 described below (NEWCOL B13, manufactured by Nippon Nyukazai Co., Ltd.): 1.45 g
Surfactant-3 described below (SURFYNOL 2502, manufactured by Air Products and Chemicals, Inc.): 0.4 g
Benzyl alcohol: 0.6 g
Sodium gluconate: 2.77 g
Disodium monohydrogen phosphate: 0.3 g
Sodium hydrogen carbonate: 0.22 g
Antifoaming agent (SILCOLAPSE 432, manufactured by Bluestar Silicones): 0.005 g
Water: 86.83 g
pH: 8.5

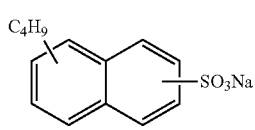
Surfactant-1

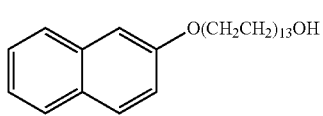
Surfactant-2

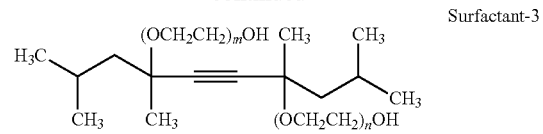
Surfactant-3

Each of the obtained planographic printing plates having a size of 5 cm×5 cm was observed using a 25 magnification loupe, the number of residual films was counted, and the property of preventing development delay was evaluated based on the following standards. The acceptable range is 3 to 5.
5: The number of residual films was 0.
4: The number of residual films was 1 or 2.
3: The number of residual films was in a range of 3 to 10.
2: The number of residual films was in a range of 11 to 50.
1: The number of residual films was greater than 50.

(3) Planographic Printing Plate Precursor for Development Using Developer (Planographic Printing Plate Precursor of Example 37)

The surface of the planographic printing plate precursor where the protective layer was provided was directly brought into contact with the opposite surface thereof and this process was repeated until a total of 50 sheets were laminated, and the laminate was pressure-bonded by a pressure of 25 kgf/cm$^2$ for 8 days. The planographic printing plate precursor on which the above-described operation had been performed was image-exposed and subjected to the development treatment in the same manner as that for (2) planographic printing plate precursor for development using the developer described above, thereby obtaining a planographic printing plate. Here, a developer 2 described below was used as the developer. With respect to the obtained planographic printing plate, the property of preventing development delay was evaluated in the same manner as that for (2) planographic printing plate precursor for development using the developer described above.

<Developer 2>
2-Phenoxyethanol: 5.0 parts by mass
Surfactant (PELEX NBL, manufactured by Kao Corporation): 5.0 parts by mass
Surfactant (NEWCOL B13, manufactured by Nippon Nyukazai Co., Ltd.): 5.0 parts by mass
Diethanolamine: 4.0 parts by mass
Water: 81.0 parts by mass
pH: 10.5

(4) Planographic Printing Plate Precursor for Development Using Developer (Planographic Printing Plate Precursor of Example 38)

The surface of the planographic printing plate precursor where the protective layer was provided was directly brought into contact with the opposite surface thereof and this process was repeated until a total of 50 sheets were laminated, and the laminate was pressure-bonded by a pressure of 25 kgf/cm$^2$ for 8 days. The planographic printing plate precursor on which the above-described operation had been performed was image-exposed and subjected to the development treatment in the same manner as that for (2) planographic printing plate precursor for development using the developer described above, thereby obtaining a planographic printing plate. Here, a developer 3 described below was used as the developer. With respect to the obtained planographic printing plate, the property of preventing development delay was evaluated in the same manner as that for (2) planographic printing plate precursor for development using the developer described above.

<Developer 3>
Surfactant (PELEX NBL, manufactured by Kao Corporation): 7.14 parts by mass
Surfactant (NEWCOL B13, manufactured by Nippon Nyukazai Co., Ltd.): 7.5 parts by mass
Tristyrylphenol ethoxylate (Emulsogen TS160, manufactured by Clariant): 2.5 parts by mass
Trisodium phosphate: 0.1 parts by mass
Glycine: 0.1 parts by mass
Water: 82.66 parts by mass
pH: 9.8

(5) Planographic Printing Plate Precursor for Development Using Developer (Planographic Printing Plate Precursor of Example 39)

The surface of the planographic printing plate precursor where the protective layer was provided was directly brought into contact with the opposite surface thereof and this process was repeated until a total of 50 sheets were laminated, and the laminate was pressure-bonded by a pressure of 25 kgf/cm² for 8 days. The planographic printing plate precursor on which the above-described operation had been performed was image-exposed and subjected to the development treatment in the same manner as that for (2) planographic printing plate precursor for development using the developer described above, thereby obtaining a planographic printing plate. Here, a developer 4 described below was used as the developer. With respect to the obtained planographic printing plate, the property of preventing development delay was evaluated in the same manner as that for (2) planographic printing plate precursor for development using the developer described above.

<Developer 4>
Surfactant-4 (DOWFAX3B2, manufactured by Dow Chemical Company) (described below): 0.7 parts by mass
Ethylene glycol: 0.7 parts by mass
Dextrin (Amicol No. 1, manufactured by Nippon Starch Chemical Co., Ltd.): 3.9 parts by mass
Monopotassium dihydrogen phosphate: 2.7 parts by mass
Potassium hydroxide: 0.7 parts by mass
Antifoaming agent (SILCOLAPSE 432, manufactured by Bluestar Silicones): 0.005 parts by mass
Water: 91.30 parts by mass
pH: 7.0

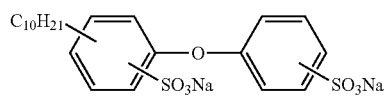

Surfactant-4

(6) Planographic Printing Plate Precursors for Development Using Developer (Planographic Printing Plate Precursors of Examples 41 and 42)

The surface of the planographic printing plate precursor where the protective layer was provided was directly brought into contact with the opposite surface thereof and this process was repeated until a total of 50 sheets were laminated, and the laminate was pressure-bonded by a pressure of 25 kgf/cm² for 8 days. The planographic printing plate precursor on which the above-described operation had been performed was set by Luxel PLATESETTER T-6000III (manufactured by Fujifilm Corporation) equipped with an infrared semiconductor laser and then exposed under conditions of an external drum rotation speed of 1000 rpm (for each time), a laser output of 70%, and a resolution of 2400 dpi (dot per inch). A solid image and a 50% halftone dot chart were included in the exposed image. Further, image exposure was not performed on the key plate precursor.

Next, the development treatment was performed at a transport speed (line speed) 2 m/min and a development temperature of 30° C. using an automatic developing machine LP-1310HII (manufactured by Fujifilm Corporation), thereby obtaining a planographic printing plate. A 1:4 water diluent of DH-N (manufactured by Fujifilm Corporation) was used as a developer, and a 1:1.4 water diluent of FCT-421 (manufactured by Fujifilm Corporation) was used as a development replenisher. With respect to the obtained planographic printing plate, the property of preventing development delay was evaluated in the same manner as that for (2) planographic printing plate precursor for development using the developer described above.

<Property of Preventing Multiple Plates from being Fed>

A laminate obtained by stacking 100 sheets of planographic printing plate precursors directed to the same direction without using interleaving paper was set in a CTP plate setter "AMZI setter" (manufactured by NEC Engineering, Ltd.), and an operation of taking out one plate at a time from the uppermost portion of the laminate was continuously performed 100 times. The plate-separating property here was evaluated based on the following standards. The acceptable range for the property of preventing multiple plates from being fed is 3 to 5.

5: The occurrence frequency of a phenomenon in which the next plate was not raised in a case of lifting up a plate was 100%.

4: The occurrence frequency of a phenomenon in which the next plate was raised in a case of lifting up a plate and did not drop immediately was 1% or less with respect to the whole operations.

3: The occurrence frequency of a phenomenon in which the next plate was raised in a case of lifting up a plate and was not peeled off by the first operation of separating the plate was 1% or less with respect to the whole operations.

2: The occurrence frequency of a phenomenon in which the next plate was raised in a case of lifting up a plate and was not peeled off by the first operation of separating the plate was greater than 1% and 5% or less with respect to the whole operations.

1: The occurrence frequency of a phenomenon in which the next plate was raised in a case of lifting up a plate and was not peeled off by the first operation of separating the plate was greater than 5% with respect to the whole operations.

<Property of Preventing Falling of Projection>

After the humidity of the planographic printing plate precursor was adjusted in an environment of 25° C. at 60% RH for 2 hours, the planographic printing plate precursor was punched into a size of 2.5 cm×2.5 cm and attached to a continuous load type scratch resistance strength tester TYPE-18 (manufactured by SHINTO Scientific Co., Ltd.), the rear surface of the planographic printing plate precursor which had been punched was set to be brought into contact with the surface of the planographic printing plate precursor which has not been punched, and several sites of the planographic printing plate precursor were scratched by applying a pressure of 0 gf to 1500 gf. The scratched rear surface was observed visually and using a scanning electron microscope (SEM), and the level of falling of projections from the surface of the outermost layer at the side where the image recording layer was provided was evaluated based on the following standards. The acceptable range is 3 to 5.

5: Falling of projections did not found at all.
4: Among 100 projections, 1 or more and less than 5 projections were fallen off.
3: Among 100 projections, 5 or more and less than 10 projections were fallen off.
2: Among 100 projections, 10 or more and less than 50 projections were fallen off.
1: Among 100 projections, 50 or more projections were fallen off.

<Property of Preventing Scratches>

(1) Planographic Printing Plate Precursor for On-Press Development

After the humidity of the planographic printing plate precursor was adjusted in an environment of 25° C. at 60% RH for 2 hours, the planographic printing plate precursor was punched into a size of 2.5 cm×2.5 cm and attached to a continuous load type scratch resistance strength tester TYPE-18 (manufactured by SHINTO Scientific Co., Ltd.), the rear surface of the planographic printing plate precursor which had been punched was set to be brought into contact with the surface of the planographic printing plate precursor which has not been punched, and several sites of the planographic printing plate precursor were scratched by applying a pressure of 0 gf to 1500 gf. The scratched planographic printing plate precursor was set by Trendsetter 3244 (manufactured by Creo Co., Ltd.) and then image-exposed under conditions of resolution of 2400 dpi, an output of 7 W, an external surface drum rotation speed of 150 rpm, and a plate surface energy of 110 mJ/cm². The planographic printing plate precursors after image exposure were mounted on an offset rotary printing press (manufactured by TOKYO KIKAI SEISAKUSHO, LTD.), and printing was performed on newsprint paper at a speed of 100,000 sheets/hour using SOIBI KKST-S (red) (manufactured by InkTec Corporation) as printing ink for newspaper and ECO SEVEN N-1 (manufactured by SAKATA INX CORPORATION) as dampening water. In the printing process, the 1000-th printed material was sampled, the degree of damage and stains caused by scratches was visually observed using a 6 magnification loupe, and the property of preventing scratches was evaluated based on the following standards. The acceptable range is 3 to 5.

5: Damage and stains were not able to be visually confirmed using a 6 magnification loupe.
4: Although damage and stains were not visually confirmed, damage and stain which were able to be confirmed using a 6 magnification loupe were found at one site.
3: Although damage and stains were not visually confirmed, damage and stains which were able to be confirmed using a 6 magnification loupe were found at several sites.
2: Damage and stains were able to be visually confirmed at several sites.
1: Damage and stains were able to be visually confirmed on the entire surface.

(2) Planographic Printing Plate Precursor for Development Using Developer

After the humidity of the planographic printing plate precursor was adjusted in an environment of 25° C. at 60% RH for 2 hours, the planographic printing plate precursor was punched into a size of 2.5 cm×2.5 cm and attached to a continuous load type scratch resistance strength tester TYPE-18 (manufactured by SHINTO Scientific Co., Ltd.), the rear surface of the planographic printing plate precursor which had been punched was set to be brought into contact with the surface of the planographic printing plate precursor which has not been punched, and several sites of the planographic printing plate precursor were scratched by applying a pressure of 0 gf to 1500 gf. The scratched planographic printing plate precursor was set by Trendsetter 3244 (manufactured by Creo Co., Ltd.) and then image-exposed under conditions of resolution of 2400 dpi, an output of 7 W, an external surface drum rotation speed of 150 rpm, and a plate surface energy of 110 mJ/cm². The image-exposed planographic printing plate precursor was subjected to the development treatment according to the method described for the planographic printing plate precursor for development using a developer used in the evaluation of the property of preventing development delay, thereby obtaining a planographic printing plate.

The obtained planographic printing plate was mounted on an offset rotary printing press (manufactured by TOKYO KIKAI SEISAKUSHO, LTD.), and printing was performed on newsprint paper at a speed of 100000 sheets/hour using SOIBI KKST-S (red) (manufactured by InkTec Corporation) as printing ink for newspaper and ECO SEVEN N-1 (manufactured by SAKATA INX CORPORATION) as dampening water. In the printing process, the 1000-th printed material was sampled, the degree of damage and stains caused by scratches was visually observed using a 6 magnification loupe, and the property of preventing scratches was evaluated based on the following standards. The acceptable range is 3 to 5.

5: Damage and stains were not able to be visually confirmed using a 6 magnification loupe.
4: Although damage and stains were not visually confirmed, damage and stain which were able to be confirmed using a 6 magnification loupe were found at one site.
3: Although damage and stains were not visually confirmed, damage and stains which were able to be confirmed using a 6 magnification loupe were found at several sites.
2: Damage and stains were able to be visually confirmed at several sites.
1: Damage and stains were able to be visually confirmed on the entire surface.

TABLE 9

| | Property of preventing development delay | Property of preventing multiple plates from being fed | Property of preventing falling of projection | Property of preventing scratches |
|---|---|---|---|---|
| Example 1 | 5 | 3 | 5 | 5 |
| Example 2 | 5 | 4 | 5 | 5 |
| Example 3 | 5 | 5 | 4 | 5 |
| Example 4 | 4 | 5 | 4 | 5 |
| Example 5 | 3 | 5 | 3 | 5 |
| Example 6 | 3 | 5 | 4 | 5 |
| Example 7 | 5 | 5 | 4 | 5 |
| Example 8 | 5 | 5 | 5 | 5 |
| Example 9 | 5 | 4 | 5 | 5 |
| Example 10 | 5 | 5 | 4 | 5 |
| Example 11 | 5 | 5 | 4 | 5 |
| Example 12 | 4 | 5 | 4 | 5 |
| Example 13 | 5 | 3 | 5 | 5 |
| Example 14 | 5 | 3 | 5 | 5 |
| Example 15 | 5 | 5 | 4 | 5 |
| Example 16 | 4 | 5 | 4 | 5 |
| Example 17 | 5 | 4 | 4 | 5 |
| Example 18 | 5 | 5 | 4 | 5 |
| Example 19 | 4 | 5 | 4 | 5 |
| Example 20 | 3 | 5 | 4 | 5 |
| Example 21 | 3 | 5 | 4 | 5 |
| Example 22 | 5 | 5 | 5 | 5 |
| Example 23 | 5 | 4 | 5 | 5 |
| Example 24 | 3 | 5 | 5 | 5 |

TABLE 9-continued

| | Property of preventing development delay | Property of preventing multiple plates from being fed | Property of preventing falling of projection | Property of preventing scratches |
|---|---|---|---|---|
| Example 25 | 3 | 5 | 5 | 5 |
| Example 26 | 3 | 5 | 5 | 5 |
| Example 27 | 5 | 5 | 4 | 5 |
| Example 28 | 5 | 5 | 4 | 5 |
| Example 29 | 5 | 5 | 4 | 5 |
| Example 30 | 5 | 5 | 4 | 5 |
| Example 31 | 5 | 5 | 4 | 5 |
| Example 32 | 5 | 5 | 4 | 5 |
| Example 33 | 5 | 5 | 4 | 5 |
| Example 34 | 5 | 5 | 4 | 5 |
| Example 35 | 5 | 5 | 4 | 5 |
| Example 36 | 5 | 5 | 4 | 5 |
| Example 37 | 5 | 5 | 5 | 5 |
| Example 38 | 5 | 5 | 5 | 5 |
| Example 39 | 5 | 5 | 4 | 5 |
| Example 40 | 5 | 5 | 5 | 5 |
| Example 41 | 5 | 5 | 5 | 5 |
| Example 42 | 5 | 5 | 5 | 5 |
| Example 43 | 5 | 5 | 3 | 5 |
| Example 44 | 5 | 5 | 3 | 5 |
| Example 45 | 5 | 5 | 3 | 5 |
| Comparative Example 1 | 5 | 1 | 5 | 5 |
| Comparative Example 2 | 3 | 5 | 2 | 5 |
| Comparative Example 3 | 2 | 5 | 1 | 5 |
| Comparative Example 4 | 1 | 5 | 1 | 5 |
| Comparative Example 5 | 2 | 5 | 3 | 2 |
| Comparative Example 6 | 1 | 5 | 1 | 5 |

Based on the results listed in Table B, it was clarified that all characteristics such as the property of preventing multiple plates from being fed, the property of preventing falling of a projection, the property of preventing scratches, and the property of preventing development delay of the planographic printing plate precursor according to the embodiment of the present invention were excellent even in the case of elimination of interleaving paper. On the contrary, it was found that one or more of the characteristics of the planographic printing plate precursors for comparison were degraded.

In particular, in the planographic printing plate precursor for on-press development according to the embodiment of the present invention, it is possible to effectively prevent on-press development delay while excellently maintaining the property of preventing multiple plates from being fed, the property of preventing falling of a projection, and the property of preventing scratches.

INDUSTRIAL AVAILABILITY

According to the present invention, it is possible to provide a planographic printing plate precursor in which all characteristics such as a property of preventing multiple plates from being fed in a step of taking out a precursor from a stack, a property of preventing falling of a projection provided on a surface of an outermost layer of the precursor, a property of preventing scratches caused by a projection provided on the surface of the outermost layer of the precursor, and a property of preventing development delay caused by a projection provided on the surface of the outermost layer of the precursor are excellent even in a case of elimination of interleaving paper, a planographic printing plate precursor laminate including the planographic printing plate precursor, a plate-making method for a planographic printing plate, and a planographic printing method.

Although the present invention has been described in detail with reference to particular embodiments, it will be apparent to those skilled in the art that various changes and modifications can be made without departing from the spirit and scope of the present invention.

EXPLANATION OF REFERENCES

50: main electrolytic cell
51: AC power source
52: radial drum roller
53a, 53b: main pole
54: electrolytic solution supply port
55: electrolytic solution
56: slit
57: electrolytic solution passage
58: auxiliary anode
60: auxiliary anode cell
W: aluminum plate
410: anodization treatment device
412: power supply tank
414: electrolytic treatment tank
416: aluminum plate
418, 426: electrolytic solution
420: power supply electrode
422, 428: roller
424: nip roller
430: electrolytic electrode
432: cell wall
434: DC power source
111: rotary brush roll
113: transport roll
114: transport guide plate
115: spray pipe
116: pipe line
117: filter
118: plate feed stand
119: plate discharge stand
120: developer tank
121: circulation pump
122: dryer
130: planographic printing plate precursor
1: aluminum plate
2, 4: roller-like brushes
3: polishing slurry liquid
5, 6, 7, 8: support roller

What is claimed is:

1. A planographic printing plate precursor for on-press development comprising in the following order:
   an aluminum support;
   an image recording layer; and
   a protective layer,
   wherein a thickness of the protective layer is 0.2 μm or greater, and in a case where a Bekk smoothness of a surface of an outermost layer at a side where the image recording layer is provided is denoted by A seconds, the following Expression (1) is satisfied;
   wherein an arithmetic average height Sa of a surface of an outermost layer at a side opposite to the side where the image recording layer is provided is in a range of 0.1 μm to 0.3 μm; and
   wherein the image recording layer contains an infrared absorbing agent, a polymerization initiator, a polymerizable compound, and a polymer compound having a particle shape, and the polymer compound having a particle shape is a thermoplastic polymer particle or a microgel, $$A \leq 1000 \tag{1}.$$

2. The planographic printing plate precursor for on-press development according to claim 1, wherein the A seconds as the Bekk smoothness of the surface of the outermost layer at the side where the image recording layer is provided satisfy the following Expression (2):

$$A \leq 300 \tag{2}.$$

3. The planographic printing plate precursor for on-press development according to claim 1, wherein an arithmetic average height Sa of the surface of the outermost layer at the side where the image recording layer is provided is in a range of 0.3 μm to 20 μm.

4. The planographic printing plate precursor for on-press development according to claim 1, wherein the protective layer contains particles having an average particle diameter of 0.5 μm to 20 μm, and an in-plane density of the particles is 10000 particles/mm$^2$ or less.

5. The planographic printing plate precursor for on-press development according to claim 4, wherein the average particle diameter of the particles is 1.3 times or greater than the thickness of the protective layer.

6. The planographic printing plate precursor for on-press development according to claim 1, wherein the image recording layer contains particles having an average particle diameter of 0.5 μm to 20 μm, and an in-plane density of the particles is 10000 particles/mm$^2$ or less.

7. The planographic printing plate precursor for on-press development according to claim 4, wherein the particles having the average particle diameter of 0.5 μm to 20 μm are at least one kind of particles selected from the group consisting of organic resin particles and inorganic particles.

8. The planographic printing plate precursor for on-press development according to claim 6, wherein the particles having the average particle diameter of 0.5 μm to 20 μm are at least one kind of particles selected from the group consisting of organic resin particles and inorganic particles.

9. The planographic printing plate precursor for on-press development according to claim 1, wherein a plurality of protrusions containing a polymer compound as a main component are provided on the protective layer.

10. The planographic printing plate precursor for on-press development according to claim 1, wherein the polymer compound is a polymer compound containing at least one of styrene and acrylonitrile as a constitutional unit.

11. The planographic printing plate precursor for on-press development according to claim 1, wherein the image recording layer contains two or more kinds of polymerizable compounds.

12. The planographic printing plate precursor for on-press development according to claim 1, wherein the protective layer contains a water-soluble polymer.

13. The planographic printing plate precursor for on-press development according to claim 12, wherein the water-soluble polymer is polyvinyl alcohol having a saponification degree of 50% or greater.

14. The planographic printing plate precursor for on-press development according to claim 1, wherein a total value of the arithmetic average height Sa of the surface of the outermost layer at the side where the image recording layer is provided and an arithmetic average height Sa of a surface of an outermost layer at a side opposite to the side where the image recording layer is provided is greater than 0.3 μm and 20 μm or less.

15. The planographic printing plate precursor for on-press development according to claim 1, wherein in a case where the Bekk smoothness of the surface of the outermost layer at the side where the image recording layer is provided is denoted by A seconds and a Bekk smoothness of a surface of an outermost layer at a side opposite to the side where the image recording layer is provided is denoted by B seconds, the following Expressions (1), (3), and (4) are satisfied:

$$A \leq 1000 \tag{1}$$

$$B \leq 1000 \tag{3}$$

$$1/A + 1/B \geq 0.002 \tag{4}.$$

16. The planographic printing plate precursor for on-press development according to claim 1, comprising a back coat layer provided at an opposite side of the aluminum support to the side where the image recording layer is provided.

17. A key plate precursor comprising:
an aluminum support; and
a protective layer,
wherein a thickness of the protective layer is 0.2 μm or greater, and in a case where a Bekk smoothness of a surface of an outermost layer at a side where the protective layer is provided is denoted by A seconds, the following Expression (1) is satisfied;
wherein the key plate precursor further comprises a non-photosensitive layer between the aluminum support and the protective layer; and
wherein an arithmetic average height Sa of a surface of an outermost layer at a side opposite to the side where the protective layer is provided is in a range of 0.1 μm to 0.3 μm, $$A \leq 1000 \tag{1},$$

18. The key plate precursor according to claim 17, wherein an arithmetic average height Sa of the surface of the outermost layer at the side where the protective layer is provided is in a range of 0.3 μm to 20 μm.

19. The key plate precursor according to claim 17, comprising a back coat layer provided at an opposite side of the aluminum support to the side where the protective layer is provided.

* * * * *